United States Patent
Hoshino

(10) Patent No.: US 6,225,025 B1
(45) Date of Patent: *May 1, 2001

(54) FABRICATION PROCESS OF A SEMICONDUCTOR DEVICE BY ELECTRON-BEAM LITHOGRAPHY

(75) Inventor: Hiromi Hoshino, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/158,078

(22) Filed: Sep. 22, 1998

(30) Foreign Application Priority Data

Feb. 25, 1998 (JP) .................................. 10-043992

(51) Int. Cl.⁷ ........................................ G03F 9/00
(52) U.S. Cl. ............................... 430/296; 430/30
(58) Field of Search ......................... 430/296, 30

(56) References Cited

U.S. PATENT DOCUMENTS

| | | | |
|---|---|---|---|
| 5,824,437 | * 10/1998 | Sakakibara et al. | 430/5 |
| 5,894,057 | * 4/1999 | Yamaguchi et al. | 430/30 |
| 5,908,733 | * 6/1999 | Onoda | 430/296 |
| 5,935,744 | * 8/1999 | Nakajima | 430/30 |

FOREIGN PATENT DOCUMENTS

| | | |
|---|---|---|
| 5-13313 | 1/1993 | (JP) . |
| 5-29187 | 2/1993 | (JP) . |
| 5-182899 | 7/1993 | (JP) . |

* cited by examiner

Primary Examiner—Mark F. Huff
Assistant Examiner—Saleha R. Mohamedulla
(74) Attorney, Agent, or Firm—Staas & Halsey LLP

(57) ABSTRACT

A method of fabricating a semiconductor device includes a step of creating exposure data from design data according to the steps of extracting a pattern group from the design data, extracting a plurality of patterns from the extracted pattern group as block patterns, and creating the exposure data for each of the extracted patterns.

37 Claims, 48 Drawing Sheets

FIG. 3A
PRIOR ART
FIG. 3C
PRIOR ART
BLOCK FRAME
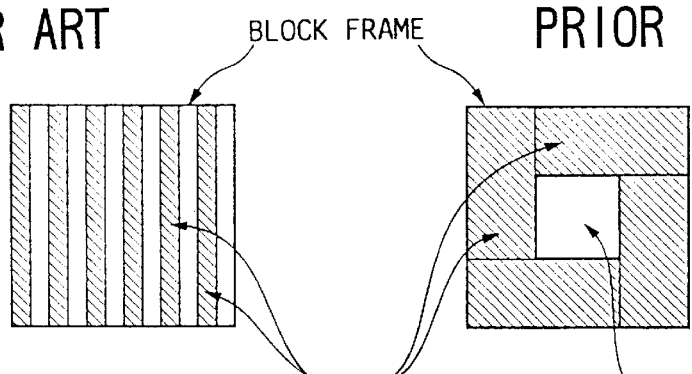
OPENING
FIG. 3B
PRIOR ART
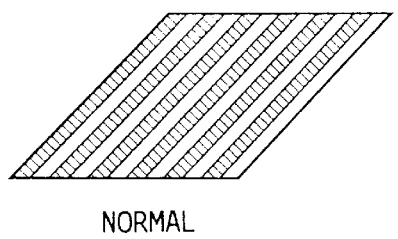
NORMAL
FAILURE
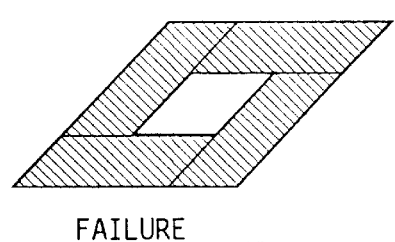
FAILURE
FIG. 3D
PRIOR ART
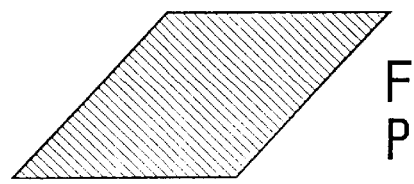
FIG. 3E
PRIOR ART F I G. 4
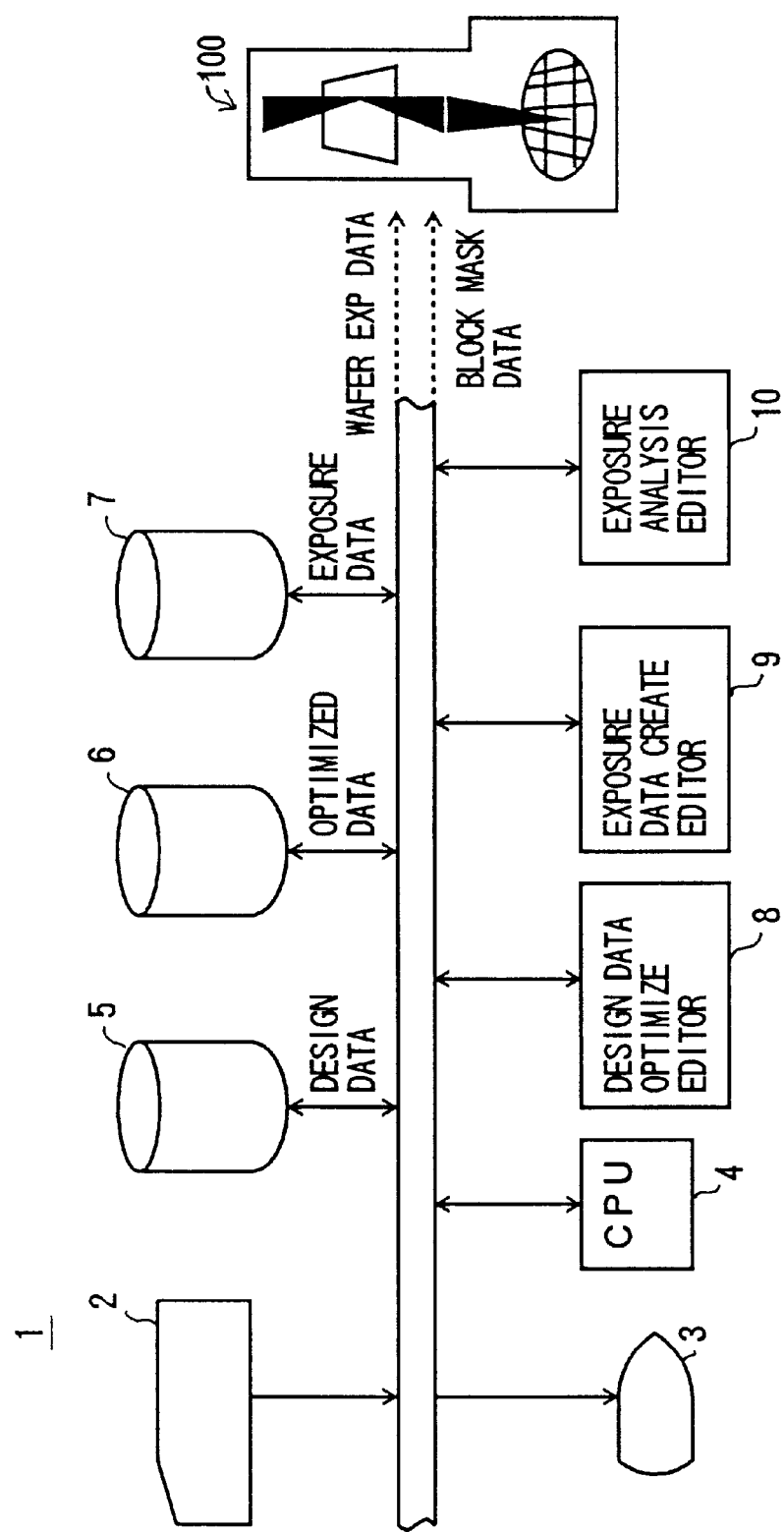

SHOT NUMBER : 96

FIG. 20A
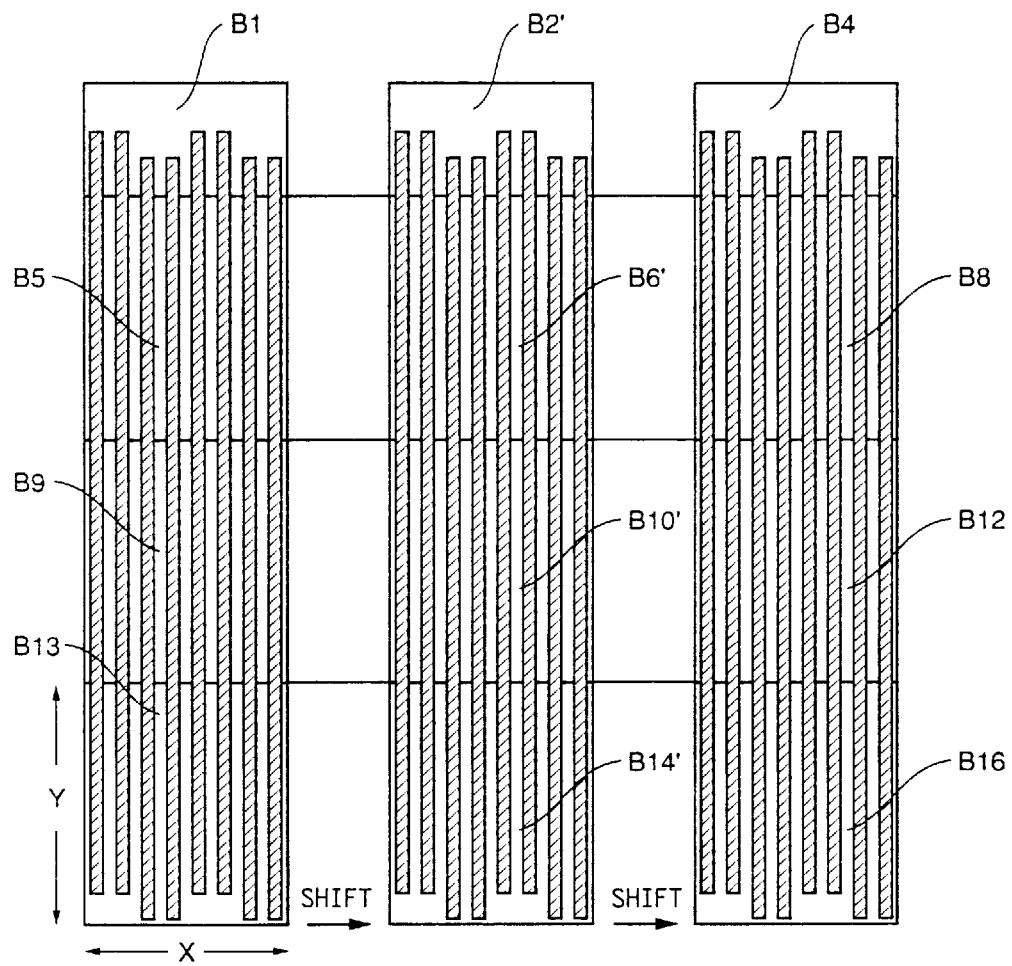
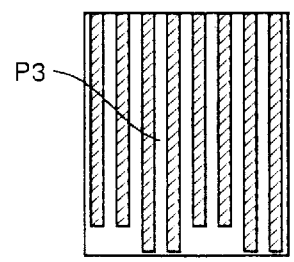
FIG. 20B
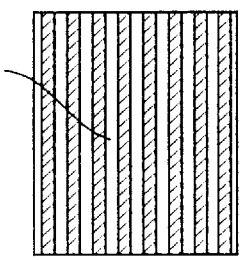
FIG. 20C
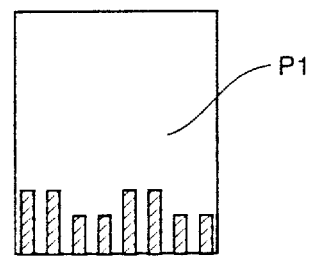
FIG. 20D

FIG. 23A
BLOCK A
FIG. 23B
BLOCK B
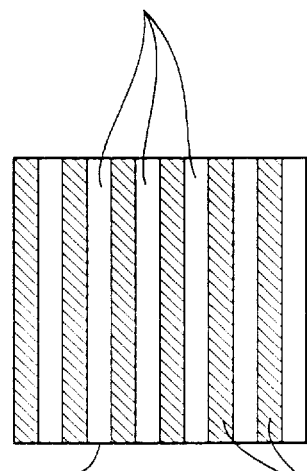
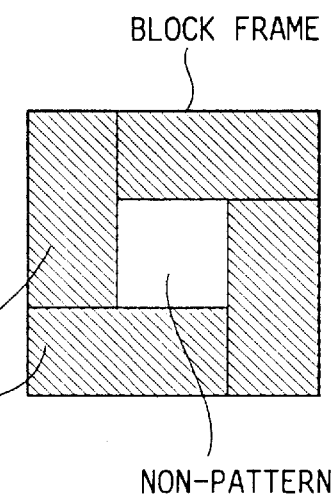
BLOCK FRAME
BLOCK FRAME PATTERN NON-PATTERN
BEAM IN MESH FORM
FIG. 23C
FIG. 23D
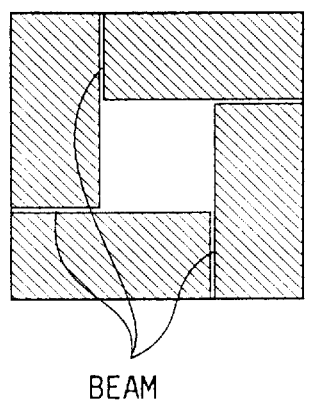
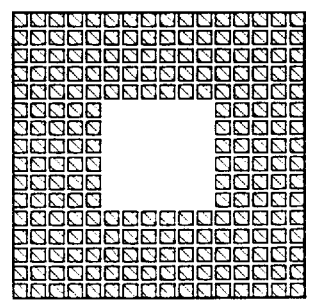
BEAM FIG. 24A
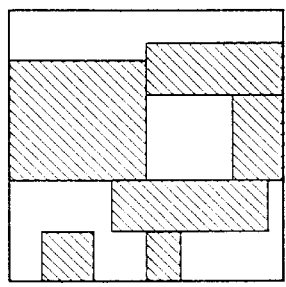
OR →
FIG. 24B
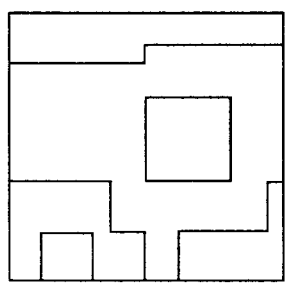
FIG. 24C
SEGMENT ←
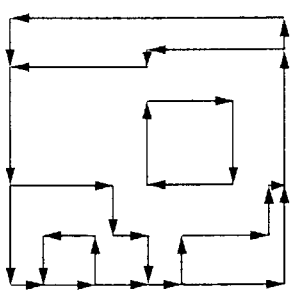
INVERT PATTERN SEGMENT →
FIG. 24D
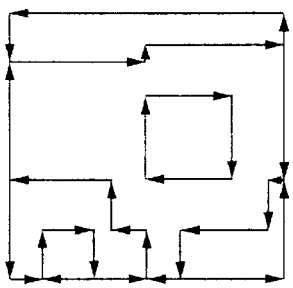
FIG. 24E
PATTERN ←
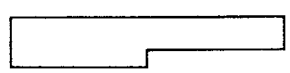
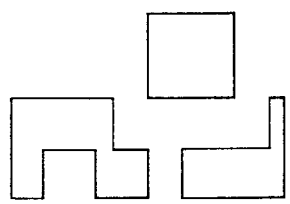
SELECT → DROPOUT PATTERN
FIG. 24F

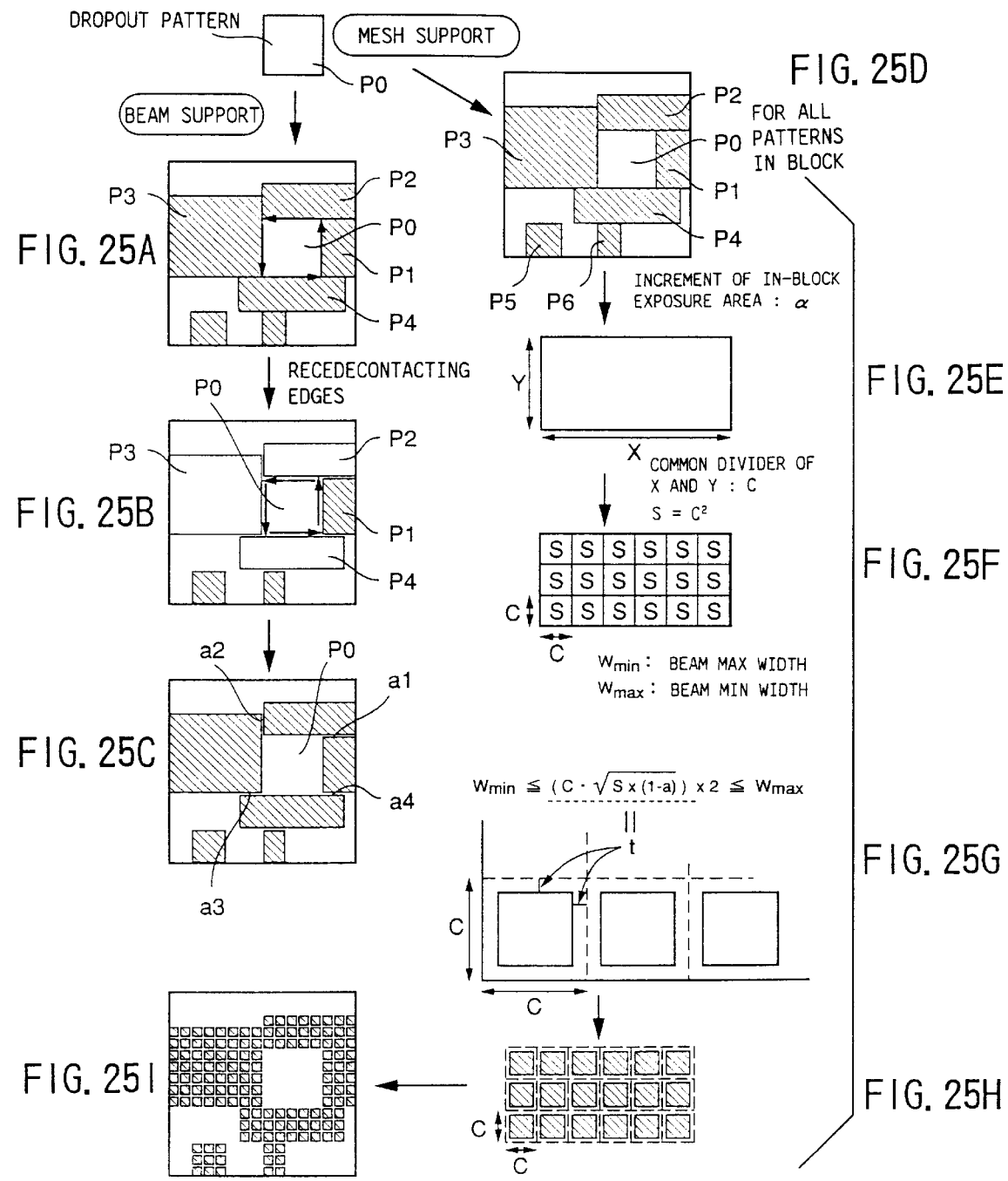

FIG. 27A
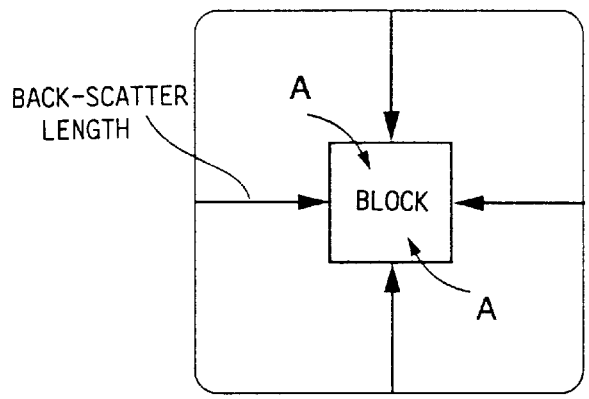
FIG. 27B
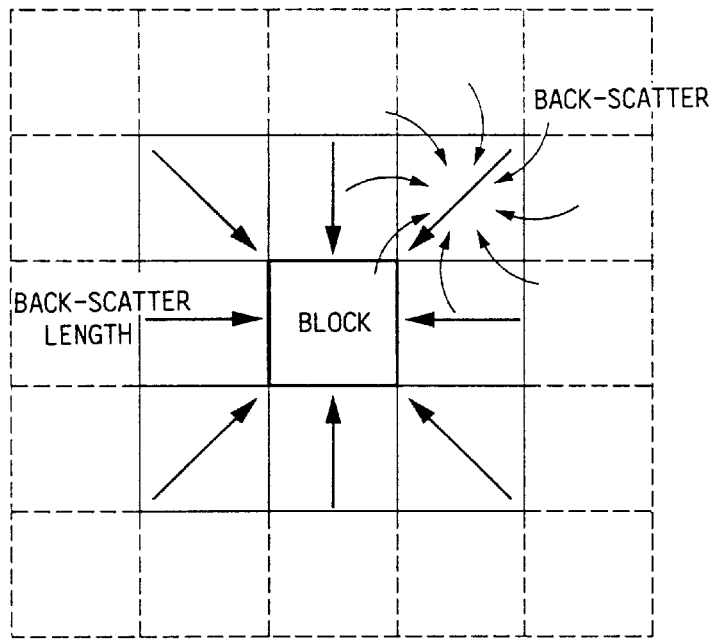
FIG. 27C
| DOSE | | | POINT |
|---|---|---|---|
| − B/2 < | BLOCK DOSE | − 2B ≦ B/2 | −2 |
| − B/2 < | BLOCK DOSE | − B ≦ B/2 | −1 |
| − B/2 < | BLOCK DOSE | ≦ B/2 | 0 |
| − B/2 < | BLOCK DOSE | +B ≦ B/2 | 1 |
| − B/2 < | BLOCK DOSE | + 2B ≦ B/2 | 2 |
| − B/2 < | BLOCK DOSE | +pB ≦ B/2 | p |

FIG. 28A
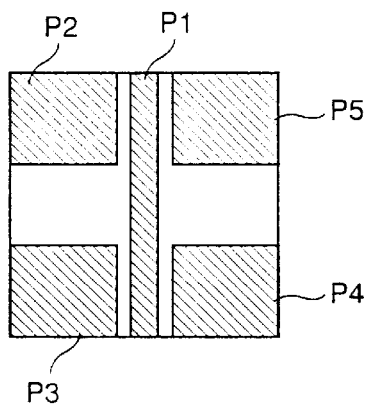
FIG. 28B    IN-PATTER CORRECTION
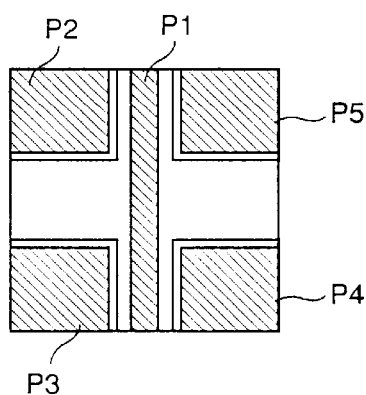
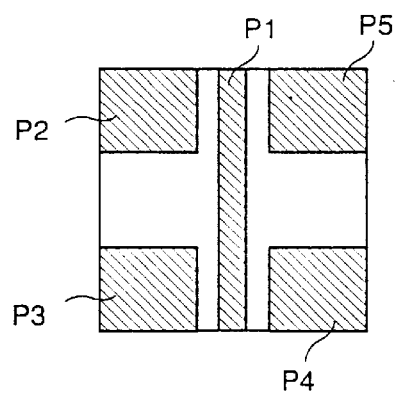
FIG. 28C
FIG. 28D    INTER PATTERN CORRECTION
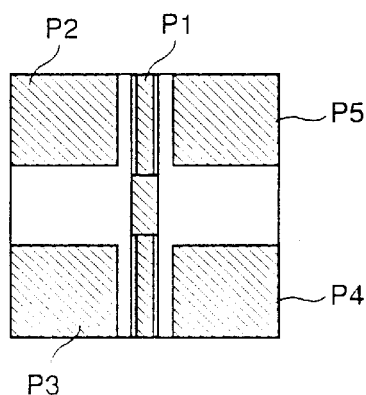
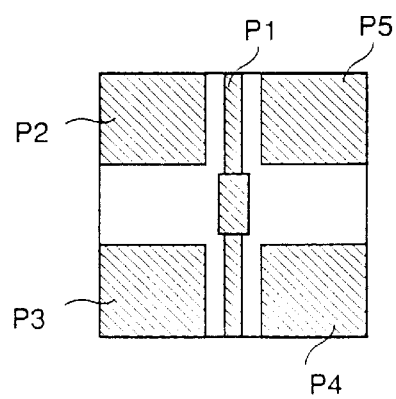
FIG. 28E

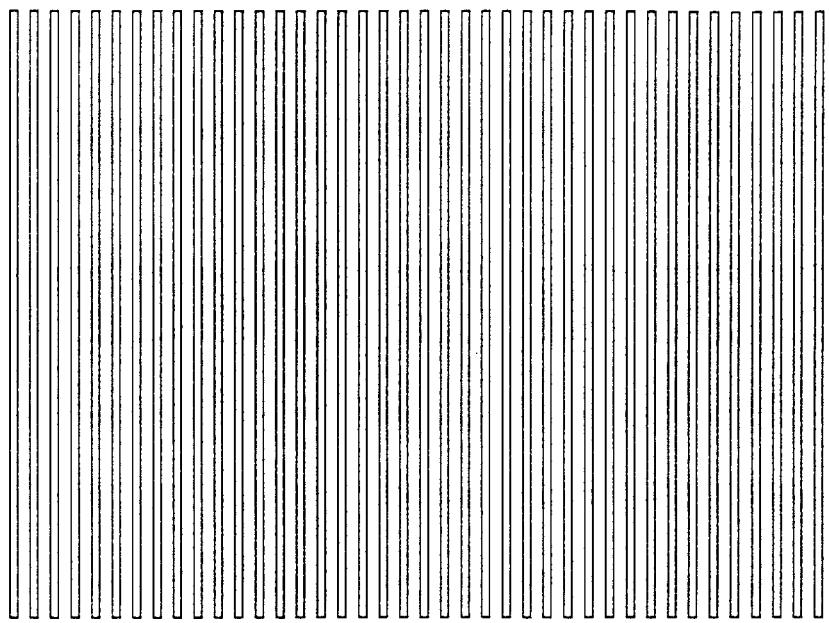
FIG. 29A
FIG. 29B    EXPOSE ALL PATTERNS BY SAME BLOCK
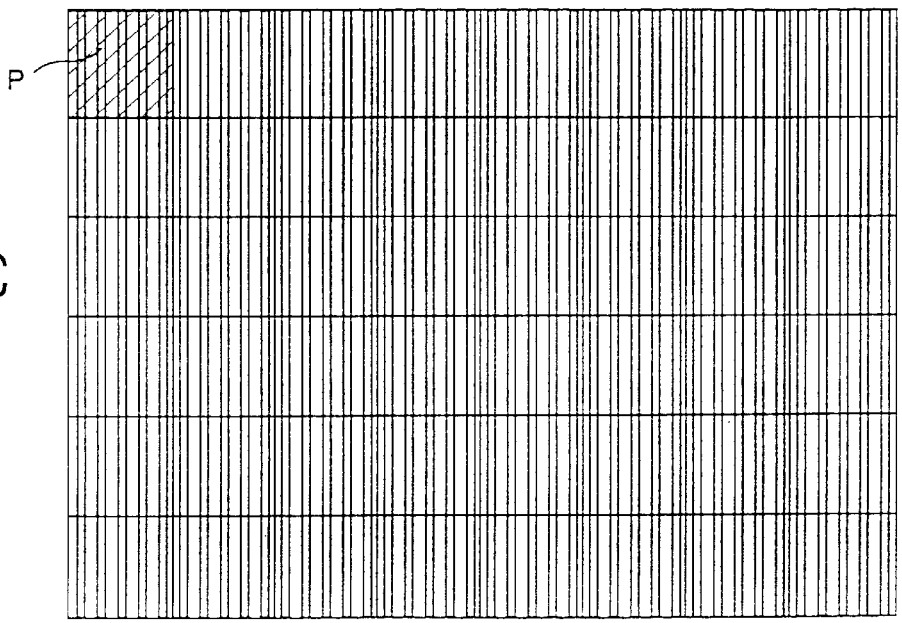
FIG. 29C FIG. 32A
FIG. 32B
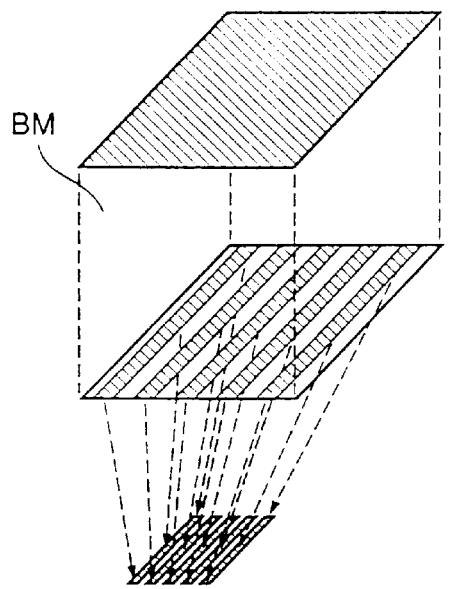
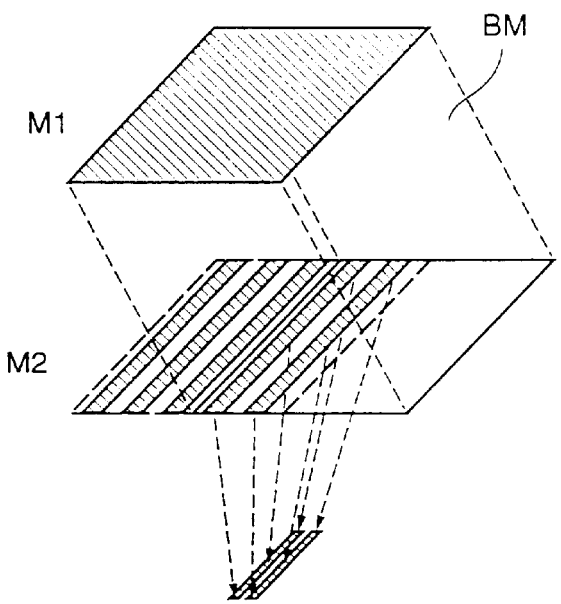
FIG. 32C
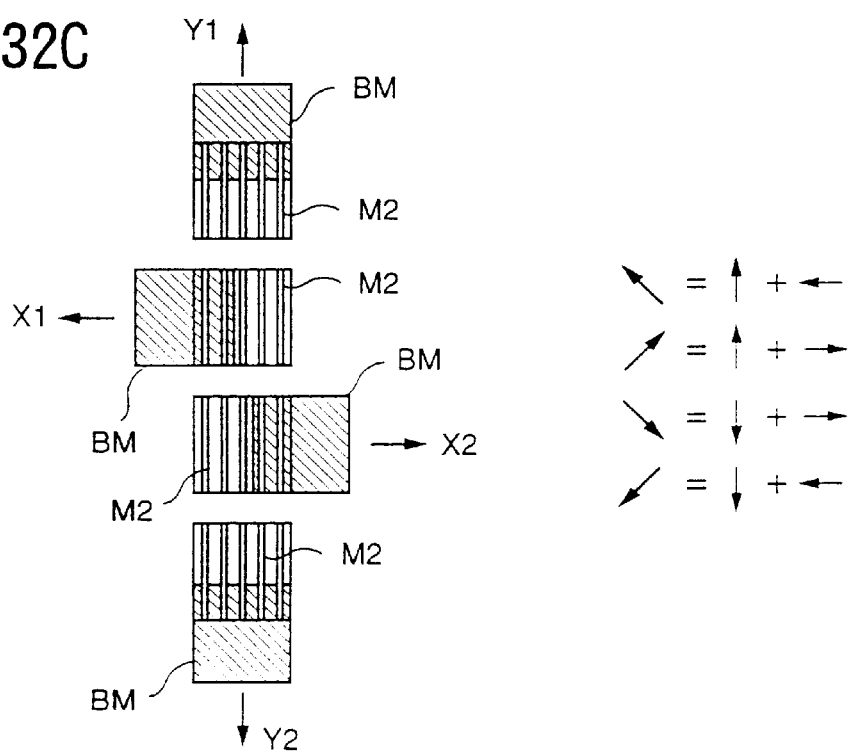

FIG. 35

| | |
|---|---|
| ☐ INFO | |

| | |
|---|---|
| Pattern Type | AUX |
| Arrangement | MATRIX |
| X | -406.330 um |
| Y | 2699.430 um |
| Width | 4.000 um |
| Height | 4.000 um |
| Field No. | 0 |
| Subfield No. | 364 |
| PDC | |
| Clock Code | 16 |
| Dose Value | |

Changed Clock Code [ ]

Changed Dose Value [ ]

[ OK ]  [ Cancel ]

FIG. 36

IN-BLOCK PATTERN INFO

| | VARIABLE RECTANGLE | | STANDARD TRIANGLE | | STANDARD PARALLELOGRAM |
|---|---|---|---|---|---|
| | ARBITRARY TRIANGLE | | ARBITRARY PARALLELOGRAM | | |

| 0 | 30 | 30 |
| 1 | 60 / 60 / 15 | 135 |
| 2 | 60 / 60 / 15 | 135 |
| 3 | 18 | 18 |
| 4 | 12 | 12 |
| 5 | 8 | 8 |
| 6 | 8 | 8 |
| 7 | 8 | 8 |
| 8 | 8 | 8 |
| 9 | 8 | 8 |
| 10 | 8 | 8 |
| 11 | 20 | 20 |
| 12 | 8 | 8 |

FIG. 38

BLULK SHUT INFORMATION

| 0 | 4094976 |
|---|---|
| 1 | 1618176 |
| 2 | 1618176 |
| 3 | 3236362 |
| 4 | 2641920 |
| 5 | 1430544 |
| 6 | 24768 |
| 7 | 24768 |
| 8 | 24768 |
| 9 | 24768 |
| 10 | 49536 |
| 11 | 49536 |
| 12 | 24768 |
| 13 | 24768 |
| 14 | 24768 |
| 15 | 24768 |
| 16 | 23976 |
| 17 | 23976 |
| 18 | 23976 |

FABRICATION PROCESS OF A SEMICONDUCTOR DEVICE BY ELECTRON-BEAM LITHOGRAPHY

BACKGROUND OF THE INVENTION

The present invention generally relates to fabrication of semiconductor devices and more particularly to an electron-beam lithography used for fabricating ultra-fine semiconductor devices. More particularly, the present invention relates to the creation and representation of exposure data used in an electron-beam exposure system when fabricating ultra-fine semiconductor devices. Further, the present invention relates to the fabrication process of an exposure mask.

An optical lithography process, which exposes numerous semiconductor patterns simultaneously while using a single mask, is an efficient exposure process of semiconductor devices and has been used extensively in production of various semiconductor devices and integrated circuits.

However, increasing demand of device miniaturization has led to such a situation in which a semiconductor pattern has to be exposed with a size comparable with a wavelength of the optical radiation that is used for the exposure. In order to deal with such a stringent demand of device miniaturization, various super-resolution techniques, including the art of phase shift mask, modified optical illumination, or use of deep ultraviolet wavelength radiation, has been proposed. However, such a measure of super-resolution technique is now reaching its limit and the difficulty of exposing a large area by a single exposure shot is increasing sharply. Associated therewith, the throughput of exposure is decreasing substantially. In the case of exposing 256 Mbit DRAMs, for example, the actual throughput of exposure is estimated to be about 30 wafers per hour.

The art of electron-beam lithography is a process that is expected to overcome the foregoing problem of resolution and throughput. In an electron-beam exposure process, in which the exposure is conducted by a finely focused electron beam, it is possible to expose extremely fine patterns smaller than 0.1 $\mu$m on a semiconductor wafer. Thus, an electron-beam exposure process has been used for producing a limited amount of prototype semiconductor devices of various, different designs. For such a purpose, a direct electron-beam exposure process, which does not use an exposure mask, is advantageous.

Thus, the electron-beam exposure process is currently used in various fields of semiconductor industry, ranging from LSI development to preparation of exposure mask. On the other hand, due to the nature of the direct electron-beam exposure process of exposing a pattern consecutively by a single focused electron-beam, the use of such a direct electron-beam exposure process is not appropriate for mass producing semiconductor devices. The throughput of exposure is deteriorated further when the cross-sectional shape of the electron-beam is changed by a variable-beam shaping process, in which the electron-beam is displaced with respect to an aperture mask for the variable-beam shaping.

FIGS. 1A and 1B show an example of such a variable-beam shaping of an electron-beam.

Referring to FIG. 1A, an electron beam BM1, shaped to have a large rectangular cross-section by a first mask M1, is passed through a second mask M2 to form an electron beam BM2 of a smaller, rectangular cross-section. The size of the electron beam BM2 is changed by changing the optical axis of the electron beam BM1 with respect to the mask M2. Thus, by using the electron beam BM2, it is possible to expose various patterns including a triangular pattern as indicated in FIG. 1B, wherein it can be seen that the oblique edge of the triangular pattern is represented by a number of steps. It should be noted that the exposure of the triangular pattern is conducted by carrying out a number of shots each exposing a small rectangle by the electron-beam BM2. Thus, such a variable-beam shaping process has a drawback in that it takes a long time for exposing a desired pattern. For example, only one or two wafers are exposed per hour.

Meanwhile, there is a proposal of so-called block exposure process in which various patterns are exposed on a wafer by shaping the electron beam according to the desired pattern.

FIG. 2 shows the principle of the block exposure process.

Referring to FIG. 2, it can be seen that the second mask M2 called hereinafter a block mask carries a number of apertures P or Pa of various shapes for shaping the electron-beam BM1. As the electron-beam BM2 thus shaped by the block mask M2 has a cross-sectional shape corresponding to the shape of the aperture hit by the electron-beam BM1, it is possible to expose the wafer with the shape of the selected aperture by directing the electron-beam BM1 such that the electron-beam BM1 hits the desired aperture P and by focusing the shaped electron-beam BM2 on the semiconductor wafer with a demagnification. For example, it is possible to expose a triangular pattern or cross-shaped pattern on the semiconductor wafer by a single shot. Thus, the block exposure process of FIG. 2 is suited for mass production of semiconductor devices. In the case of producing 256 Mbit DRAMS, for example, a throughput of 20 wafers or more per hour can be achieved.

In the block exposure process of FIG. 2, it is still required to provide a beam shaping mask including the masks M1 and M2. In the block mask M2, in particular, there arises a problem in that, while the exposure of stripe patterns shown in FIG. 3B is made successfully by using the block mask of FIG. 3A, on which a number of stripe patterns are formed, the exposure of a ring-shaped pattern including an isolated dot such as the one shown in FIG. 3D is not possible, as the corresponding block mask shown in FIG. 3C cannot be formed in practice. It should be noted that the central dot of the block mask of FIG. 3C corresponding to the isolated dot of FIG. 3D lacks a mechanical support and cannot be maintained. As a result, the pattern actually exposed on the semiconductor wafer becomes a mere flat exposure pattern as indicated in FIG. 3E.

In addition to the foregoing difficulty of preparing a block mask, the block exposure process of FIG. 2 has a further difficulty, associated with the fact that the shaped electron-beam BM2 is demagnified by a factor of tens or hundreds, in that the electrons in the shaped electron beam BM2 tend to repel each other due to Coulomb repulsion occurring in the electrons as a result of the severe focusing of the electron-beam for the demagnification. When such a Coulomb repulsion takes place in the electrons in the electron beam BM2, the resolution of the exposed pattern is deteriorated inevitably.

In order that the block exposure process provides the expected high-throughput exposure, it is necessary that the block mask M2 carries frequently used exposure patterns. As the number of the exposure patterns that can be formed on the block mask M2 is limited in view of the limited size of the block mask M2, it is essential to make sure that the exposure patterns on the block mask are the patterns used most frequently. Otherwise, the block mask M2 has to be replaced frequently, while such a replacement of the block mask deteriorates the throughput of exposure substantially. However, such extraction of the frequently used patterns from a huge number of possible exposure patterns is difficult for a human operator.

In the actual block exposure process conducted by an electron-beam exposure apparatus, it is practiced to prepare an evaluation pattern on the block mask M2 for evaluation of the exposure pattern exposed on the semiconductor wafer by the evaluation pattern. The evaluation pattern is thereby used for various adjustment of the electron-beam exposure apparatus, including smooth interconnection of a block exposure pattern and a variable-beam exposure pattern, compensation of exposed pattern variation caused by the block mask or by the semiconductor wafer, and the like. However, such adjustment of the electron-beam exposure apparatus has been difficult to carry out manually, as such a manual adjustment of the electron beam exposure apparatus takes an enormous time, which inevitably leads to a delay in the setup of the exposure process.

In addition, conventional block exposure process has a problem of proximity effect. When a proximity effect is caused, the electrons focused upon the semiconductor wafer are back-scattered by the resist covering the semiconductor wafer or the semiconductor wafer itself, and the exposed pattern is distorted. In order to compensate for such a distortion, it is necessary to change the exposure dose depending on the exposed pattern. In the case of block exposure process, on the other hand, such a mere change of the exposure dose depending on the exposed pattern is not sufficient, as the degree of back-scattering of the electrons is influenced not only by the irradiation dose but also by the adjacent exposure patterns.

Further, it should be noted that the amount of the exposure data to be processed when exposing an LSI pattern on a semiconductor wafer by using an electron-beam exposure apparatus, is enormous. Thus, several days have been necessary to process the exposure data before conducting the actual exposure process, while such a long process time of the exposure data decreases the throughput of production of the semiconductor devices.

It is not possible to say what pattern on the semiconductor wafer has been exposed by the block exposure process and what pattern on the same semiconductor wafer has been exposed by the variable-beam exposure process. Thus, it has been necessary to test the block mask by first forming the block mask and then conducting an exposure process while using the block mask thus formed. However, such an evaluation process is expensive and takes time.

SUMMARY OF THE INVENTION

Accordingly, it is a general object of the present invention to provide an exposure data creation process and a process of displaying exposure data thus created wherein the foregoing problems are eliminated.

Another and more specific object of the present invention is to provide to provide an exposure data creation process and a process of displaying exposure data thus created wherein the exposure data is created efficiently with short time.

Another object of the present invention is to provide a method of creating exposure data, comprising the steps of:
dividing an exposure area, on which an exposure is to be made, into a plurality of regions;
creating an exposure pattern for each of said plurality of regions; and
creating exposure data for each of said exposure patterns.

According to the present invention, the exposure data is created in the form of pattern. The process of creating such patterns is substantially facilitated by using a pattern generation tool such as CAD.

Another object of the present invention is to provide a method of creating exposure data from design data, comprising the steps of:
extracting a pattern group from a plurality of pattern groups constituting said design data;
extracting a plurality of patterns from said extracted pattern group; and
creating said exposure data from said extracted patterns.

According to the present invention, the efficiency of creating the exposure data is improved substantially, by improving the efficiency of extraction in the step of extracting the pattern group and in the step of extracting the patterns.

Another object of the present invention is to provide a method of creating exposure data in corresponding to an exposure pattern, comprising the step of:
forming an aperture pattern included in said exposure pattern, in the form of an assembly of minute aperture patterns.

According to the present invention, an optically non-penetrating, interrupting pattern can be formed successfully on a beam shaping mask even in such a case in which the interrupting pattern is surrounded by a ring-shaped aperture pattern.

Another object of the present invention is to provide a method of creating exposure data in corresponding to an exposure pattern, comprising the step of:
evaluating an effect of distortion of said exposure pattern, caused by an electron beam exposing an adjacent exposure pattern; and
modifying said exposure data so as to compensate for said distortion.

According to the present invention, the effect of distortion in the exposed pattern, caused by the scattering of the electron beam exposing an adjacent pattern, is effectively compensated for even in such a case in which dense patterns are exposed.

Another object of the present invention is to provide a method of displaying an exposure pattern on a display device in correspondence to exposure data, comprising the step of:
modifying a representation of said exposure pattern on said display device according to an exposure process used.

According to the present invention, it becomes possible to discriminate an exposure pattern exposed according to a specific exposure process, such as a variable-beam exposure process, from an exposure pattern exposed by a block exposure process.

Another object of the present invention is to provide a method of displaying an exposure pattern on a display device in correspondence to exposure data, comprising the step of:
modifying a representation of said exposure pattern on said display device according to an exposure unit.

According to the present invention, it becomes possible to recognize the overall arrangement of the exposure units at a glance.

Another object of the present invention is to provide a method of displaying an exposure pattern on a display device in correspondence to exposure data, comprising the steps of:

calculating an exposure throughput from said exposure data; and displaying said throughput on said display device.

According to the present invention, it becomes possible to recognize the expected throughput of the exposure instantly. Thereby, an optimization of the exposure throughput is made easily by modifying the exposure data.

Another object of the present invention is to provide a method of displaying an exposure pattern on a display device in correspondence to exposure data, comprising the step of:

displaying an exposure pattern simulated from said exposure data under a given exposure condition.

According to the present invention, it becomes possible to recognize the exposure pattern to be exposed on a semiconductor wafer intuitively.

Other objects and further features of the present invention will become apparent from the following detailed description when read in conjunction with the attached drawings.

BRIEF DESCRIPTION OF THE DRAWINGS

FIGS. 3A–3E are diagrams explaining a problem in the conventional block exposure process;

FIG. 4 is a block diagram showing a fundamental construction of an electron-beam exposure system of the present invention;

FIGS. 20A–20D are further diagrams showing the extraction of region in the third embodiment;

FIGS. 23A–23D are diagrams showing the process of pattern dropout elimination of the fifth embodiment;

FIGS. 24A–24F are diagrams showing a process of identifying a dropout pattern according to the fifth embodiment;

FIGS. 25A–25I are diagrams showing the process of pattern dropout elimination of the fifth embodiment;

FIGS. 27A–27C are diagrams showing the process of the proximity effect compensation of the sixth embodiment;

FIGS. 28A–28E are further diagrams showing the process of the proximity effect compensation of the sixth embodiment;

FIGS. 29A–29C are further diagrams showing the process of the proximity effect compensation of the sixth embodiment;

FIGS. 32A–32C are diagrams showing a creation of a partial block pattern for proximity effect compensation according to the sixth embodiment;

FIG. 35 is a diagram showing an example of in-block pattern information of the seventh embodiment;

FIG. 36 is a diagram showing an example of representation of block pattern information in the seventh embodiment;

FIG. 38 is a diagram showing an example of representation of the shot number analysis for each block carried out in the seventh embodiment;

DETAILED DESCRIPTION OF THE PREFERRED EMBODIMENTS

[FIRST EMBODIMENT]

Figure 1:
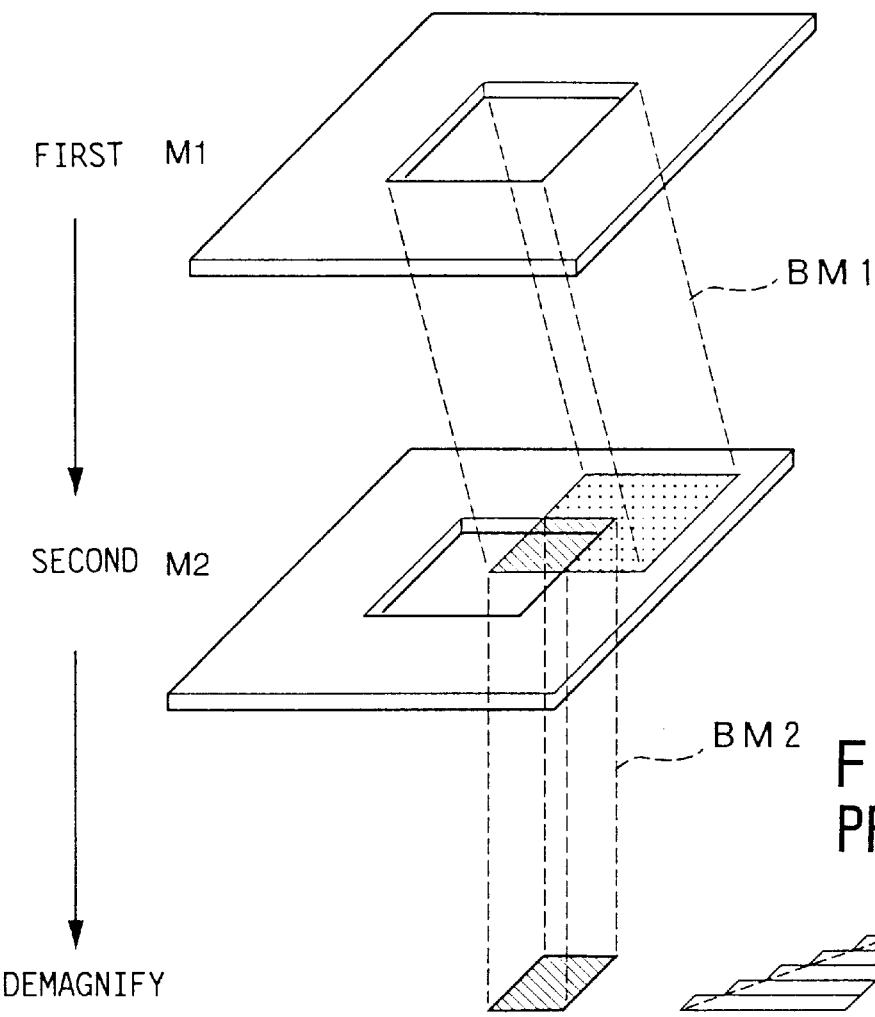
FIGS. 1A and 1B are diagrams showing a conventional variable-beam exposure process.
Figure 2:
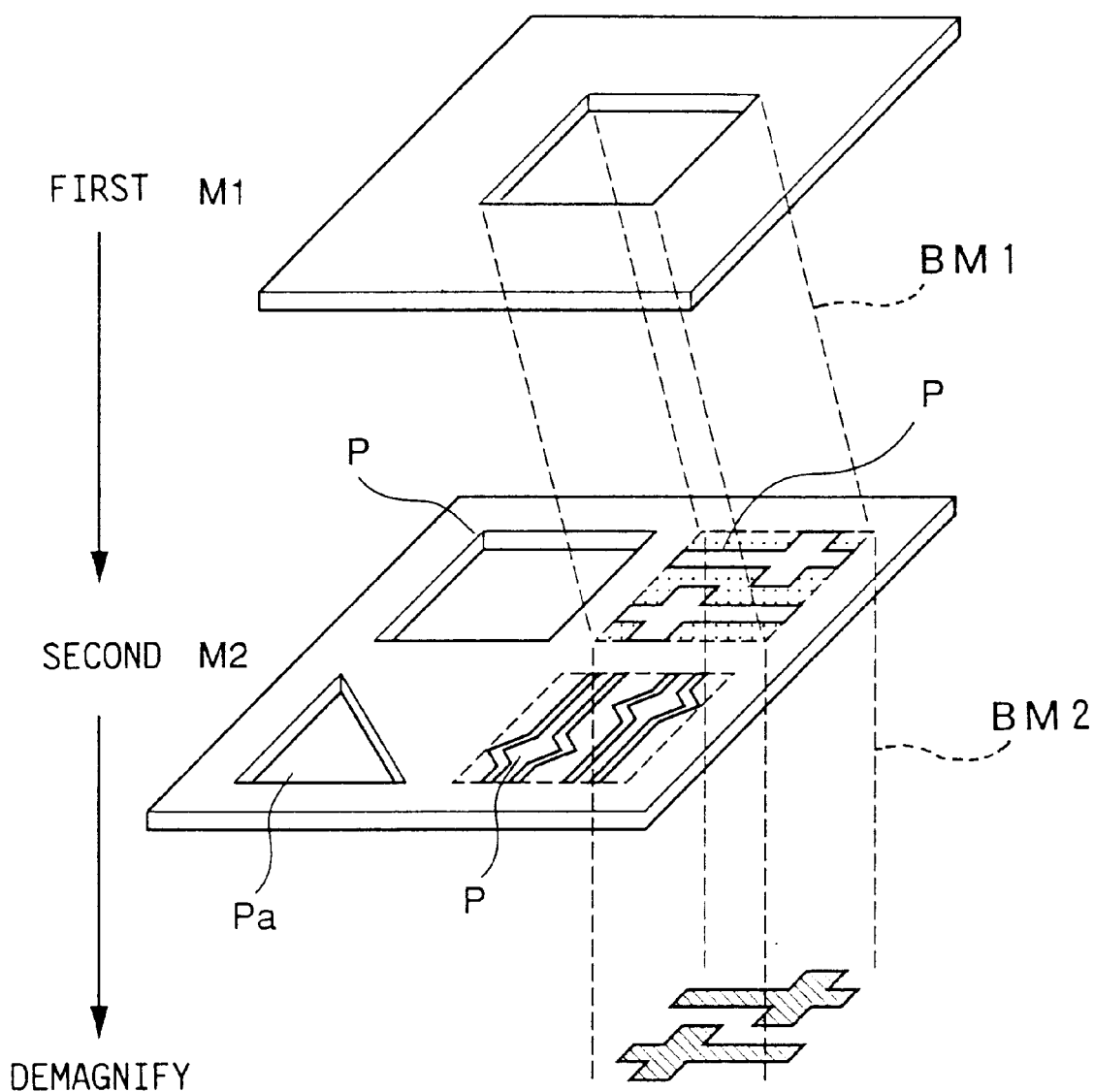
FIG. 2 is a diagram showing a conventional block exposure process.

FIG. 4 shows the construction of an exposure data creation unit 1 according to a first embodiment of the present invention.

Referring to FIG. 4, the exposure data creation unit 1 includes a keyboard 2 used for inputting command or data, a display device 3 used for displaying various data, a processor (CPU) 4 used for processing data, a design data file 5 used for filing design data, an optimized data file 6 used for filing optimized data, an exposure data file 7 used for filing exposure data, a design data optimization editor 8 used for editing the optimized design data corresponding to the exposed pattern, based on the design data filed in the design data file 5, an exposure data creation editor 9 used for creating the exposure data based on the optimized data optimized by the design data optimization editor 8 and filed in the optimized data file 6, and an exposure data analysis editor 10 used for analyzing the exposure data created by the exposure data creation editor 9 and stored in the exposure data file 7.

The exposure data thus created by the exposure data creation unit 1 and stored in the exposure data file 7 is used in an electron beam exposure unit 100 for exposing a semiconductor wafer.

Figure 5:
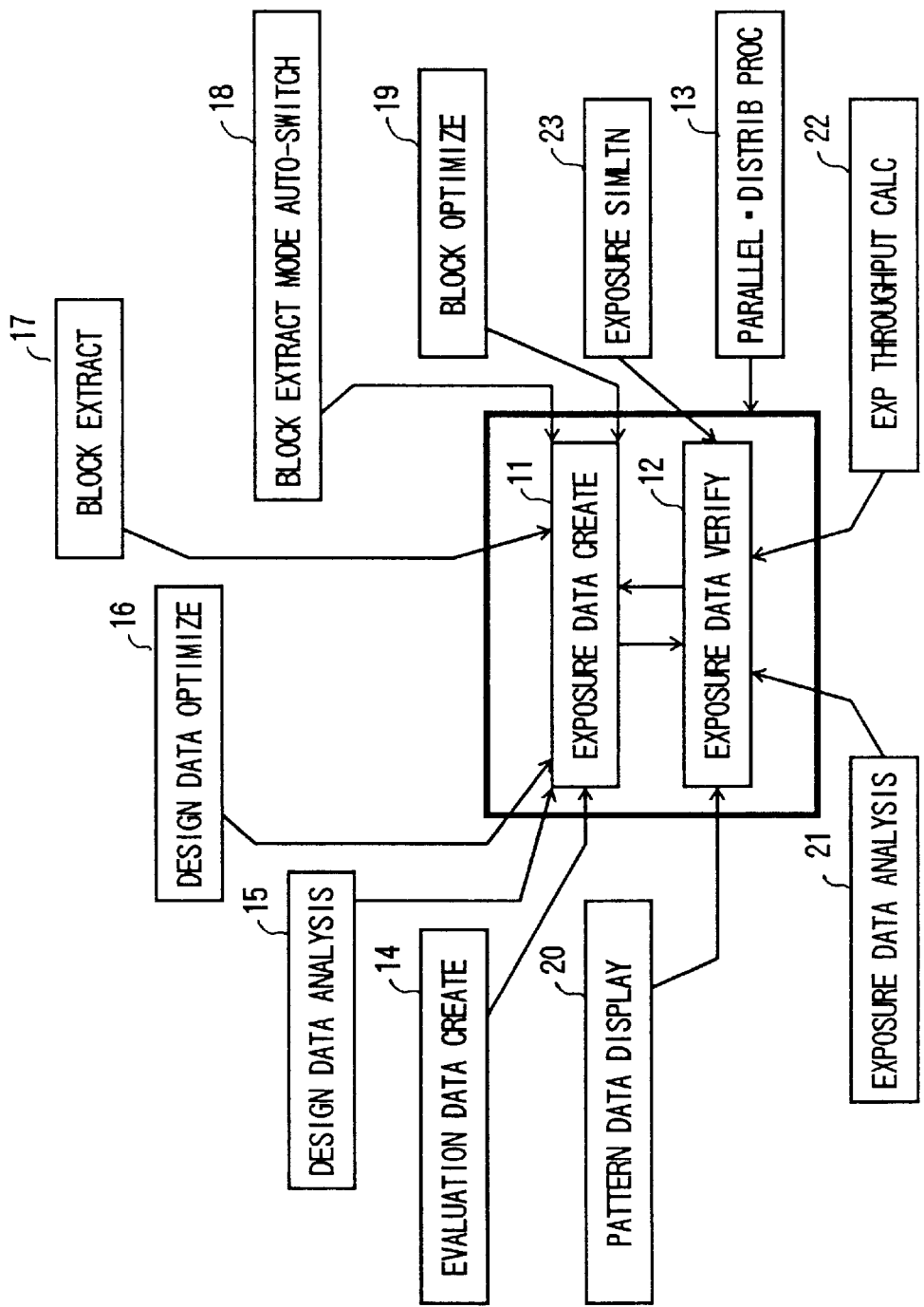
FIG. 5 is a functional block diagram of the electron-beam exposure system of the present invention.

FIG. 5 shows the functional block diagram of the exposure data creation unit 1 of FIG. 4.

Referring to FIG. 5, the exposure data creation unit 1 generally carries out two functions, the one being a exposure data creation function 11 and the other being an exposure data verifying function 12.

More specifically, the exposure data creation function 11 creates evaluation exposure data used for evaluation. Further, the exposure data creation function 11 creates exposure data based on the design data filed in the design data file 5. The exposure data verifying function 12, on the other hand, is used to analyze the exposure data by conducting a simulation on the exposure data created by the exposure data creation function 11. Thereby, the exposure data creation function 11 and the exposure data verifying function 12 are processed in parallel by using a parallel processing function 13 that carries out a distributed processing.

It should be noted that the exposure data creation function 11 includes an evaluation exposure data creation function 14 used for creating the evaluation exposure data, a design data analysis function 15 used for analyzing design data stored in the design data file 5, a design data optimization function 16 used for optimizing the design data such that the design data is suitable for the creation of the exposure data based on the result of the design data analysis function 15, a block extraction function 17 used for extracting blocks divided out from the exposure data, a block extraction mode automatic switching function 18 used for switching the extraction mode of the block extraction function 17, and a block optimization function 19 used for optimizing the block extracted by the block extraction function such that the extracted block is optimized for creation of the exposure data.

On the other hand, the exposure data verifying function 12 includes a pattern data display function 20 used for displaying a pattern data, an exposure data analysis unit 21 used for carrying out an analysis of the exposure data crated by the exposure data creation function 11, an exposure throughput calculation function 22 used for calculating the throughput of the exposure data crated by the exposure data creation function 11, and an exposure simulation function 23 used for carrying out an exposure simulation based on the exposure data created by the exposure data creation function 11.

Hereinafter, the evaluation exposure data creation function 14 will be described.

Figure 6:
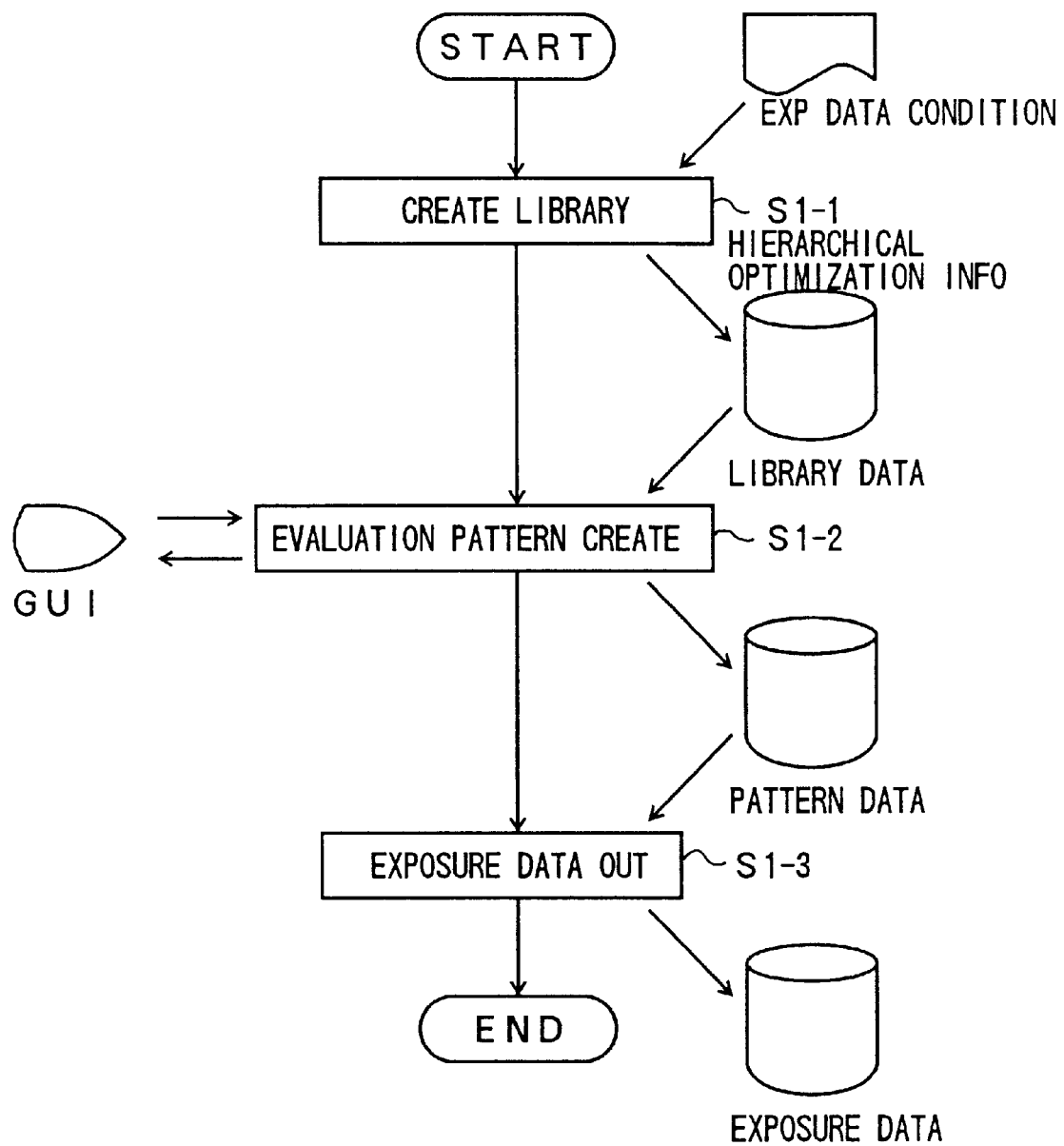
FIG. 6 is a flow-chart showing a process of creating an evaluation exposure pattern according to a first embodiment of the present invention.
Figure 7:
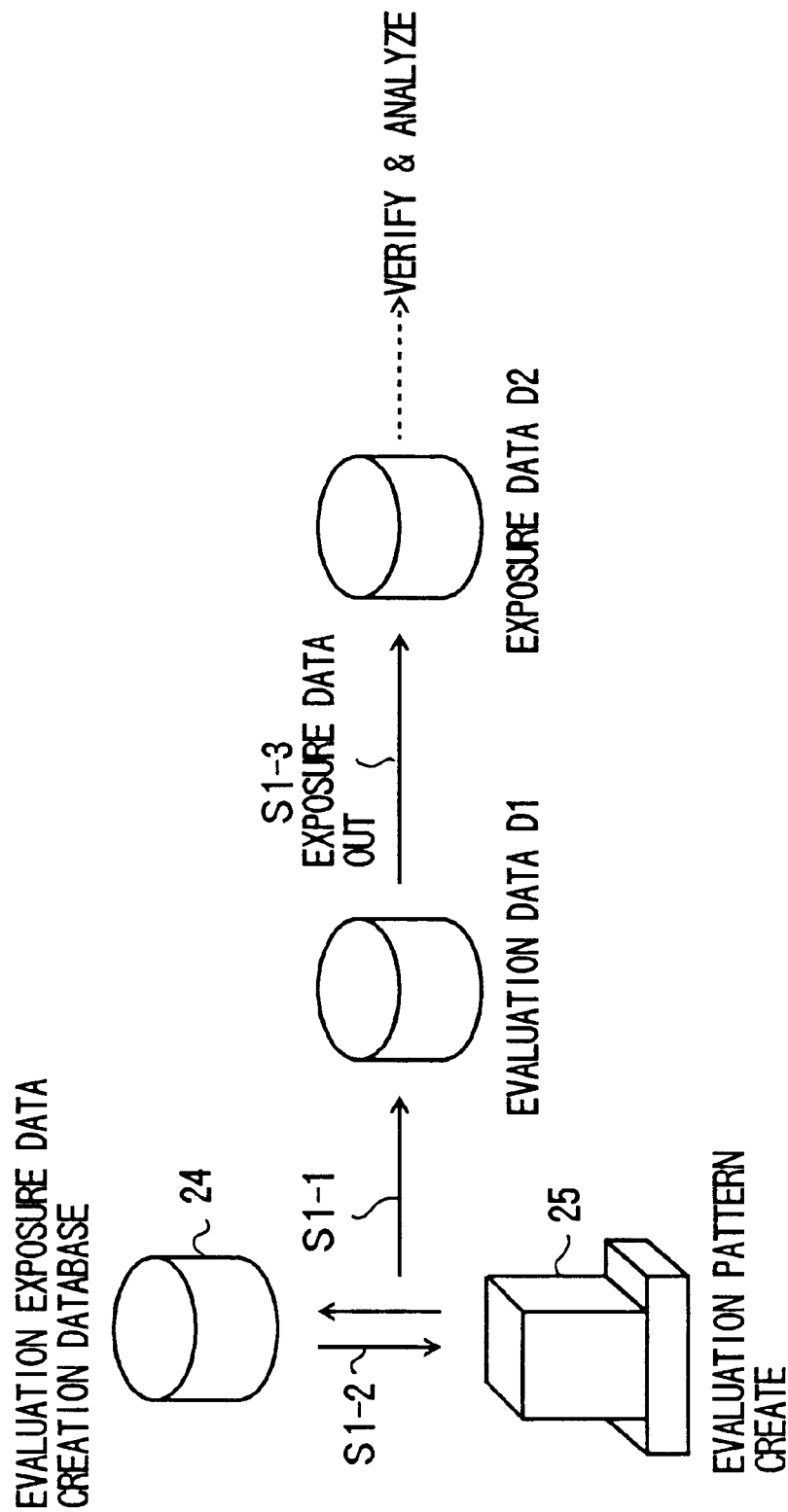
FIG. 7 is a diagram showing a data flow for creating the evaluation exposure data according to the first embodiment.

FIG. 6 shows a flowchart of the evaluation data creation function while FIG. 7 shows the data flow in the evaluation data creation function when creating evaluation exposure data.

Referring to FIG. 6, the evaluation exposure data creation function 14 generally includes a library creation step S1-3, a pattern creation step S1-2 and an exposure data output step S1-3, wherein the library creation step S1-1 creates a library 24 shown in FIG. 7 based on various conditions necessary for exposure data creation such as beam size change, exposure scan sequence, maximum beam size, number of the blocks, and the like. The library 24 thus created is used in the next step S1-2. It should be noted that the library 24 thus created has a hierarchical structure suitable for creation of highly compressed exposure data. It should be noted that the data thus created by the library creation step S1-1 is not the pattern data itself but a kind of frame data indicative of the hierarchical structure corresponding to a specified condition and a data size of respective hierarchical levels.

Figure 8:
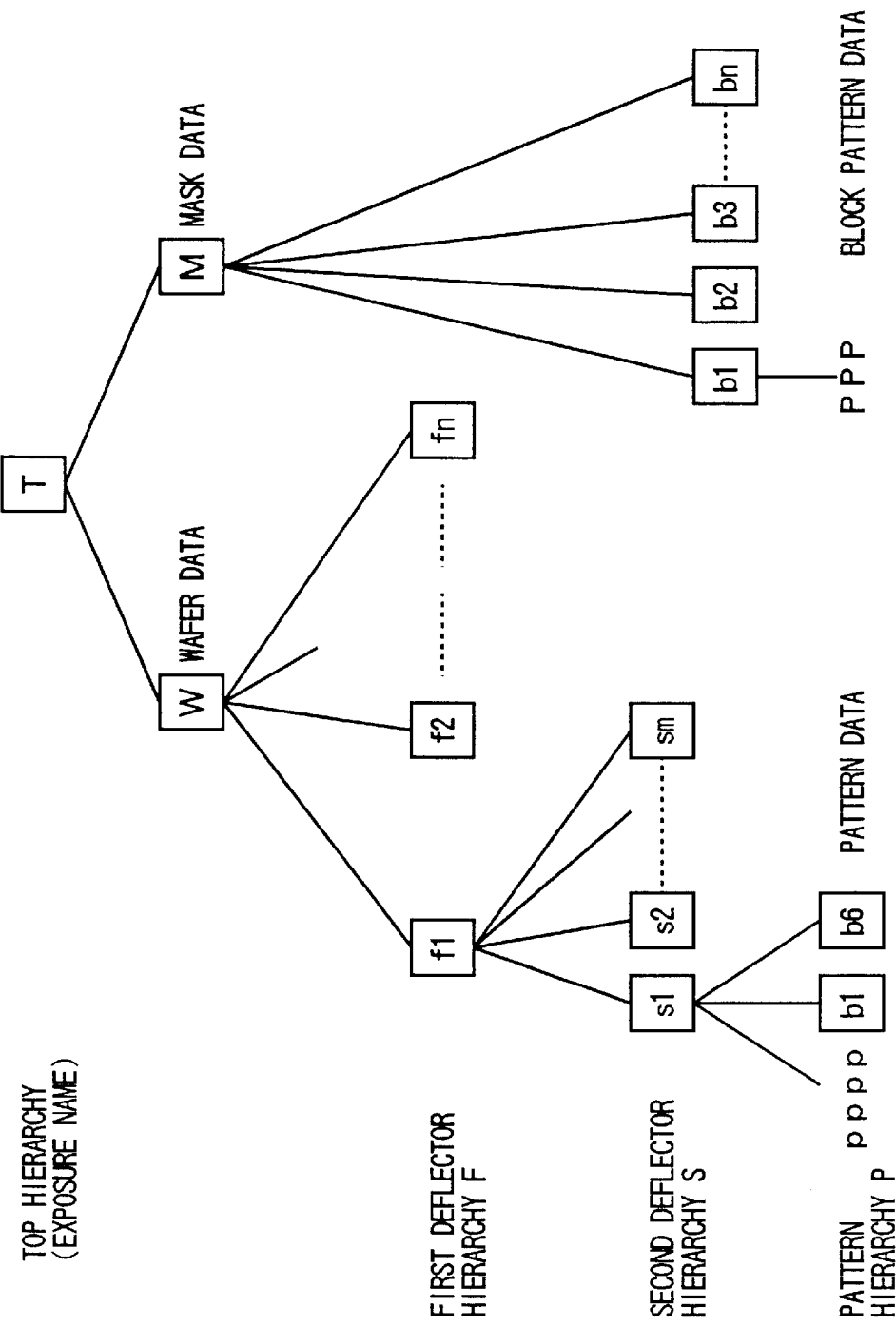
FIG. 8 is a diagram showing a library structure of the evaluation exposure data according to the first embodiment.

FIG. 7 shows the construction of the library 24 of the evaluation exposure data according to an embodiment of the present invention, while FIG. 8 shows the evaluation pattern data created by the evaluation exposure data creation function 11 of the present embodiment.

Referring to FIG. 7, the library data base in the library 24 has a hierarchical file structure including a top hierarchy T, and a wafer exposure data hierarchy W and a block mask creation hierarchy M are provided at a lower hierarchical level of the top hierarchy T. It should be noted that the wafer exposure data hierarchy W includes, at a further lower hierarchical levels, first and second deflection hierarchies F and S respectively in correspondence to two electron beam deflection systems used in the electron-beam exposure unit 100. The first and second deflection hierarchical levels F and S include deflection data f1–fn and s1–sn respectively. Further, there is provided a still lower hierarchical level P under the hierarchical level of the deflection data f1–fn or s1–sn for the patterns to be exposed under the respective deflection states, wherein the hierarchical level P includes pattern data including shot shape data p specifying the size and shape of a shot or a block pattern data b1–bn.

By using the shot shape data p, it is possible to define a rectangular pattern or a triangular pattern used in the variable-beam exposure process. By using the block pattern data b, it is possible to define the pattern exposed by the block exposure process.

Figure 9A:
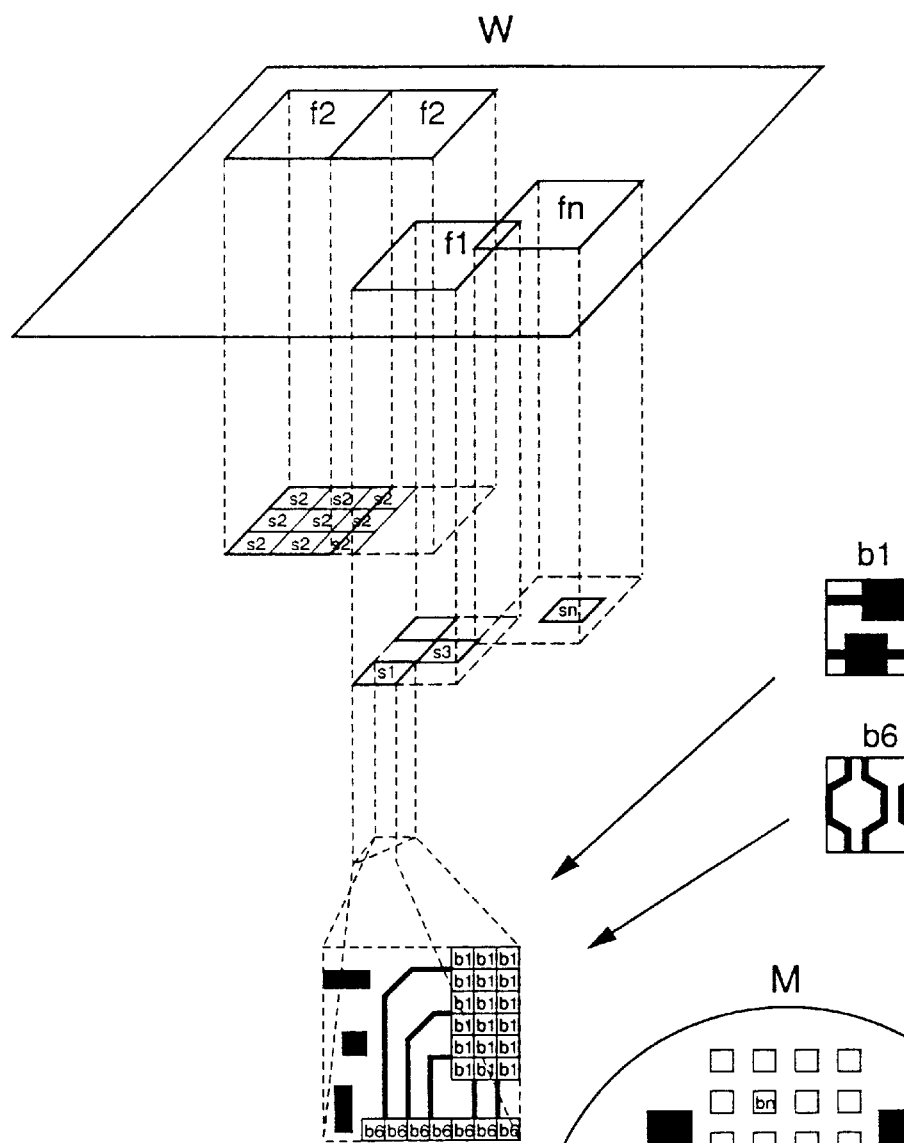
FIGS. 9A–9B are diagrams showing the construction of the evaluation pattern data used in the creation of the evaluation exposure pattern according to the first embodiment.
Figure 9B:
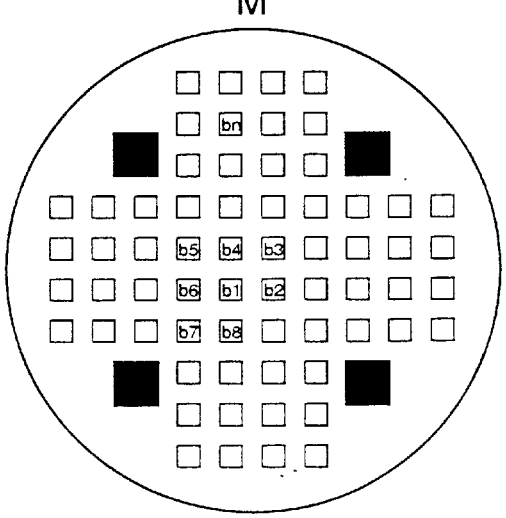

FIGS. 9A and 9B show an example of the evaluation exposure data corresponding to the hierarchical structure of FIG. 8, wherein FIG. 9A shows the wafer data W while FIG. 9B shows the mask data M. The wafer data W of FIG. 9A includes the deflection data f1–fn and the deflection data s1–sn while the mask data M of FIG. 9B includes the deflection data b1–bn.

Returning now to the data flow of FIG. 7, the step S1-2 of pattern creation is conducted such that the library file 24 obtained in the step S1-1 is fed to a pattern creation process 25, and evaluation data D1 is created on a computer graphic screen by using a CAD system.

In the next step of S1-3, the evaluation data D1 obtained in the step of S1-2 is converted into an exposure data format, by sorting the data D1 in conformity with the order of the exposure scanning. Thereby, exposure data D2 is obtained. When the exposure data D2 is thus obtained, a verification is made whether there is a violation of rule of the exposure data, and the location of violation is marked up red on the computer graphic screen, if any of such violation is detected. The evaluation exposure data thus obtained is used in the block exposure verification process or analysis process to be described later.

Summarizing above, the evaluation exposure data creation function 14 creates the library 24 necessary for creation of the evaluation exposure pattern easily, by specifying the conditions such as beam size change, the exposure scan sequence, the maximum beam size, the number of the blocks, and the like.

The library 24 thus obtained is used for the creation of the evaluation pattern conducted by a CAD system. Thereby, the evaluation pattern is created easily. By sorting the evaluation pattern data D1 thus created in conformity with the order of the exposure scanning, the evaluation pattern data D1 is converted into the exposure data D2 automatically.

Next, a description will be made on the exposure data creation function 11 for the case of creating exposure data from design data.

In the exposure data creation function 11, it should be noted that the block exposure data is created for decreasing the number of the shots. Further, the exposure data is created in the exposure data creation function 11 such that the exposure time is minimized, by reducing the exposure data size. Such a minimization of the exposure time is achieved by appropriately selecting the pattern group for the block exposure process or for the unit of the exposure compression, or for the unit of the exposure creation processing. Such a selection is made based on the result of the analysis of LSI layout data and hence the design data, by searching for the optimum exposure data. Alternatively, the data is modified based on the result of the analysis of the design data such that the data is optimized for creation of the exposure data.

When creating the exposure data for a pattern group, the creation process may be conducted, in the case the size of the exposure data is so huge for processing by a computer having a limited memory capacity, by dividing the pattern group into a plurality of regions each including a part of the pattern such that the size of the data for a single region is reduced sufficiently for processing by the computer.

Based on the result of the analysis, the information is acquired about the block exposure data group, repetitive output pattern group, and the dividable pattern group. In the exposure data creation process, various processes such as the block pattern extraction, exposure data compression, pattern group processing, distributed processing, parallel processing, and the like, are conducted according to the information of the exposure data creation, based on the optimized data. Thereby, the block mask creation data and wafer exposure data are created as the exposure data.

[SECOND EMBODIMENT]

Next, the operation of the exposure data creation function 11 according to a second embodiment of the present invention will be described.

Figure 10:
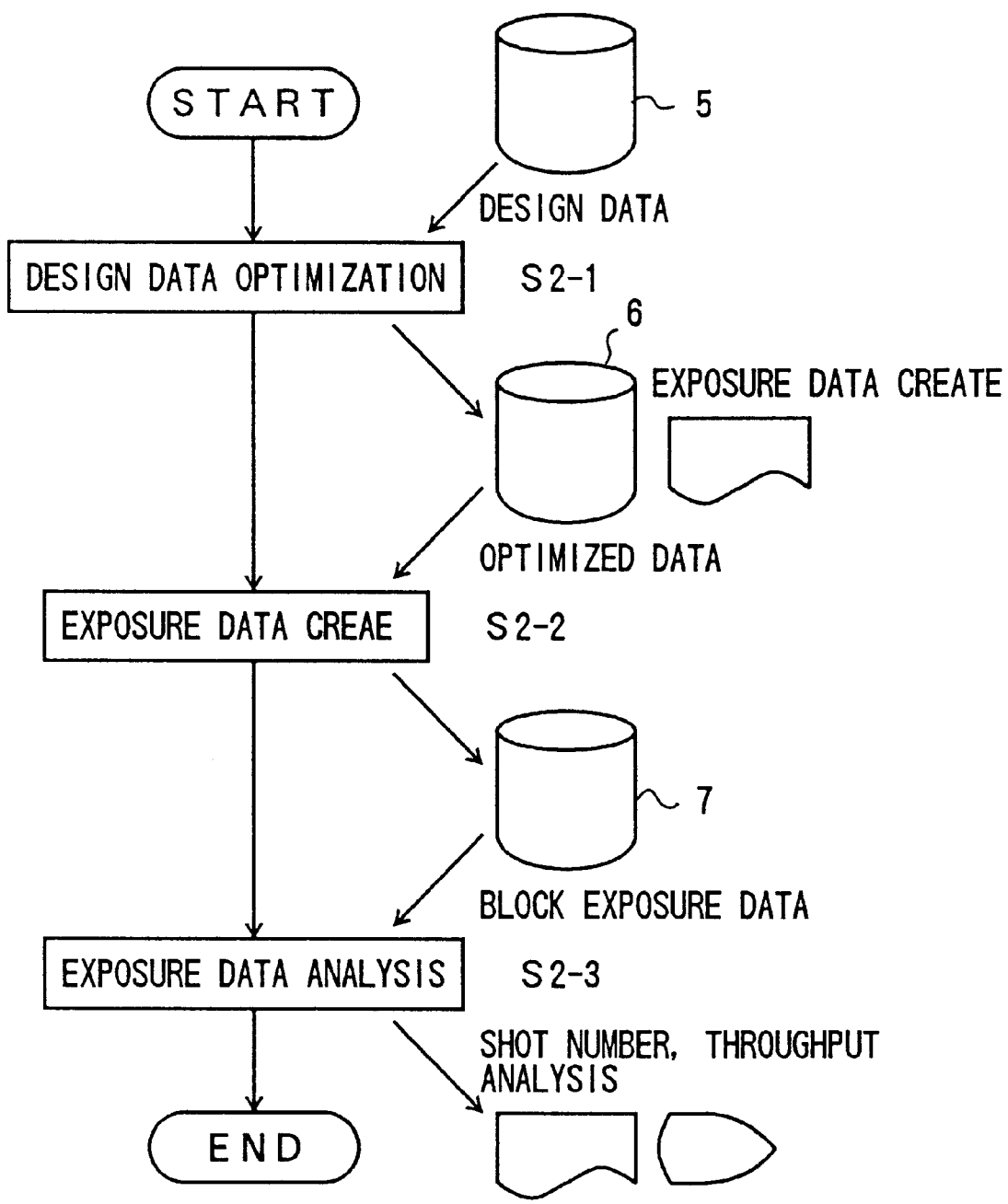
FIG. 10 is a flowchart showing the creation of exposure data according to a second embodiment of the present invention.

FIG. 10 shows the operation of creating the exposure data according to a second embodiment of the present invention.

Referring to FIG. 10, the process of creating the exposure data from the design data of the present embodiment generally includes a design data optimization process S2-1, an exposure data creation process S2-2 and an exposure data analysis process S2-3.

In the design data optimization process S2-1, an optimization is made with regard to the hierarchical structure stored in the design data file by using the design data optimization function 16.

Hereinafter, the design data optimization process S2-1 will be described in detail.

Figure 11:
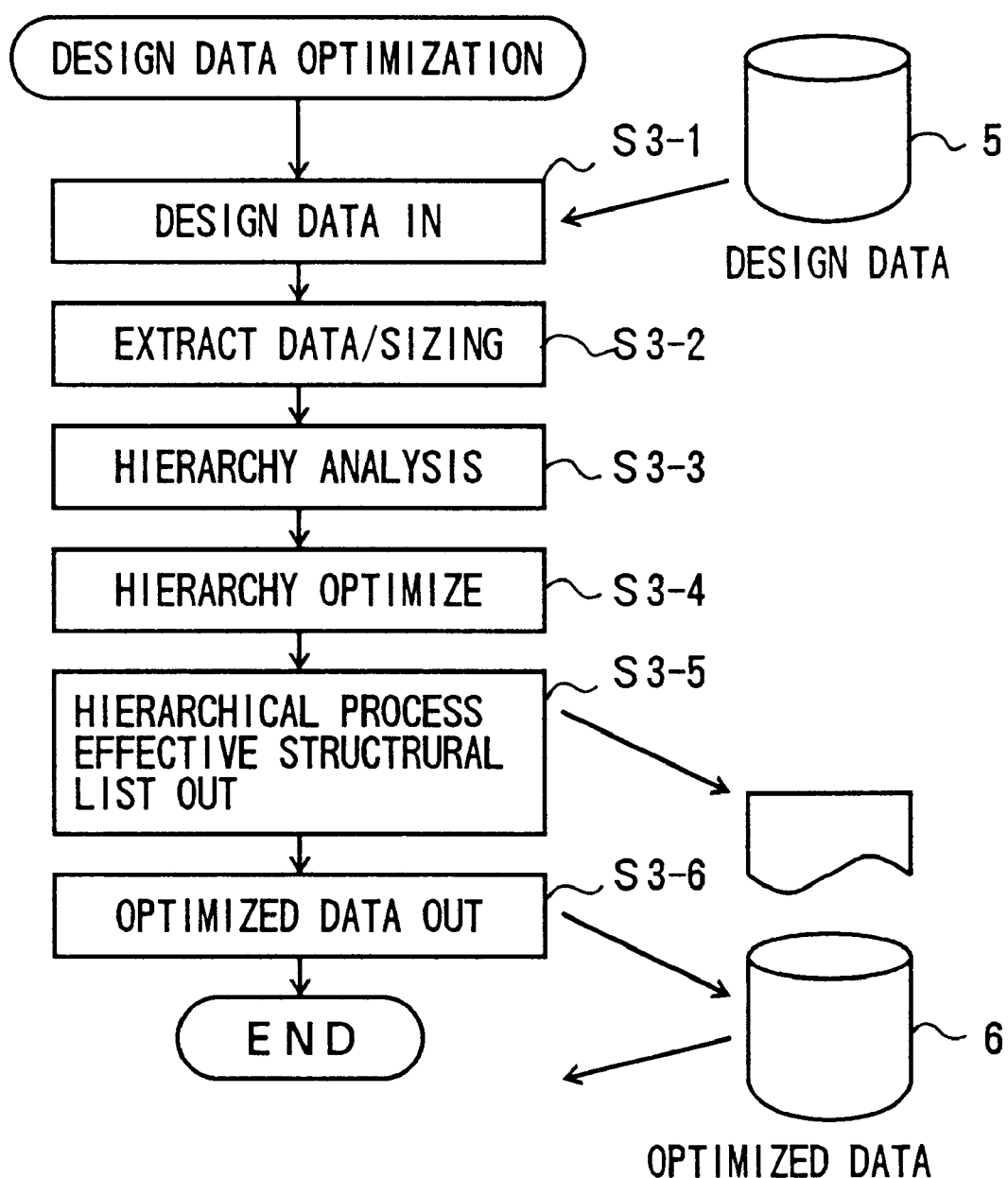
FIG. 11 is a flowchart showing an optimization process of design data according to the second embodiment.

FIG. 11 shows the flowchart of the design data optimization process according to the second embodiment of the present invention.

Referring to FIG. 11, the design data optimization process S2-1 includes an input step S3-1 in which the design data is acquired from the design data file 5. Next, in the step S3-2, desired data is extracted from the design data thus acquired and the data thus extracted is subjected to a sizing process. Further, the step S3-3 is conducted in which analysis is made on the data sized in the step S3-2. Further, the hierarchical data is optimized in the step S3-4 based on the result of the analysis of the step S3-3.

Next, an effective structure list for hierarchical processing is created in the step S3-5 based on the data optimized in the step S3-4, and the step S3-6 is conducted subsequently, in which the data optimized in the step S3-4 is stored in the optimized data file 6 as the data completed with the optimization process.

Hereinafter, the hierarchical analysis of the step S3-3 and the optimization of the hierarchical data in the step S3-4 will be described in detail. It should be noted that the hierarchical structural analysis of the step S3-3 and the hierarchical data optimization of the step S3-4 may be regarded as a process of extracting a pattern group.

Figure 12:
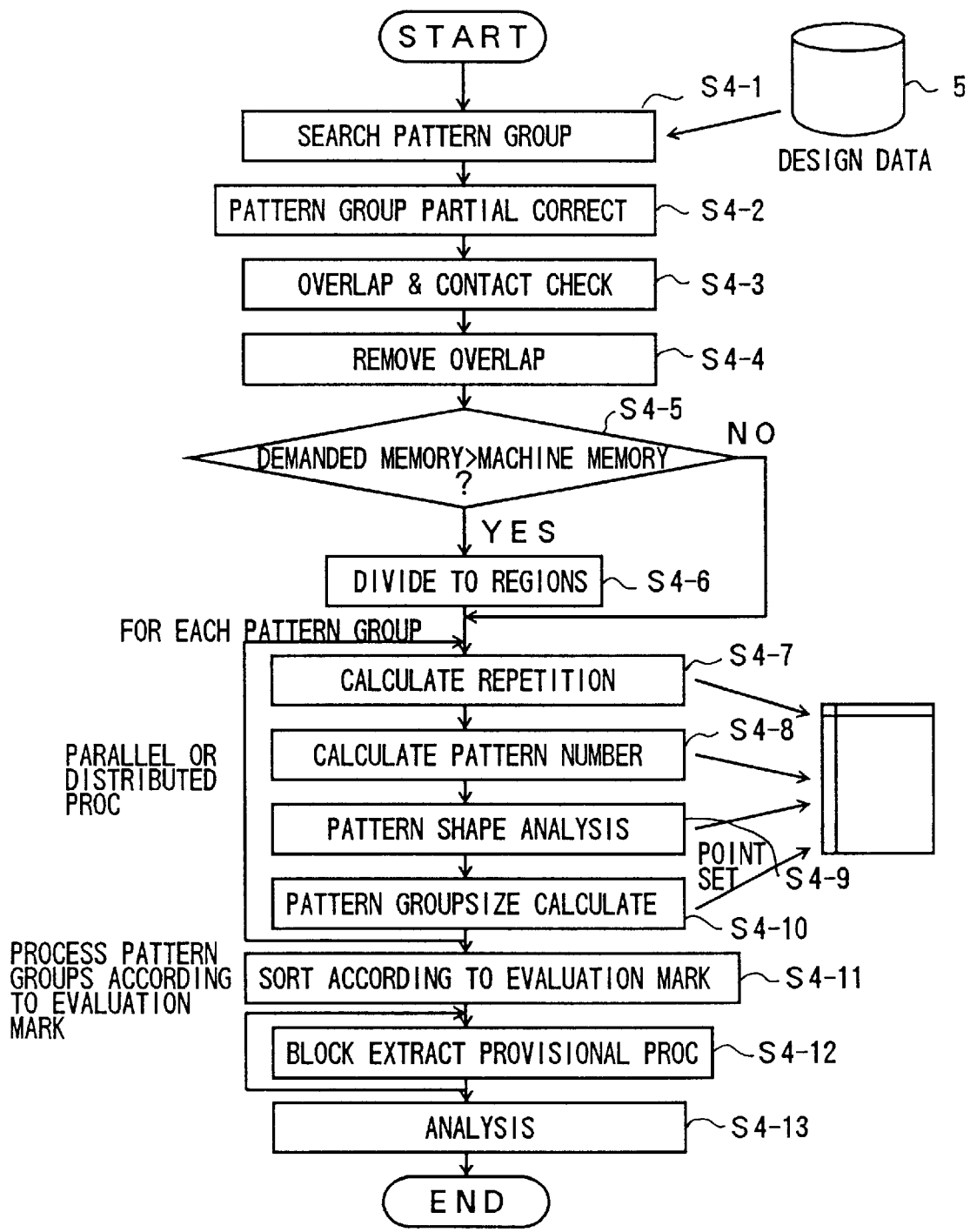
FIG. 12 is a flowchart showing a hierarchical analysis and optimization of hierarchical data according to the second embodiment.

FIG. 12 shows the flowchart of the hierarchical analysis and the hierarchical optimization process of the steps S3-3 and S3-4 of FIG. 11.

In an LSI such as a memory, the design data is arranged into a number of data blocks each corresponding to a unit of the LSI such as a circuit block or function. Thus, in the steps S4-1–S4-4, the structure in the design data format is analyzed for grouping and elimination of the pattern groups unnecessary for the exposure. In relation to the grouping, the design data may be divided or modified for eliminating overlapping of the pattern groups.

Thus, in the step S4-1, pattern groups are searched for in the design data acquired from the design data file 5, and the pattern groups thus searched in the step S4-1 are applied with a partial correction process in the step S4-2.

Next, overlapping or contact of the pattern groups is detected in the step S4-3 for the pattern groups subjected to the partial correction in the step S4-2.

Further, any overlapping of the pattern groups detected in the step S4-3 is eliminated in the step S4-4.

Next, in the step S4-5, the data size of the pattern groups is compared with the memory size of the computer used for processing the design data. When it is judged in the step S4-5 that the data size of the pattern groups is larger than the memory size of the computer, the pattern groups are divided into a plurality of regions in the step S4-6 and the process proceeds to the step of S4-7. When the data size of the pattern groups is smaller than the memory size of the computer, the process proceeds directly to the processing starting with the step S4-7.

Next, in the process starting with the step S4-7, an evaluation is made on the pattern groups, from which overlapping is removed in the step S4-4, about the validity of each pattern group by calculating an evaluation mark.

Thus, the number a indicative of repetition of the patterns in a pattern group and the number b of the patterns in a pattern group are calculated respectively in the steps S4-7 and S4-8, and the numbers a and b thus calculated are written into a pattern group information table used for storing information of each pattern group in the step S4-8.

Further, in the step S4-9, the exposure pattern of each pattern group is analyzed and an evaluation point indicative of the complexity of the pattern is written also into the pattern group information table. For example, the value of the evaluation point may be increased according to the order of: a polygon; a polygon having a 45° oblique edge; a polygon having an oblique edge other than 45°, and the like.

Further, the size of each pattern group is calculated in the step S4-10 and the size thus calculated is set in the pattern group information table. In the event the data size of the pattern group exceeds the memory size of the computer used for the processing in the steps S4-7–S4-10, a parallel, distributed processing function is conducted by calling the parallel distribution processing function 13. Thereby, a high-speed processing is maintained.

Next, in the step S4-11, the pattern group set in the pattern group information table created in the steps S4-7–S4-10 is evaluated for the evaluation mark, and sorting is made according to the evaluation mark in the step S4-11.

It should be noted that the information indicative of the area of the pattern obtained in the step S4-10 is extremely effective for data compression conducted based on the area of the exposure beam deflection, and thus, a high evaluation mark is given. Thereby, those patterns in which the area of the pattern is comparable to an integer multiple of the beam deflection rage at the time of exposure are given a particularly high evaluation mark. Further, those patterns in which the product a×b, a being the number of repetition of the patterns calculated in the step S4-7, b being the number of the patterns calculated in the step S4-8, is large are given a high evaluation mark, as such patterns appear frequently and are effective for compressing the overall number of the shots.

After the sorting of the pattern group information table in the step S4-11, the step S4-12 is conducted for provisionally extracting the blocks according to the order of the evaluation mark, and the result is evaluated in the step S4-13.

In the steps of S4-12 and S4-13, the number of the shots is simulated for each pattern group, and the result of the simulation is represented on the display device 3 in the order of the evaluation mark, such that the operator can decide what pattern groups are to be selected for the blocks on the block mask for minimizing the number of the exposure shots.

The list of the pattern groups thus selected in the step S4-13 is provided as the output of the step S3-5 of FIG. 11, and the list thus obtained is stored in the optimization data file 16 as the data completed with the optimization. Based on the optimization data file 16, the step of creating the exposure data in the step S2-2 is conducted as will be described below.

In the event the division of the pattern groups is not clearly made, or in the event the hierarchical structure is not clearly defined, the entire data is subjected to the block extraction process.

Hereinafter, the exposure data creation step S2-2 of the process of FIG. 10 will be described in detail with reference to FIG. 13.

Figure 13:
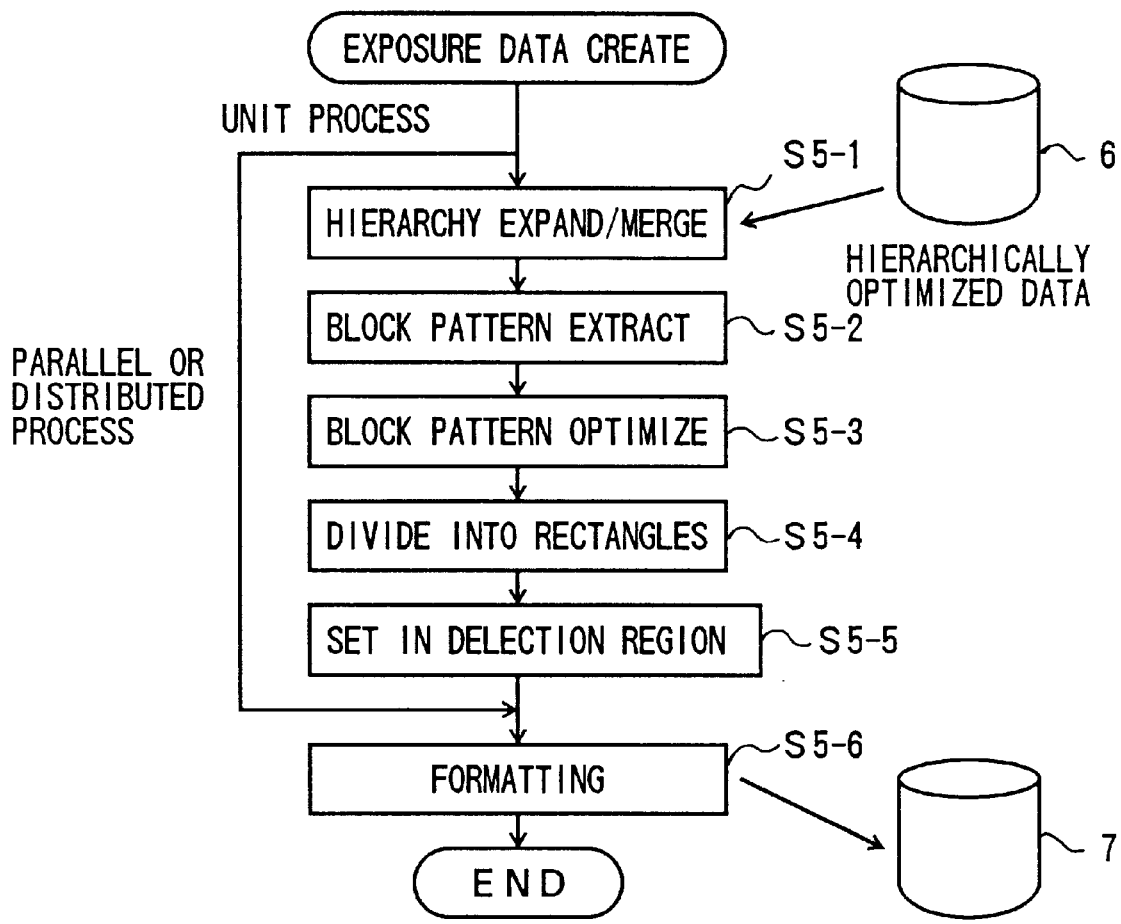
FIG. 13 is a flowchart showing a creation of exposure data according to the second embodiment.

FIG. 13 shows the flowchart of the exposure data creation step S2-2 according to an embodiment of the present invention.

Referring to FIG. 13, the process starts with the step S5-1 in which the design data optimized in the step S2-1 of FIG. 10 is expanded or merged for the desired layer level.

Next, in the step S5-2, the blocks corresponding to the block patterns are extracted from the optimized design data in the step S5-2 for each layer level.

After the block is extracted in the step S5-2, an optimization of the extracted block is conducted in the step S5-2 for efficient creation of an extracted block.

After the block is optimized in the step S5-3, each optimized block is divided into a plurality of rectangles in the step S5-4 corresponding to a pattern.

After the division into rectangles in the step S5-4, the rectangle thus obtained is set as the data of the desired deflection region in the step S5-5.

In the foregoing steps S5-1–S5-5, a parallel processing is conducted when the size of the data is too large.

Once the block and the rectangles are thus set in the step S5-5, the data of the block and the rectangles are formatted in conformity with the exposure data, and the data thus formatted is stored in the exposure data file 7 in the step S5-6 as the exposure data.

[THIRD EMBODIMENT]

Hereinafter, the block pattern extraction process corresponding to the step S5-2 of FIG. 13 will be described in detail as a third embodiment of the present invention, wherein it should be noted that the block pattern extraction process of the step S5-2 may be regarded as a pattern extraction process.

Figure 14:
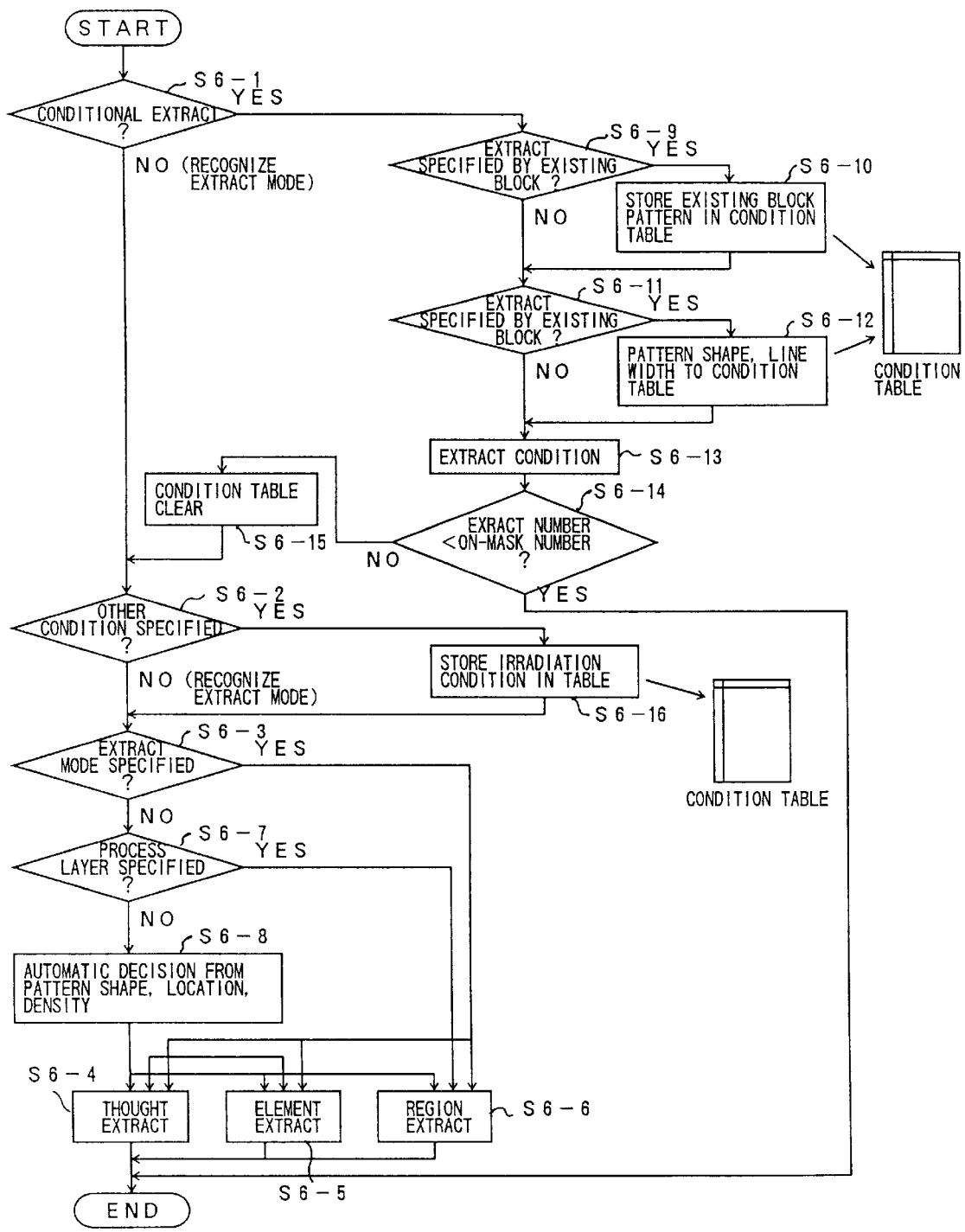
FIG. 14 is a flowchart showing a block pattern extraction according to a third embodiment of the present invention.

FIG. 14 shows the flowchart of the block pattern extraction process according to an embodiment of the present invention.

In the block pattern extraction process of the step S5-2, the extraction mode can be switched so that the extraction of the block pattern is achieved according to a condition optimized for the block pattern to be processed. On the other hand, it is also possible to carry out the extraction of the block pattern in correspondence to an existing block pattern, in the event there is no specification given for the extraction condition.

Thus, a discrimination is made in the steps S6-1 and S6-2 whether or not the a condition of extraction is specified. If no such an extraction condition is specified, a discrimination is made further in the step S6-3 whether or not there is a specification for the extraction mode.

If the result of the step S6-3 is YES and there is an extraction mode specified, a block extraction is conducted according to the specified mode in any of the steps S6-4–S6-6.

When there is no extraction mode specified in the step S6-3, a discrimination is made in the step S6-7 whether or not there is a specification for the layer to be processed. If there is such a specification, a block extraction is carried out for the specified layer by carrying out any of the steps S6-4–S6-6.

In the event there is no specification on the layer in the step S6-7, a discrimination is made next in the step S6-8 about the pattern size, location and density, and an optimum extraction process is automatically decided in the step S6-8. Thereby, any of the extraction processes of the steps S6-4–S6-6 is conducted.

In the event there is an extraction condition specified in the step S6-1, a discrimination is made in the step S6-9 as to whether or not the extraction should be made from an existing block. If an extraction from the existing block is specified in the extraction condition, the existing block pattern data is stored in the step S6-10 in a condition table. Further, the condition of the block patterns to be newly registered, including the block pattern shape or line width, is written into the condition table in the steps S6-11 and S6-12.

Once the condition table is setup in the steps S6-10 and S6-12, a block extraction is carried out in the step S6-13 according to the block pattern set in the condition table. Further, a comparison is made in the step S6-14 between the number of the extracted blocks and the maximum allowable number of the blocks that a block mask can carry.

Thus, in the event the number of the extracted blocks is smaller than the maximum allowable number of the blocks on the block mask in the step S6-14, this means that the block extraction has been achieved effectively by using the existing blocks only, and the block extraction process is terminated.

On the other hand, in the event the number of the extracted blocks exceeds the number of the allowable blocks in the step of S6-14, this means that the efficiency of the block extraction is poor, and the condition table is cleared in the step S6-15. In this case, the process returns to the step S6-2 for a different extraction condition, and a manual setup of the condition table is made in the step S6-16. Alternatively, the step S6-8 is conducted in which the block pattern extraction is made based on the automatic setup of the extraction condition.

Next, a description will be made on the step S6-6 of FIG. 14 for extracting a region with reference to FIGS. 15–20.

Figure 15:
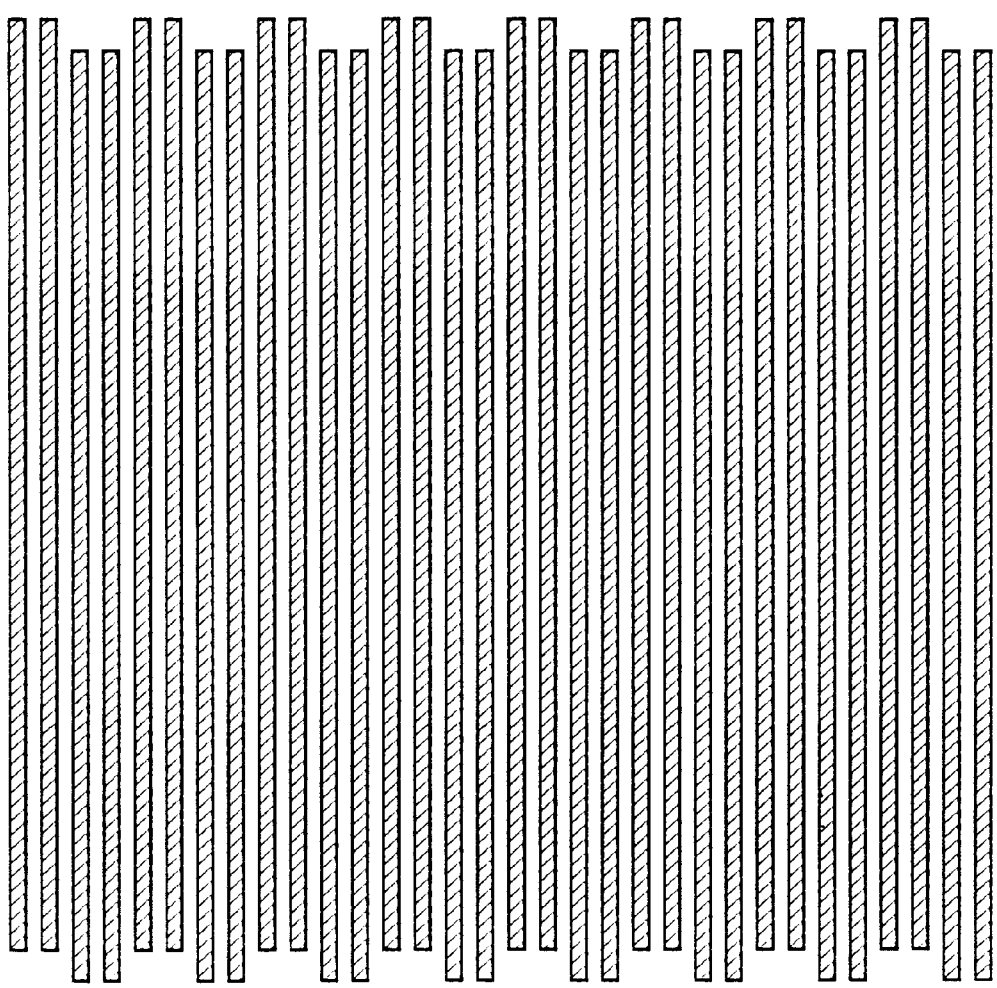
FIG. 15 is a diagram showing an example of the extracted region of the third embodiment.

FIG. 15 shows the exposure pattern from which a block pattern is to be extracted. As a result of the extracting process of region of the step S6-6, the exposure pattern of FIG. 15 is divided into sixteen blocks B1–B16 according to the frame shown in FIG. 16, wherein it should be noted that each block of FIG. 16 has a size of $X_1 \times Y_1$ or $X_1 \times Y_1$.

Figure 16:
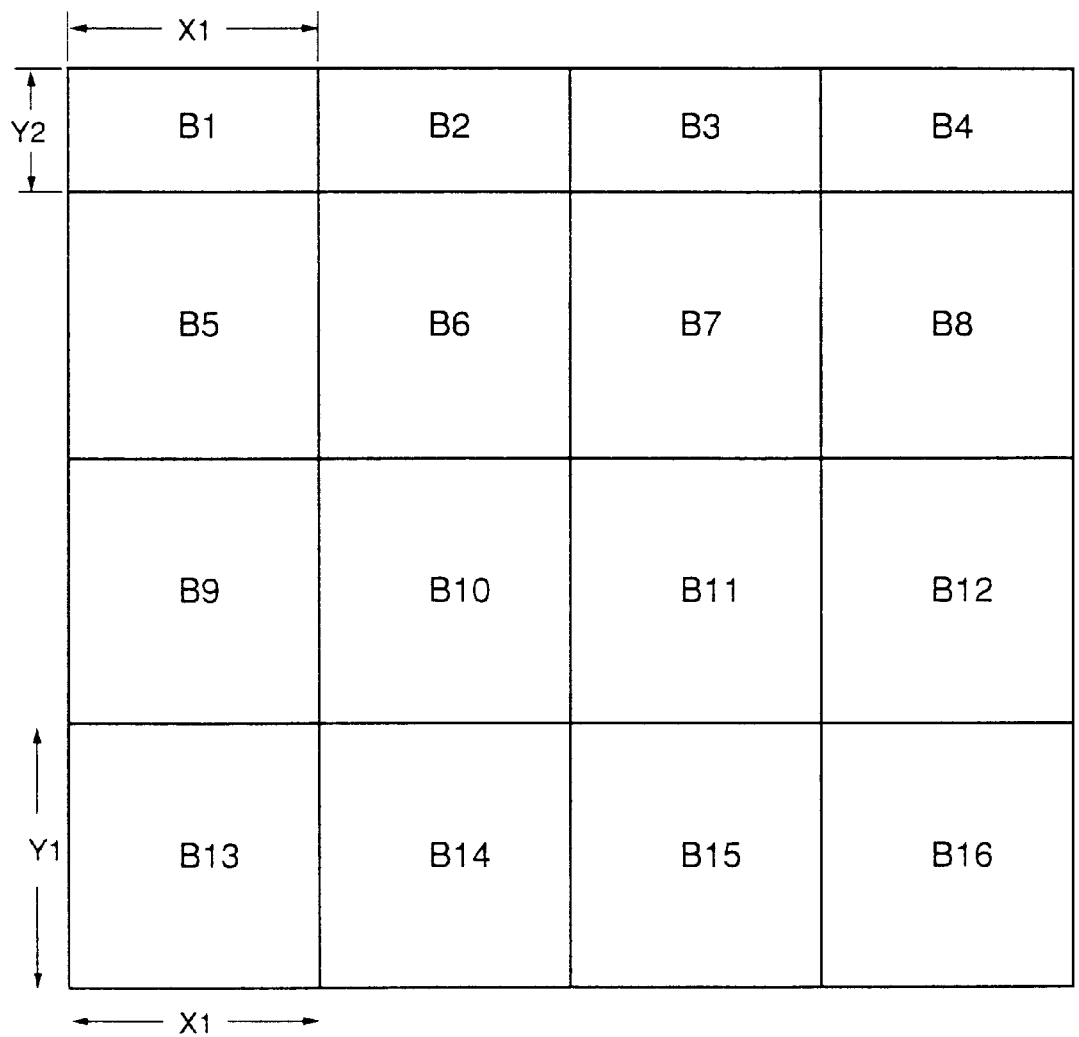
FIG. 16 is a diagram showing an extraction of region conducted in the third embodiment.
Figure 17:
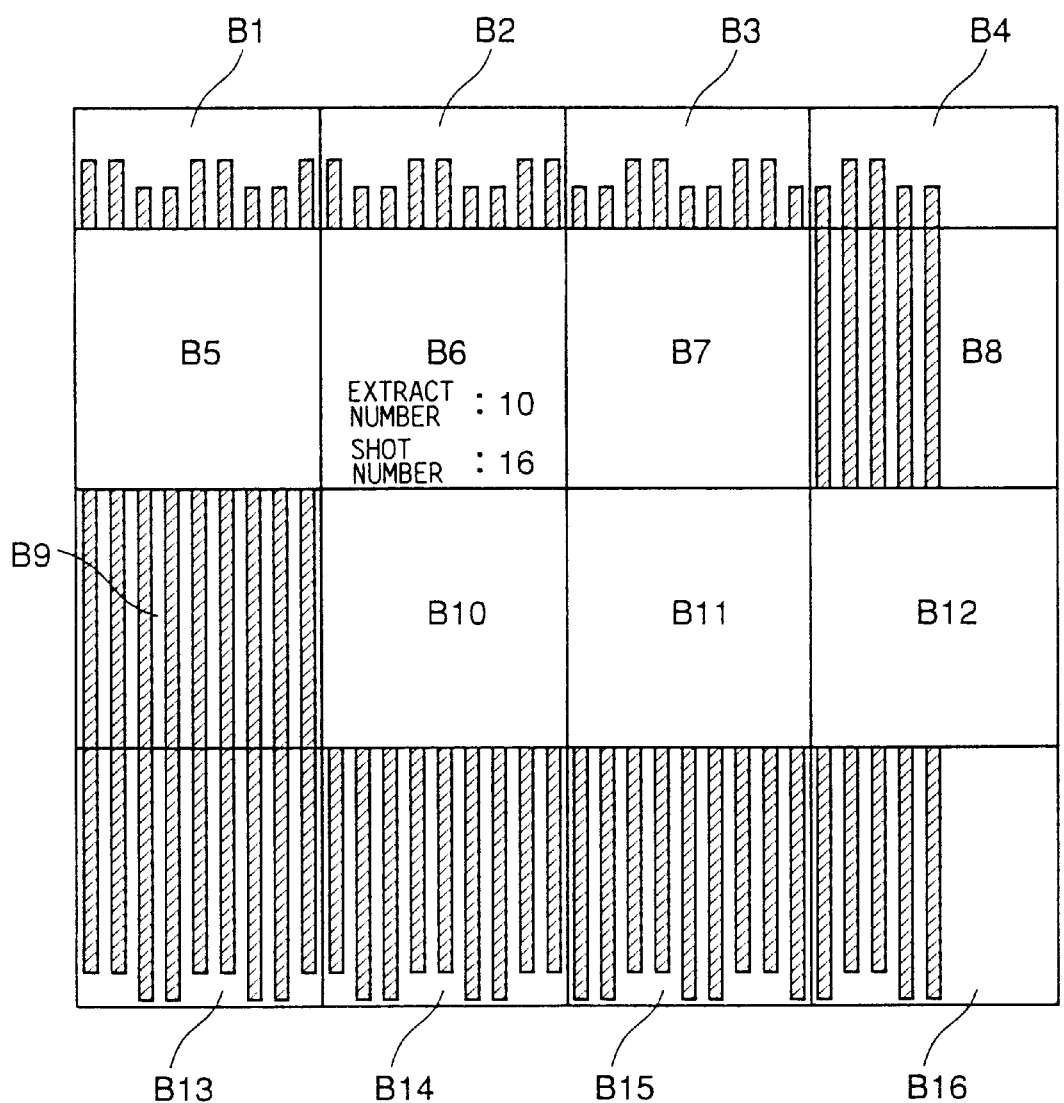
FIG. 17 is a further diagram showing the extraction of region in the third embodiment.

Thus, by dividing the exposure pattern of FIG. 15 by the frame of FIG. 16, the block patterns B1–B16 shown in FIG. 17 are obtained, wherein it should be noted that the block patterns B5–B7 and B9–B11 are actually formed of the same block pattern. Thus, the number of the blocks to be extracted is reduced from sixteen to ten.

Figure 18:
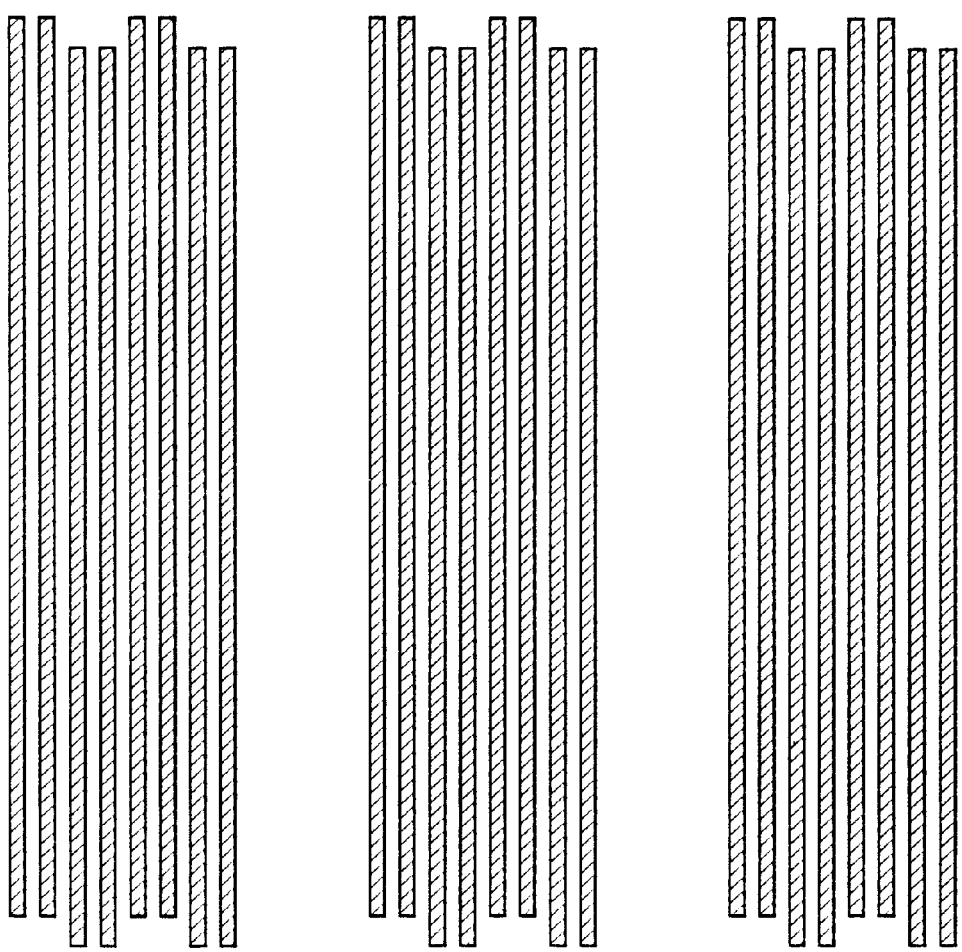
FIG. 18 is a further diagram showing the extraction of region in the third embodiment.
Figure 19:
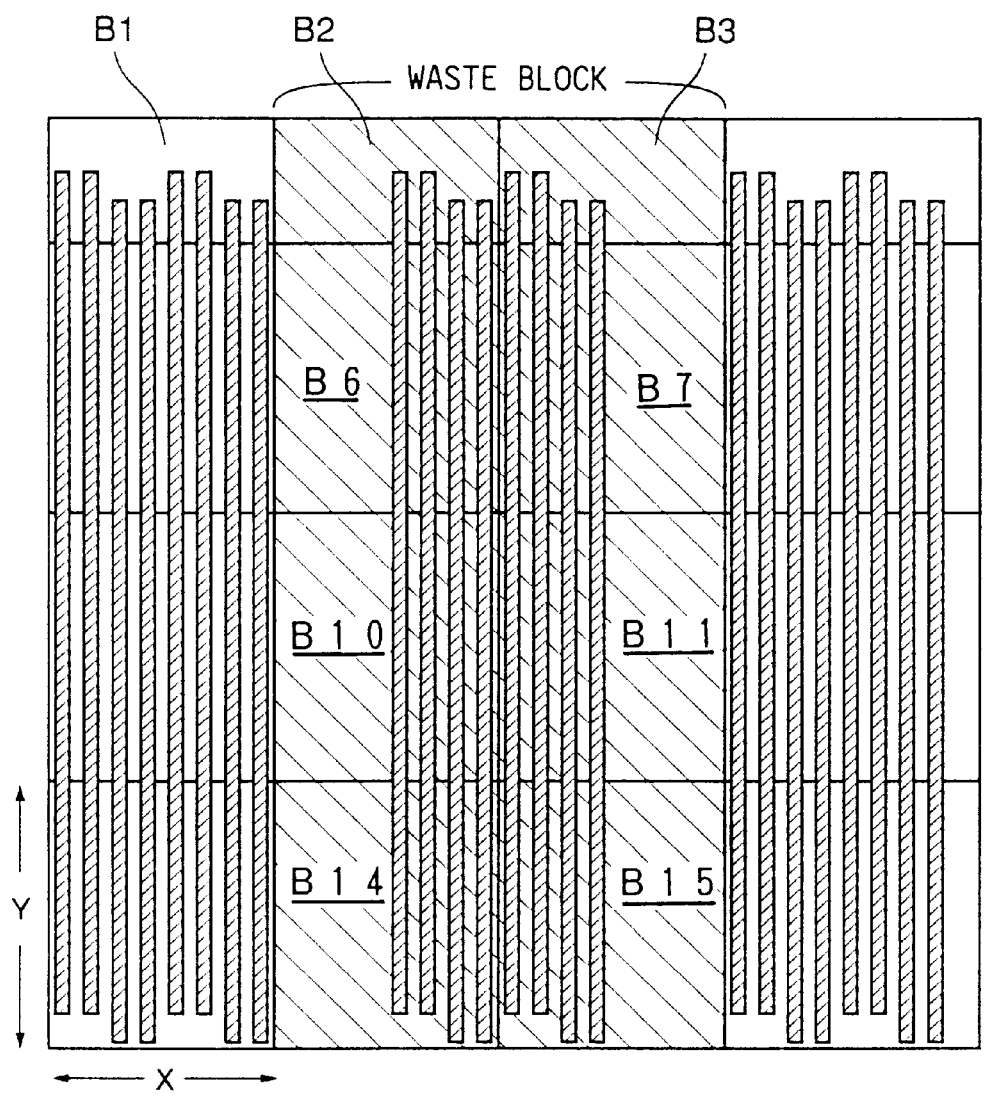
FIG. 19 is a further diagram showing the extraction of region in the third embodiment.

In such a division of the exposure pattern into block patterns, there can occur a case, when the patterns are repeated with intervening blank regions as indicated in FIG. 18, in which waste blocks are formed as indicated in FIG. 19. In FIG. 19, it should be noted that the waste blocks B2, B3, B6, B7, B10, B11 and B14 and B15 include blank area. When such waste block exists, the efficiency of shot: is reduced.

Thus, in order to avoid the foregoing problem of waste shot, the present embodiment carries out the division of the exposure pattern of FIG. 15 based on the rectangular frame that includes therein the blocks B1, B5, B9 and B13, such that the frame is moved, after the foregoing blocks B1, B5, B9 and B13 are defined, to a location as indicated in FIG. 20A in which the rectangular region thus defined excludes or skips the blank region and defines the blocks B2', B6', B10' and B14' or the blocks B4, B8, B12 and B16. In the blocks thus defined, the proportion of the blank region is eliminated or minimized.

According to the block extraction process of FIG. 20A, the exposure shot over the blank region is reduced and the efficiency of exposure is improved. In the regularly repeated pattern as indicated in FIG. 20A, the block patterns appearing as a result of the block extraction are limited to the pattern P3 of FIG. 20B corresponding to the block B13, B14' or B16, the pattern P2 indicated in FIG. 20C corresponding to the blocks B5, B6', B8, B9, B10' and B12, and the pattern P1 indicated in FIG. 20D corresponding to the blocks B1, B2' and B4.

[FOURTH EMBODIMENT]

Next, the process of the step S6-13 of FIG. 14 for extracting of a pattern according to a given condition will be described in detail as a fourth embodiment of the present invention. In the condition-extraction process of the step S6-13, it should be noted that a pattern satisfying a given condition is searched for from the input data by inputting the exposure data for creating block mask or by specifying the parameters such as line width, angle, shape, pattern group, and the like. Thereby a block pattern that can be used in the existing block mask is extracted.

Figure 21:
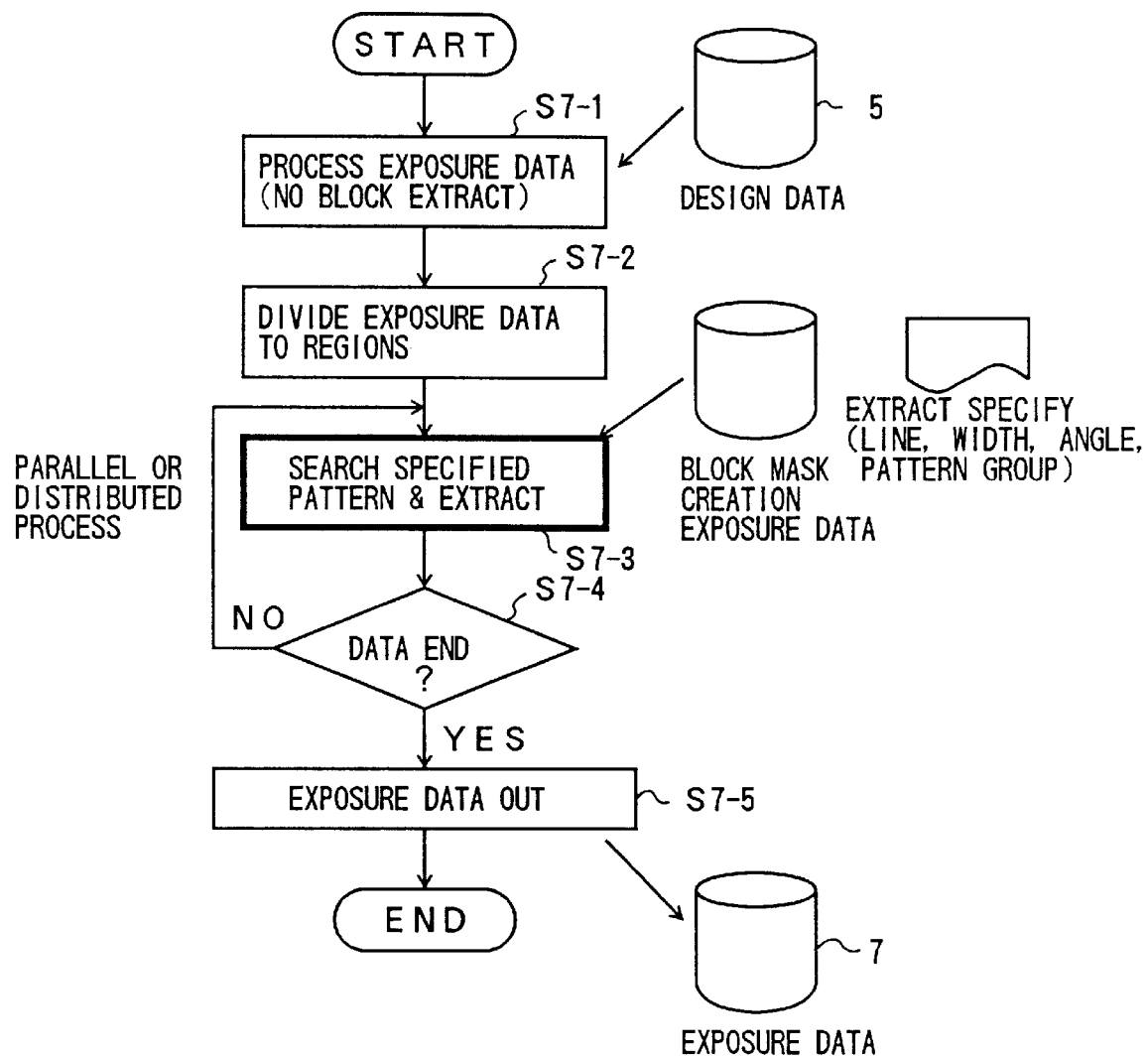
FIG. 21 is a flowchart showing an extraction of condition according to a fourth embodiment of the present invention.

FIG. 21 shows the flowchart of the condition-extraction process of the present embodiment.

Referring to FIG. 21, the optimized data is supplied from the optimized data file 6 in the step S7-1 and is divided into sub-regions in the step S7-2.

Next, in the step S7-3, the pattern corresponding to the pattern of the sub-region divided in the step S7-2 is searched from the existing block pattern data described in the condition table.

After it is confirmed that the extraction of the corresponding pattern is completed in the step S7-4, the extracted data is stored in the exposure data file 7 as exposure data.

According to the present embodiment, the process of newly creating a block mask is omitted by utilizing block pattern data of an existing block mask. Thereby, the process time of creating the exposure data is reduced substantially.

By selecting an appropriate extraction condition according to the layer of the exposure, it is possible to extract an optimum pattern according to the layer of the exposure.

By selecting an appropriate block extraction process according to the shape of the block, it is possible to extract an optimum pattern for the given block shape.

By selecting an appropriate block extraction process according to the density of the pattern, an effective pattern extraction is achieved.

By carrying out the pattern extraction process such that the proportion of the pattern takes a predetermined value, it is possible to carry out the pattern extraction uniformly over the blocks.

By controlling the extraction pattern according to the number of the blocks, it becomes possible to control the size and number of the patterns in the block as desired. By extracting the patterns according to the type of the patterns, it is possible to extract the patterns without overlapping.

By setting the region of the pattern according to the area of exposure beam irradiation, it is possible to extract the patterns with an optimum beam irradiation area.

In the event there are a large number of the blocks, the pattern searching process of the steps S7-3 and S7-4 is advantageously conducted by the using the parallel, distributed processing function 13 as will be noted later. By using such a parallel, distributed processing, it is possible to reduce the process time substantially.

[FIFTH EMBODIMENT]

When the block pattern mask is to be created newly, a block dropout elimination process and a proximity effect compensation process are carried out.

Hereinafter, the block dropout elimination process will be described according to a fifth embodiment of the present invention, wherein it should be noted that the block dropout elimination process is conducted when creating a block in which a part of the pattern drops out according to the nature of the pattern when no mechanical support is provided. An example of such a pattern is a ring-shaped pattern including a central, isolated pattern.

Figure 22:
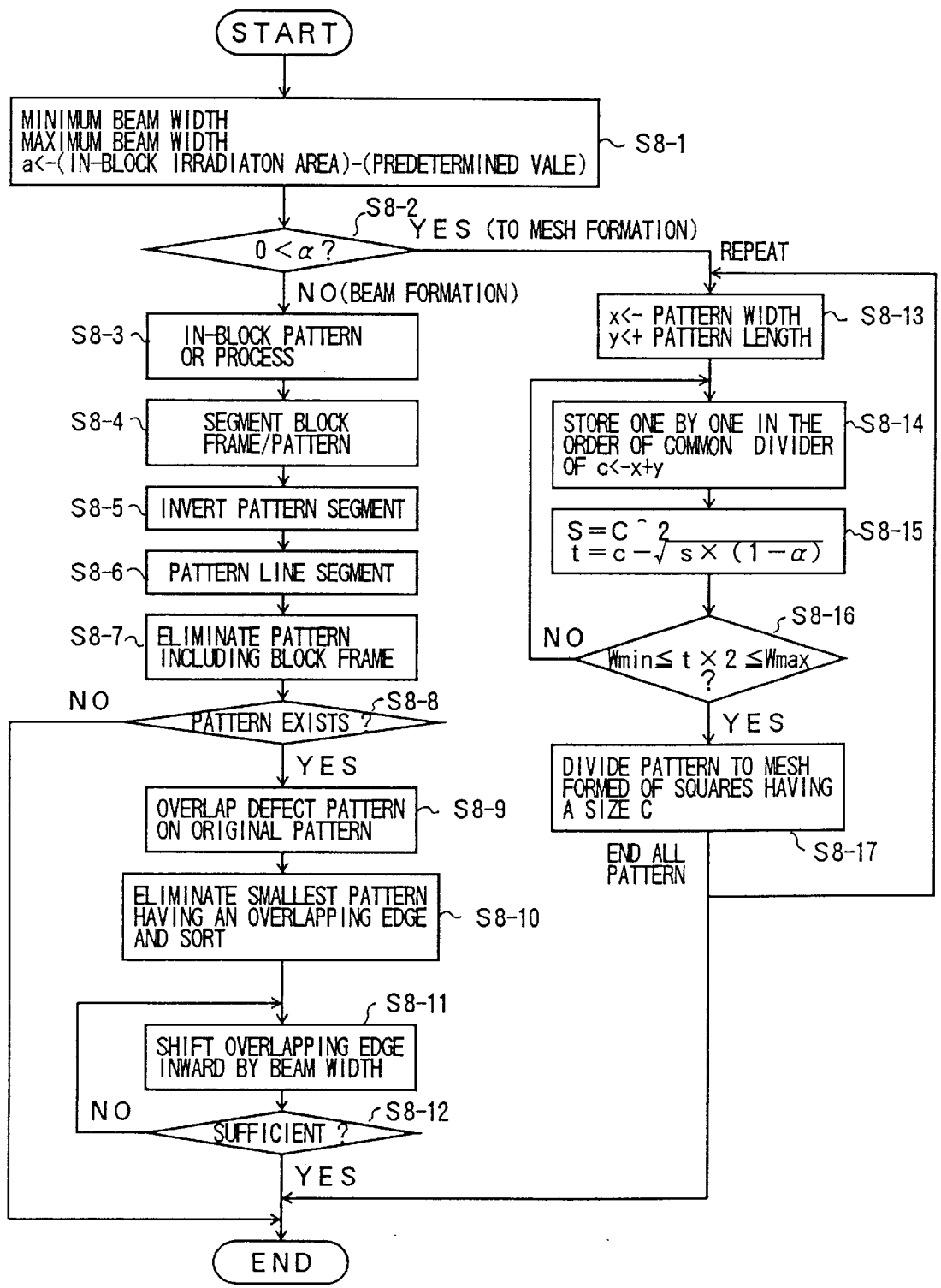
FIG. 22 is a flowchart showing a process for eliminating pattern drop out according to a fifth embodiment of the present invention.

FIG. 22 shows the flowchart of the block dropout elimination process, while FIGS. 23A–23D, FIG. 24A–24F and FIGS. 25A–25H show the examples of the process of FIG. 22. The block dropout elimination process starts with a recognition of the isolated pattern and eliminates the problem of the block dropout by forming minute supporting beams or by forming a mesh structure in the aperture pattern surrounding the isolated pattern.

Referring to FIG. 23A showing an ordinary block pattern A including parallel stripes, it should be noted that non-transparent stripe patterns extend parallel with each other and define therebetween strip-shaped apertures represented by hatching, wherein no problem of dropout of the stripe patterns occurs in the block pattern A of FIG. 23A as the stripe patterns are held by a frame of the block pattern.

In the case of the block pattern B shown in FIG. 23B, on the other hand, the central non-transparent pattern is surrounded by four rectangular apertures continuing with each other to form a continuous aperture, and thus, the central non-transparent pattern would fall inevitably, provided that no mechanical support is formed.

Thus, in the example of the block pattern C shown in FIG. 23C, the central non-transparent pattern is supported by a beam connecting to the frame of the block pattern and the fall of the central non-transparent pattern is provided successfully. In the example of the block pattern D shown in FIG. 23D, on the other hand, the central non-transparent pattern is supported by a mesh structure surrounding continuously around the central non-transparent pattern. In the construction of FIG. 23D, too, the central non-transparent pattern is prevented from falling, as the mesh pattern surrounding the central non-transparent pattern is connected to the frame of the block pattern D. In any of the patterns 20C and 20D, the electron beam incident to the aperture surrounding the central non-transparent pattern passes through the aperture, by causing a diffraction around the beam or mesh, provided that the diameter of the beam or mesh is sufficiently smaller than the wavelength of the electron beam used for the exposure.

Referring to the flowchart of FIG. 22, the process starts with the step S8-1 wherein a minimum value Wmin and a maximum value Wmax are evaluated for the diameter of the foregoing beam or mesh, based on the material of the mask or the wavelength of the electron beam. Further, a parameter $\alpha$, indicative of the exposure area of a given block subtracted with a predetermined value, is obtained in the step S8-1.

Next, in the step S8-2, a discrimination is made whether or not the parameter $\alpha$ obtained in the step S8-1 is equal to or larger than 0 for deciding whether the central non-transparent pattern should be supported by the beam structure of FIG. 23C or by the mesh structure of FIG. 23D.

When the parameter $\alpha$ is smaller than 0, in other words when the exposure area is smaller than the foregoing pre-determined value, the process proceeds to the step S8-3 wherein an OR operation is conducted by treating the transparent pattern as a logic value "1" and the non-transparent pattern as a logic value "0." When such an OR operation is applied to the block pattern of FIG. 24A, in which a transparent region is represented by hatching, a border between the transparent region corresponding to the exposure pattern and the opaque region on the mask is extracted as indicated in FIG. 24B.

Next, in the step S8-4, a segmentation process is applied to the border extracted in the step S8-3, wherein vector data as indicated in FIG. 24C is obtained as a result of the segmentation process of the step S8-4.

Next, in the step S8-5, the direction of the vector is inverted for those vectors surrounding the transparent pattern shown in FIG. 24A by hatching, such that the transparent pattern is surrounded continuously by a set of vectors each having an end point connecting to a start point of an adjacent vector.

Next, in the step S8-6, the vector pattern obtained in the step S8-5 is converted to a pattern indicated in FIG. 24E showing the outline of the non-transparent pattern, and the step S8-7 is conducted subsequently to eliminate the patterns contacting the frame of the block mask, to extract the isolated non-transparent pattern as indicated in FIG. 24F.

Next, in the step S8-8, the existence of such an isolated non-transparent pattern extracted in the step S8-7 is detected, and the step S8-9 is conducted subsequently, wherein the isolated non-transparent pattern of FIG. 24F is set to -the block pattern shown in FIG. 25A as a fixed pattern P0.

Next, in the step S8-10, the transparent patterns P1–P4 surrounding the fixed pattern P0 are sorted according to the order of the area, excluding the pattern P1 having the smallest area as indicated in FIG. 25B.

Next, in the step S8-11, the area of the sorted patterns P2–P4 is reduced slightly by shifting the edges of the patterns P2–P4 contacting the fixed pattern P0 by an amount corresponding to the width of the beam supporting the fixed pattern P0.

Finally, the foregoing width is optimized in the step S8-12 such that the pattern P0 is supported stably as indicated in FIG. 25C.

When the foregoing parameter $\alpha$ is larger than zero, in other words, when the irradiation area of the block is larger than the predetermined value, the dropout of the isolated non-transparent pattern P0 is prevented by supporting the pattern P0 by a mesh structure.

Thus, when it is judged in the step S8-2 that the parameter $\alpha$ is larger than zero, the step S8-13 is conducted in which the transparent patterns P1–P6 in the block pattern are detected and the width X and height Y are determined for each of the patterns P1–P6 as indicated in FIG. 25E.

Next, in the step S8-14, the patterns P1–P6 are sorted according to the order of the common divider c of the width X and the height Y. It should be noted that the common divider c thus obtained represents the edge length of the squares filling the given pattern which may be any of the patterns P1–P6.

Next, in the step S8-15, the area s of the square is obtained by squaring the edge length c and the width 2t of the mesh wire constituting the mesh structure is obtained according to the relationship $$2t = 2 \times \{c - \sqrt{(s \times (1-\alpha))}\}.$$

As indicated in FIG. 25G, the parameter "it" obtained by the foregoing equation represents the half width of the mesh supporting the isolated pattern P0 and is optimized in the step S8-16 such that the width of the mesh falls in a range between Wmin and Wmax as $$\text{Wmin} \leq 2t \leq \text{Wmax}$$

wherein Wmin represents the lower limit below which the suitable support of the isolated pattern PO is not achieved while Wmax represents the upper limit above which the transmission of the electron beam through the mesh is impaired.

Next, in the step S8-17, square aperture patterns are formed in correspondence to the squares S of FIG. 25E in the pattern under processing with the edge size set as c–2t as indicated in FIG. 25H. Further, the foregoing pressing of the steps S8-13–8-17 is repeated for each of the patterns P1–P6, and the mesh structure shown in FIG. 25I is obtained.

According to the foregoing embodiment of the present invention, it is possible to form a block mask carrying an isolated non-transparent pattern such that the isolated non-transparent pattern is surrounded by a transparent pattern. By forming the mesh structure for supporting the isolated pattern, a uniform transmission of the electron beam through the aperture of the block mask is obtained.

[SIXTH EMBODIMENT]

In the block exposure process, it is necessary to form the block mask such that the exposure conducted on the semiconductor wafer by using the block mask is substantially free from proximity effect.

Figure 26:
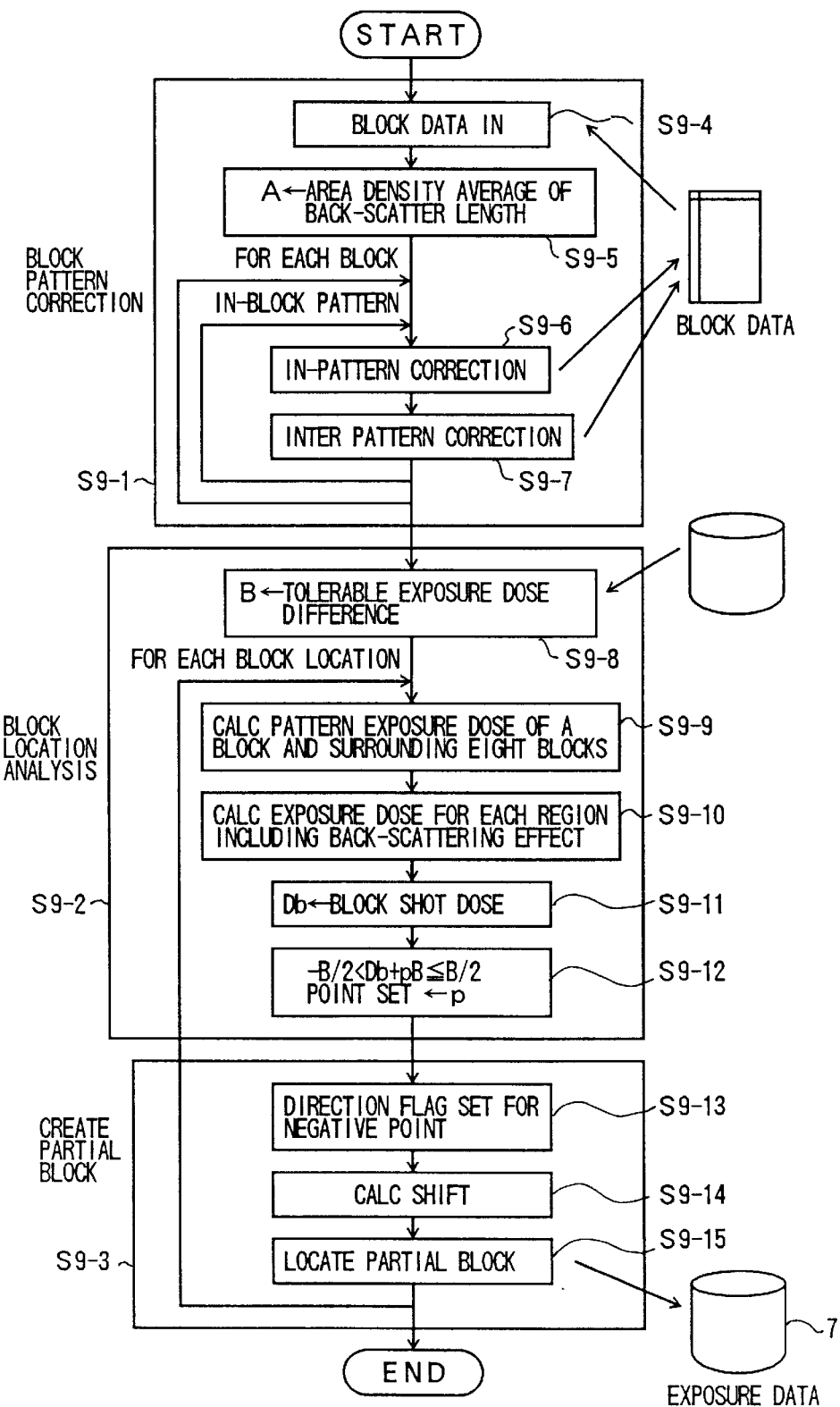
FIG. 26 is a flowchart showing a proximity compensation process according to a sixth embodiment of the present invention.

FIG. 26 shows the flowchart used for creating the block pattern suitable for compensating for the proximity effect according to a sixth embodiment of the present invention. Further, FIGS. 27A–27C, FIGS. 28A–28E, FIGS. 29A–29C, FIGS. 30A–30B, FIG. 31, FIGS. 32A–32C and FIGS. 33A–33B show the proximity compensation achieved by the process of FIG. 26.

Referring to FIG. 26, the process of the block pattern creation generally includes the step S9-1 for block pattern correction, the step S9-2 for analysis of the periphery of the exposure pattern, and the step S9-3 for partial block creation.

The pattern correction step S9-1 starts with the step S9-4 in which the block data is inputted for a selected block B0 and the step S9-5 is carried out subsequently for obtaining an area density average A of back-scattering which the bock B0 experiences based on the scatter length of the electrons, wherein the area density average A is calculated based on the beam condition such as the electron beam wavelength as well as the beam dose used for exposing the adjacent blocks B1–B8 surrounding the selected block B0.

Next, in the step S9-5, an in-pattern correction or inter-pattern correction is conducted based on the foregoing area density average A. In the example of FIG. 28A in which the pattern P1 is provided adjacent to the patterns P2–P5, the inner edges of the patterns P2–P5 facing the pattern P1 are slightly receded as indicated in FIG. 28B or FIG. 28C, such that the unexposed region to be formed between the pattern P1 and the adjacent patterns P2–P6 is not exposed by the back-scattered electrons. The pattern correction of FIG. 28B is called in-pattern correction.

On the other hand, FIG. 28D shows an example of the inter-pattern correction conducted in the step S9-7 in which the pattern P1 is narrowed slightly in correspondence to the part facing the patterns P2–P6 to form a pattern 25E, such that the gap between the pattern P1 and the patterns P2–P6 remain unexposed.

After the foregoing step S9-1, the analysis of the peripheral region is conducted in the step S9-2, wherein allowable difference in the exposure dose is read out from the exposure data and the exposure dose thus read out is set in a parameter B.

Next, in the step S9-9, a pattern exposure dose of the block B0 as well as a pattern exposure dose of the blocks B1–B8 surrounding the block B0 are calculated from the exposure data. Further, the effect of the back-scattering of electrons is added to the pattern exposure dose of the blocks B0–B8 in the step S9-10.

Next, in the step S9-11, a block shot exposure dose Db is calculated from the pattern exposure dose obtained in the step S9-10, and a correction point value p for correcting the block shot exposure data Db of the step S9-11 is obtained in the step S9-12 from a point table.

FIG. 27C shows the point table of the correction point p.

Referring to FIG. 27C, a correction point p of –2 is set when the block shot exposure dose Db satisfies the relationship $$(-B/2)<(Db-2B) \leq (B/2).$$

When the block shot exposure dose Db satisfies the relationship $$(-B/2)<(Db-1B) \leq (B/2),$$

a value of –1 is set to the point p.

When the block shot exposure dose Db satisfies the relationship $$(-B/2)<(Db) \leq (B/2),$$

a value of 0 is set to the point p.

Generally, a value p is set to the point p when the block shot exposure dose Db satisfies the relationship $$(-B/2)<(Db+pB) \leq (B/2).$$

According to the foregoing procedure of the step S9-12, the point value p is set for each of the blocks in the vicinity of the selected block and the peripheral analysis step S9-2 is completed.

Next, the partial block creation process of the step S9-3 will be described.

In the partial block creation process, the process starts by selecting a block from the blocks B0–B8 that has a negative value for the point p.

In the example of a pattern shown in FIG. 29A, it should be noted that the pattern of FIG. 29A can be created by repeating the pattern P shown in FIG. 29B a plurality of times, as indicated in FIG. 29C. In such a pattern of FIG. 29A, it should be noted that the effect of back-scattering of the electrons is different in the central region A shown in FIG. 30A and in the marginal regions B–I. This effect of the back-scattering can be evaluated from the correction point p obtained in the step S9-2.

Figures 30A, 30B:
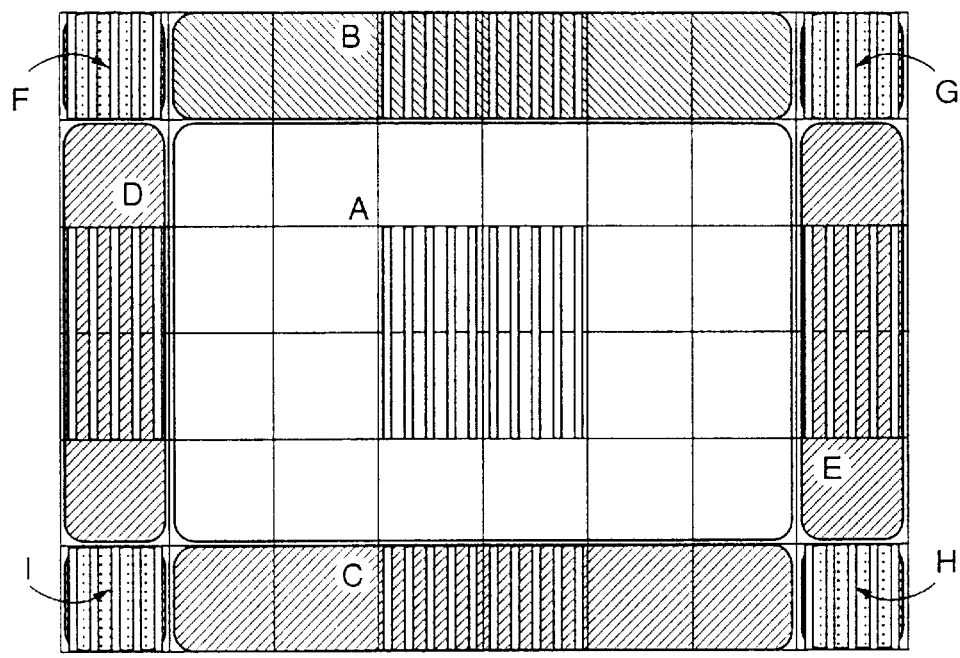
FIGS. 30A–30B are further diagrams showing the process of the proximity effect compensation of the sixth embodiment.

In the region A of FIG. 30A, the effect of the back-scattering from the surrounding regions B–I is more or less averaged as indicated in FIG. 30B by "X." In the region B of FIG. 30A, on the other hand, the effect of the back-scattering from the patterns located in the upward direction in the illustration is reduced, as indicated in FIG. 30B by the up-pointing arrows. Similarly, the effect of back-scattering from the patterns in the lower direction in the illustration of FIG. 30B is reduced in the region C as indicated by the down-pointing arrows.

In the region D shown in FIG. 30A, it should be noted that the effect of back-scattering from the left side is reduced as indicated in FIG. 30B by the left-pointing arrows. In the region E of FIG. 30A, on the other hand, it should be noted that the effect of the back-scattering from the right side is reduced as indicated in FIG. 30B by the right-pointing arrows. In the region F of FIG. 30A, it should be noted that the effect of the back-scattering from the upper-left side is reduced as indicated in FIG. 30B by the arrow pointing in the upper-left direction. In the region G of FIG. 30A, it should be noted that the effect of the back-scattering from the upper-right side is reduced as indicated in FIG. 30B by the arrow pointing in the upper-right direction. In the region H of FIG. 30A, it should be noted that the effect of the back-scattering from the lower-right side is reduced as indicated in FIG. 30B by the arrow pointing in the lower-right direction. In the region I of FIG. 30A, it should be noted that the effect of the back-scattering from the lower-left side is reduced as indicated in FIG. 30B by the arrow pointing in the lower-left direction.

Thus, the exposure dose is generally reduced at the marginal part of a pattern as compared with the central part, due to the reduced back-scattering effect.

Such a problem of non-uniform exposure dose may be eliminated by changing the pattern in correspondence to the marginal part or by repeating the exposure in correspondence to the marginal part of the pattern.

Figure 33A:
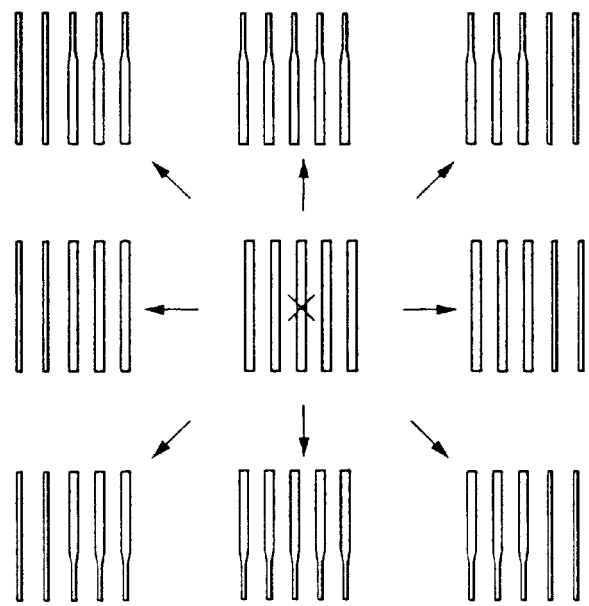
FIGS. 33A and 33B are further diagrams showing the process of the proximity effect compensation of the sixth embodiment.

In the example of FIG. 33A, for example, it is possible to eliminate the decrease of the exposure dose in the marginal part of the pattern, by exposing the marginal part twice while displacing the beam in any of the X1-, X2-, Y1- and Y2-directions.

In the ordinary shot of a pattern, a rectangular beam BM shown in FIG. 32A shaped by the first mask M1 is projected to the second mask M2 so as to cover the entirety of the mask M2, wherein the beam BM is patterned as it passes through the mask M2 and the patterned beam is projected on the wafer.

Figure 31:
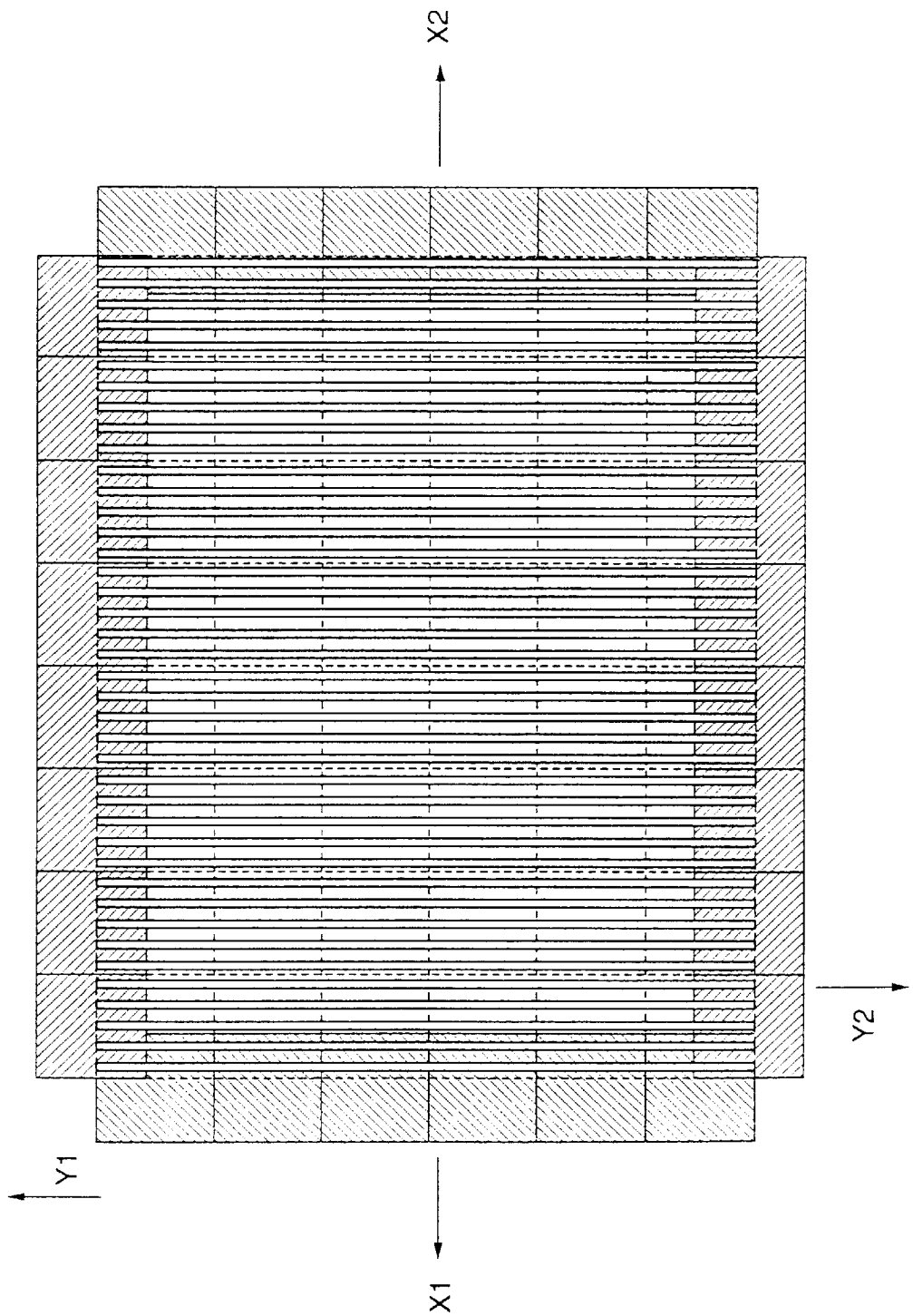
FIG. 31 is a further diagram showing the process of the proximity effect compensation of the sixth embodiment.

When conducting the exposure of FIG. 31, on the other hand, the beam BM is directed such that the beam BM hits only a part of the second mask M2 as indicated in FIG. 32B. In more detail, the beam BM may be displaced on the mask M2 in the X1-direction, Y1-direction, X2-direction or Y2-direction in the second time exposure, as indicated in FIG. 32C.

Figure 33B:
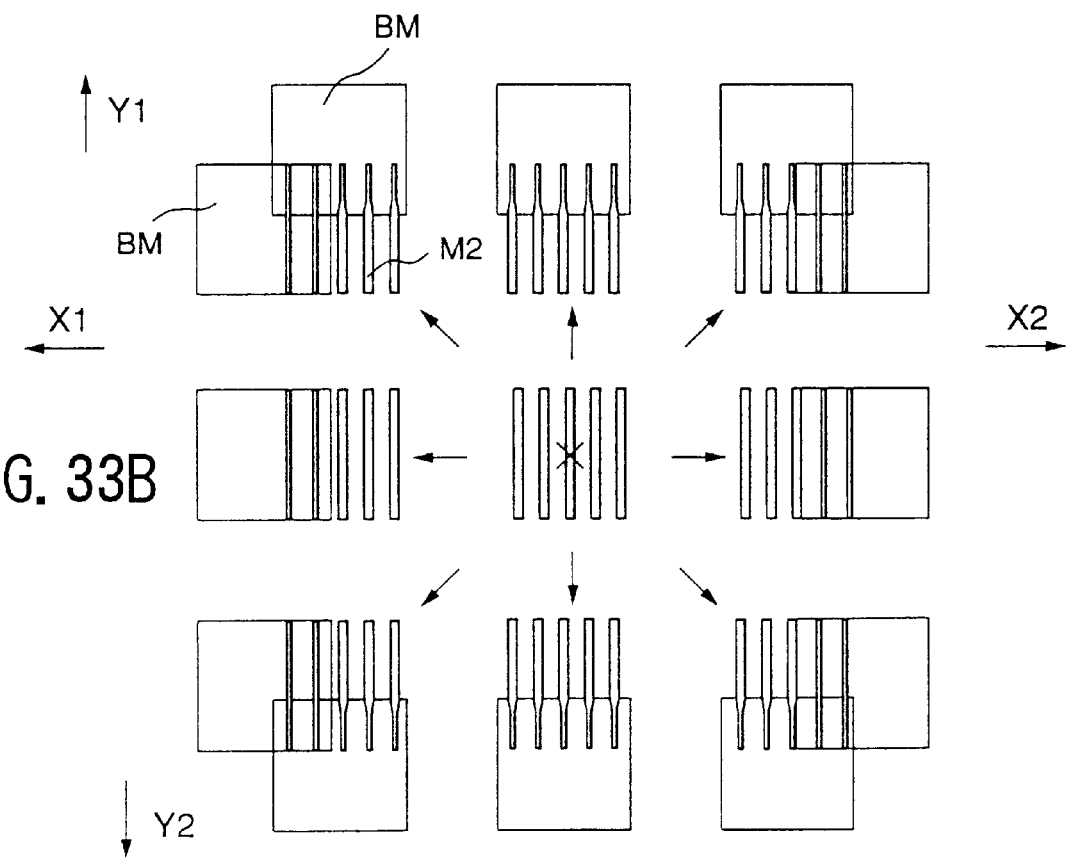

It should be noted that the foregoing proximity effect compensation is particularly effective when the exposure patterns tend to become thin in the marginal part of the block as in the exposure pattern of FIG. 33A. It should be noted that the thinned stripe pattern, formed at the marginal part of the block of FIG. 33A as a result of the proximity effect, may not be exposed sufficiently. This problem of insufficient or unreliable exposure of the marginal part of the block is effectively compensated for, by conducting the exposure twice as indicated in FIG. 33B, by displacing the electron beam BM in the second time exposure. It should be noted that the foregoing compensation of the proximity effect is achieved without increasing the number of the mask process.

[SEVENTH EMBODIMENT]

Next, the analysis of the exposure data conducted in the process S2-3 of FIG. 10 will be described according to a seventh embodiment of the present invention.

Figure 34:
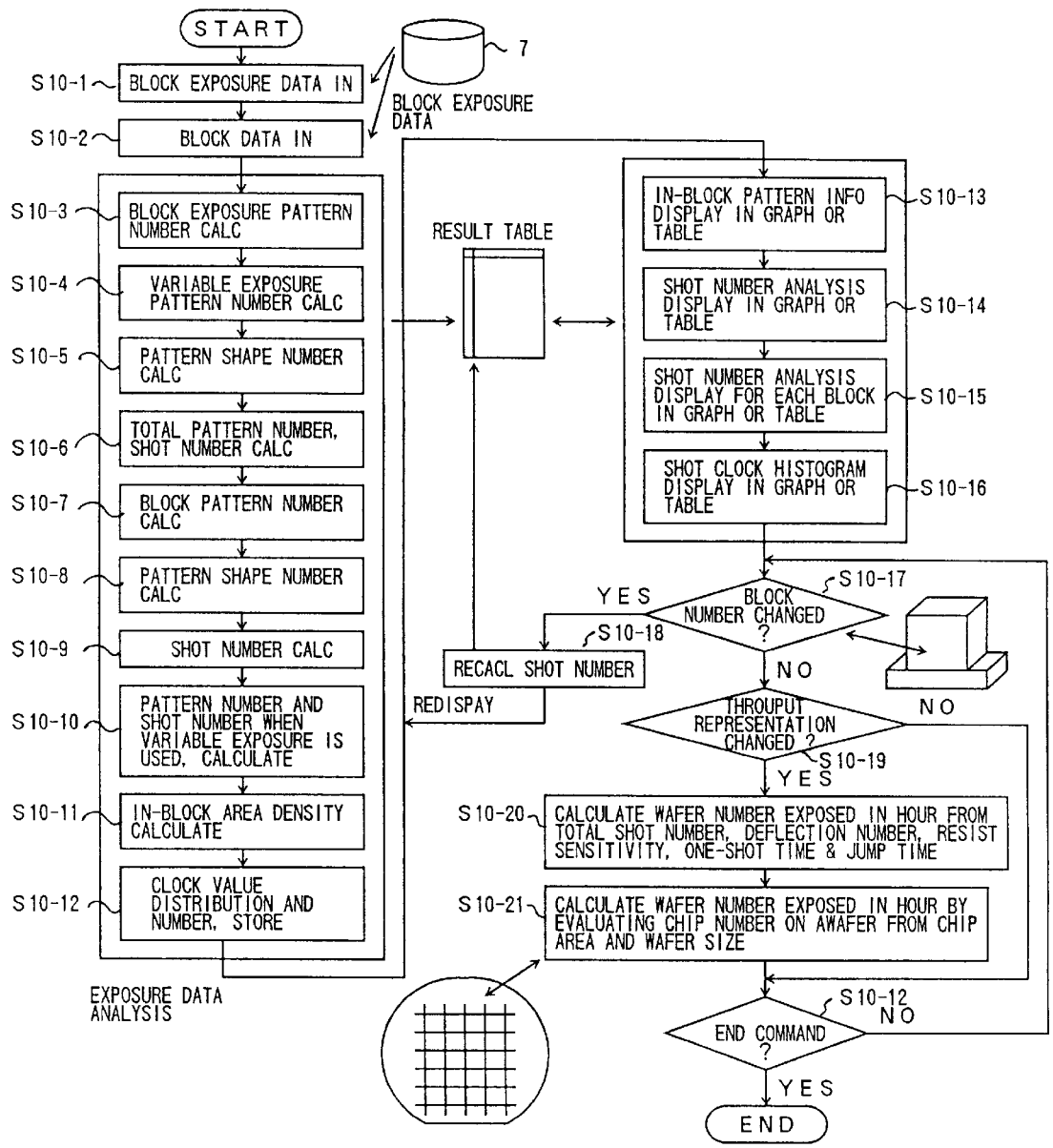
FIG. 34 is a flowchart showing the exposure data analysis according to a seventh embodiment of the present invention.

FIG. 34 shows the flowchart of the analysis process of the exposure data of the present embodiment wherein it should be noted that the analysis process reads out the exposure data created in the aforementioned exposure data creation process and stored in the exposure data file 7 and carries out various simulation or analysis. Further, the analysis process of the present embodiment represents the result of the analysis in the form easy for recognition.

Referring to FIG. 34, the analysis process starts with the step S10-1 wherein the block exposure data filed in the exposure data file 7 is acquired, and the step S10-2 is conducted subsequently wherein the block data in the exposure data file 7 is also acquired.

Next, in the step S10-3, the block exposure data acquired in the step S10-1 are counted and the number of the block exposure data thus obtained is stored in the step S10-3 in a result table used for storing the result of the analysis.

Next, in the step S10-4, the number of the variable exposure patterns are calculated from the number of the block exposure data acquired in the step S10-1 and from the number of the block data acquired in the step S10-2, and the result is stored in the foregoing result table.

Next, in the step S10-5, the number of the patterns is counted by counting the block exposure data according to the type of the patterns, and the result is stored in the result table.

Next, in the step S10-6, the total number of the patterns and the total number of the shots are calculated from the number of the block data acquired in the step S10-2 and the result is stored in the result table. Further, in the step S10-7, the number of the block patterns is calculated from the block exposure data acquired in the step S10-1 and the result is stored in the result table.

Next, in the step S10-8, the number of the block patterns are calculated from the block data acquired in the step S10-2 according to the shape of the block, and the number of the shots is calculated in the step S10-9 for each block shape.

Next, in the step S10-10, the number of the patterns and the number of the shots for a variable beam exposure process that uses the block exposure pattern for the variable beam exposure, are calculated, and an in-block area density is calculated form the block exposure data in the step S10-11, wherein the result of the in-block area density is stored in the result table. Further, the clock distribution and the number of the shots are stored in the result table in the step S10-12.

With the step S10-12, the analysis of the exposure data is completed and the result of the analysis is stored in the foregoing result table. The content of the result table is then represented on the display screen in the form of table or graph in the steps S10-13–S10-16, wherein the step S10-13 represents in-block pattern information in the form of table or graph, while the step S10-14 represents the result of analysis of the overall number of the shots, also in the form of table or graph. Further, the step S10-15 represents a shot clock histogram.

FIG. 35 shows an example of the in-block pattern information.

Referring to FIG. 35, the in-block pattern information includes a graphical representation of information items such as pattern type, pattern location, pattern size, and the like. Further, it should be noted that the in-block pattern information of FIG. 35 includes a variable representation of clock code and dose respectively represented as "Changed Clock Code" and "Changed Dose Value."

In the case the represented in-block pattern information of FIG. 35 is not a satisfactory one, the simulation and the analysis are conducted again while setting a new value for the clock code or for the dose. Thus, by changing the value for the "Changed Clock Code" and for the "Changed Dose Value," the exposure condition that provides the desired result is obtained. In such a process, the result of the exposure is confirmed visually in the form of table or graph. Further, the setting of the exposure condition is achieved easily by setting the numerical values.

FIG. 36 shows an example of the pattern information represented for each block pattern.

Referring to FIG. 36, the pattern information represents the proportion of the in-block patterns for each of the patterns in the form of graph. Thus, the operator can intuitively recognize the proportion of the patterns used in each block.

Figure 37:
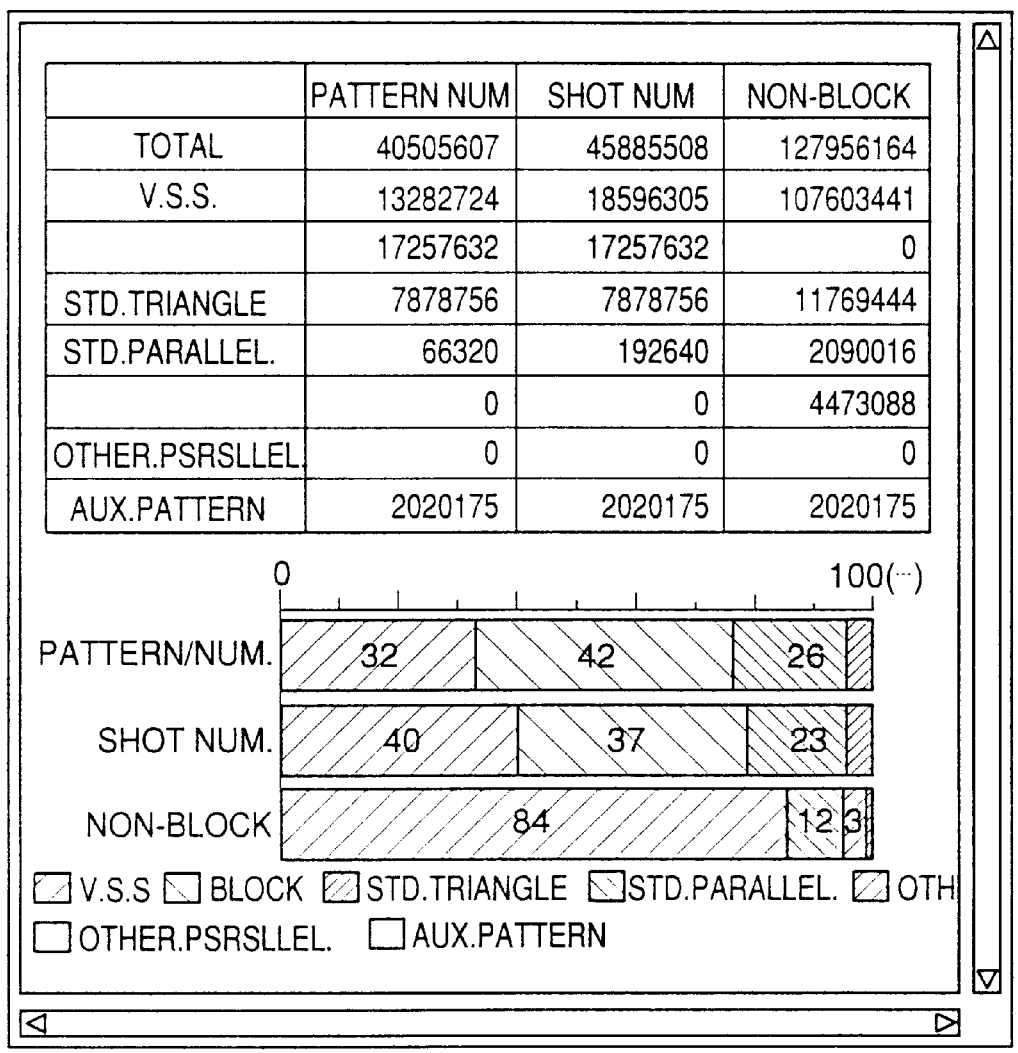
FIG. 37 is a diagram showing an example of representation of a shot number analysis carried out in the seventh embodiment.

FIG. 37 shows an example of the result of the analysis on the number of the shots.

Referring to FIG. 37, it can be seen that FIG. 37 represents the total number of the shots and the used patterns in the form of table and the proportion of the used patterns is represented in the form of graph. Thus, FIG. 37 provides an easy recognition of the status of the shots.

FIG. 38 shows an example of the result of the shot number analysis conducted for each block.

Referring to FIG. 38, it will be noted that each shot is given a numeral and the location of each block is represented according to the foregoing numeral. Further, the number of the shots is represented graphically for each numeral. Thus, the representation of FIG. 38 provides an easy and intuitive recognition of the block location and the number of the shots.

Figure 39:
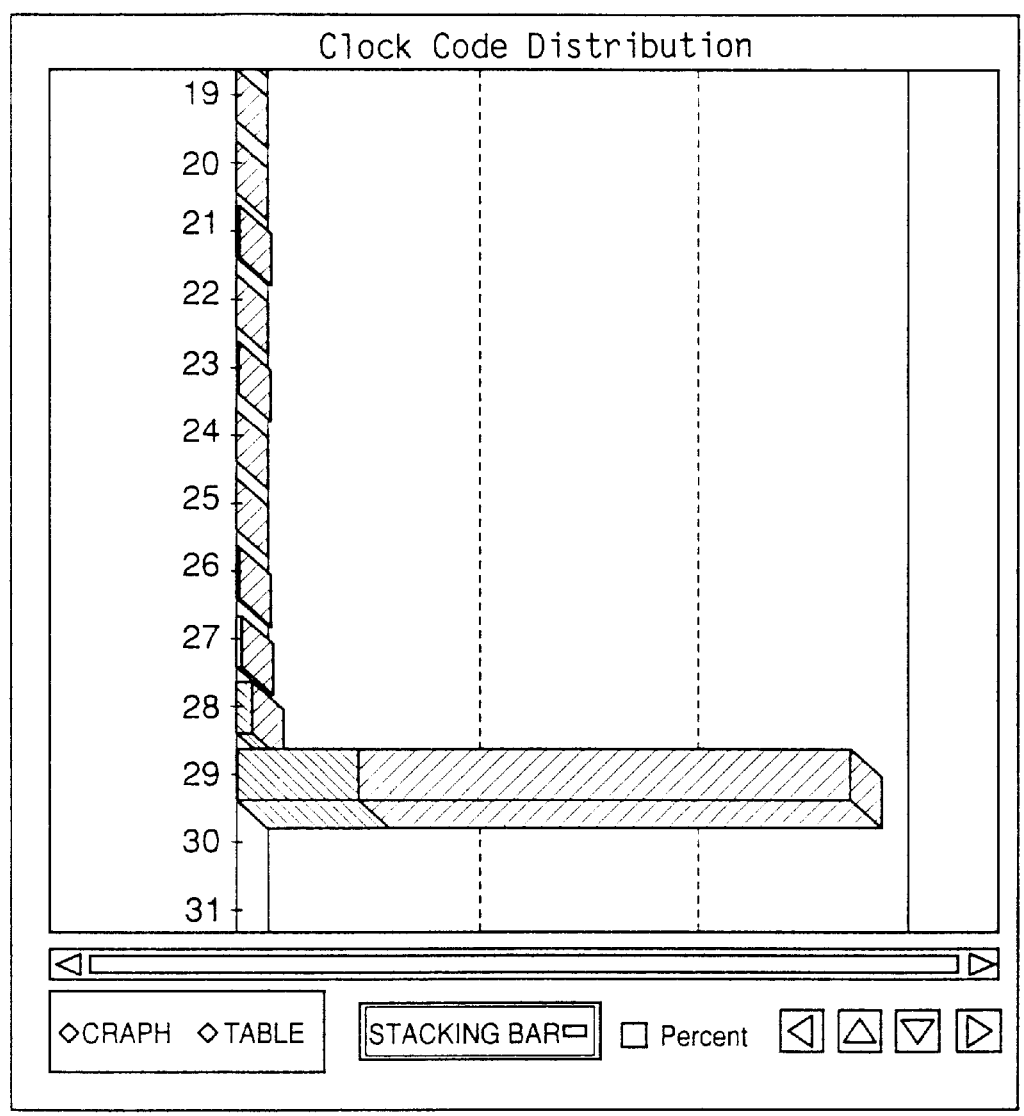
FIG. 39 is a diagram showing an example of a shot clock histogram of the seventh embodiment.

FIG. 39 shows an example of the shot clock histogram of the step S10-16.

Referring to FIG. 39, the shot clock histogram represents the histogram of the clock code in the form of a graph. It is of course possible to switch the representation in the form of table. For example, such a switching is made by clicking a button in represented in the table. The representation of FIG. 39 facilitates the recognition of the shot clock histogram.

Thus, by representing the result of the analysis, it becomes possible to recognize the exposure state easily.

Further, it should be noted that the exposure data creation apparatus 1 of the present embodiment is not only capable of graphical representation of the analysis result but also the created exposure data.

Returning back to the flowchart of FIG. 34, the step S10-17 follows the foregoing steps S10-13–S10-16 wherein a discrimination is made about whether or not there is an instruction for changing the number of the blocks, and a recalculation according to the steps S10-3–S10-12 is conducted in the step S10-18, depending on the number of the blocks thus instructed. The result is then represented similarly to FIGS. 35–39. Thereby, the result of analysis is obtained immediately.

When there is an instruction to calculate the throughput in the next step S10-19, a single chip exposure time is calculated in the step S10-20 based on the total number of the shots, the number of deflections, the resist sensitivity, single shot direction, jump direction, and the like.

Next, in the step S10-21, the number of the chips that can be formed on a wafer is calculated, and based on the result thus obtained, the number of the wafers exposed per hour, in other words the throughput of the exposure, is calculated. The result of the analysis is maintained on the display device until a log-off command comes in the step S10-21.

[EIGHTH EMBODIMENT]

Figure 40:
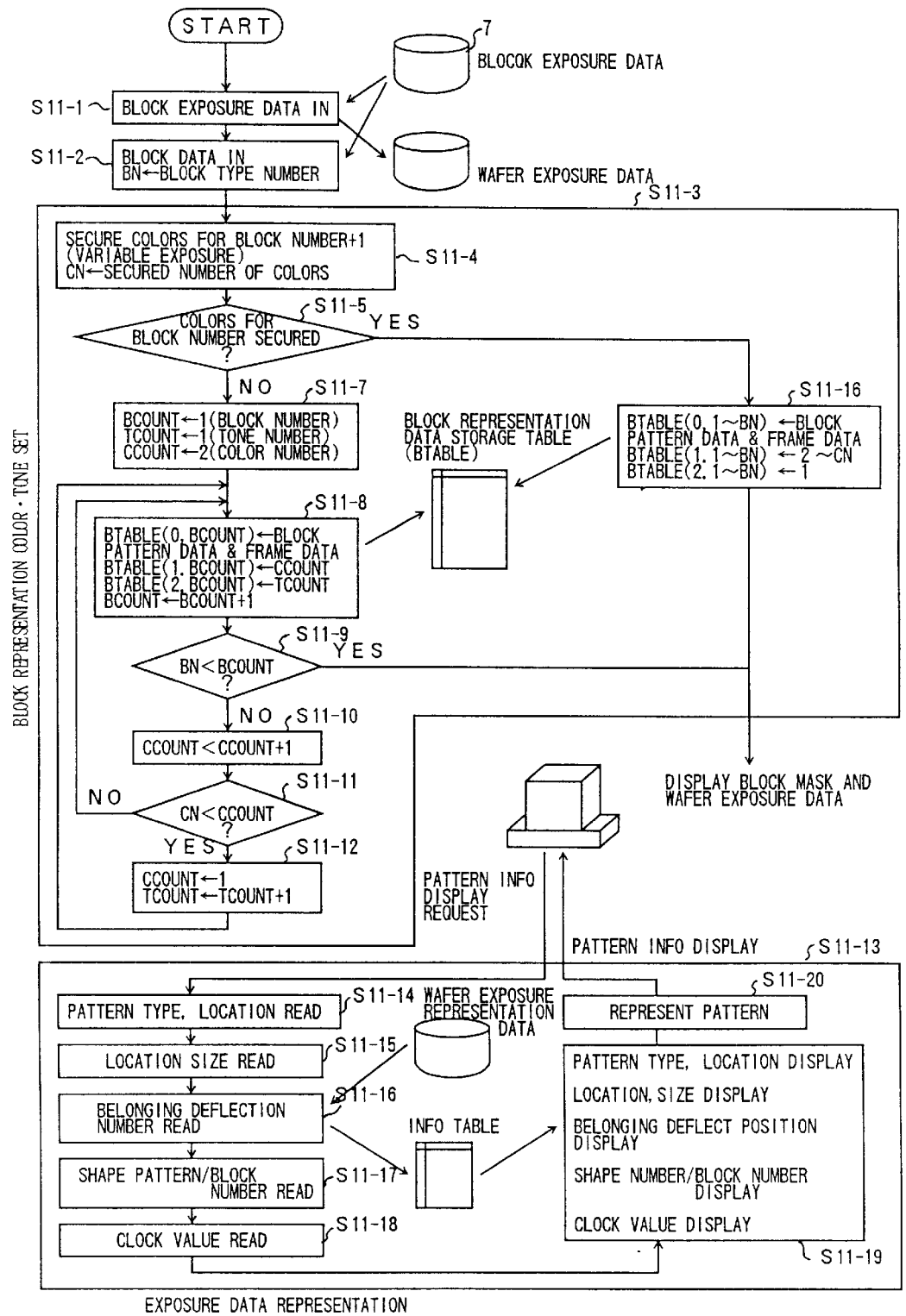
FIG. 40 is a flowchart showing an exposure data representation according to an eighth embodiment of the present invention.

Next, representation of the exposure data will be described according to an eighth embodiment of the present invention with reference to FIG. 40 showing the flowchart of representation of the exposure data. In the representation of the exposure data, the exposure data filed in the exposure data file 7 is read out and represented graphically on the display device 3 of the system of FIG. 4.

Referring to FIG. 40, the process starts with the step S11-1 in which block exposure data is acquired from the exposure data file 7 and the exposure data thus acquired is stored in a wafer exposure data representation file. Next, in the step S11-2, the type of the block data is detected from the block exposure data acquired in the step S11-1, and the number is represented as BN.

Next, in the step S11-3, a setting of color or tone for representing the block is conducted. In the step S11-3, colors are secured with a number corresponding to the number of the blocks plus one for the variable-beam exposure block, and the number of the colors thus secured is set in the step S11-4 as a parameter CN.

Next, in the step S11-5, a discrimination is made about whether or not the colors are secured with the number equal to the foregoing parameter CN.

If the result of the step S11-5 is YES, the blocks are distinguished from each other based solely on the colors, and thus, the block pattern data and block frame data are stored in the step S11-6 in a data storage table BTABLE(0,1-BN) of a block representation table BTABLE for each of the blocks. Further, color numbers 2–CN are stored in a color number storage table BTABLE(1,2-BN) and a tone number "1" designating a predetermined tone is stored in a tone number storage table BTABLE(2,1-BN).

When the necessary number of the colors CN is not secured in the step S11-5, this means that the designation of the blocks has to be made not only by the color but also by using some other means. Thus, in the step S11-7, not only by the colors but also the tones are set in the block representation table. More specifically, a block counter BCOUNT and a tone counter TCOUNT are set to "1" and a value "2" is set to a color counter CCOUNT in the step S11-7.

Next, in the step S11-8, the block pattern data and the block frame data of the block number BCOUNT are stored in the data storage table BTABLE(0,BCOUNT) of the block representation table, and a color number CCOUNT corresponding to the block number BCOUNT is stored in the color number storage table BTABLE(1,BCOUNT). Further, a cone number TCOUNT is stored in the tone number storage table BTABLE(2,BCOUNT) and the block number BCOUNT is increased by one.

It should be noted that the foregoing step S11-8 is continued in the steps S11-9–S11-12 while changing the color number and the tone number, until the block number reaches the value BN. As a result of the foregoing operation, mutually different combinations of the color and tone are stored in the block representation table BTABLE.

In the step S11-13, the exposure pattern data is represented according to the block representation table. In the step S11-13, various information necessary for exposure, such as the pattern type, location type, pattern location, pattern size, deflection number, pattern number/block number, clock number, and the like, are read in the steps S11-14–S11-18.

Next, in the steps S11-19 and S11-20, the information read in the steps S11-14–S11-18 are represented with the color and tone set in the block pattern stored in the block representation table BTABLE.

Figure 41:
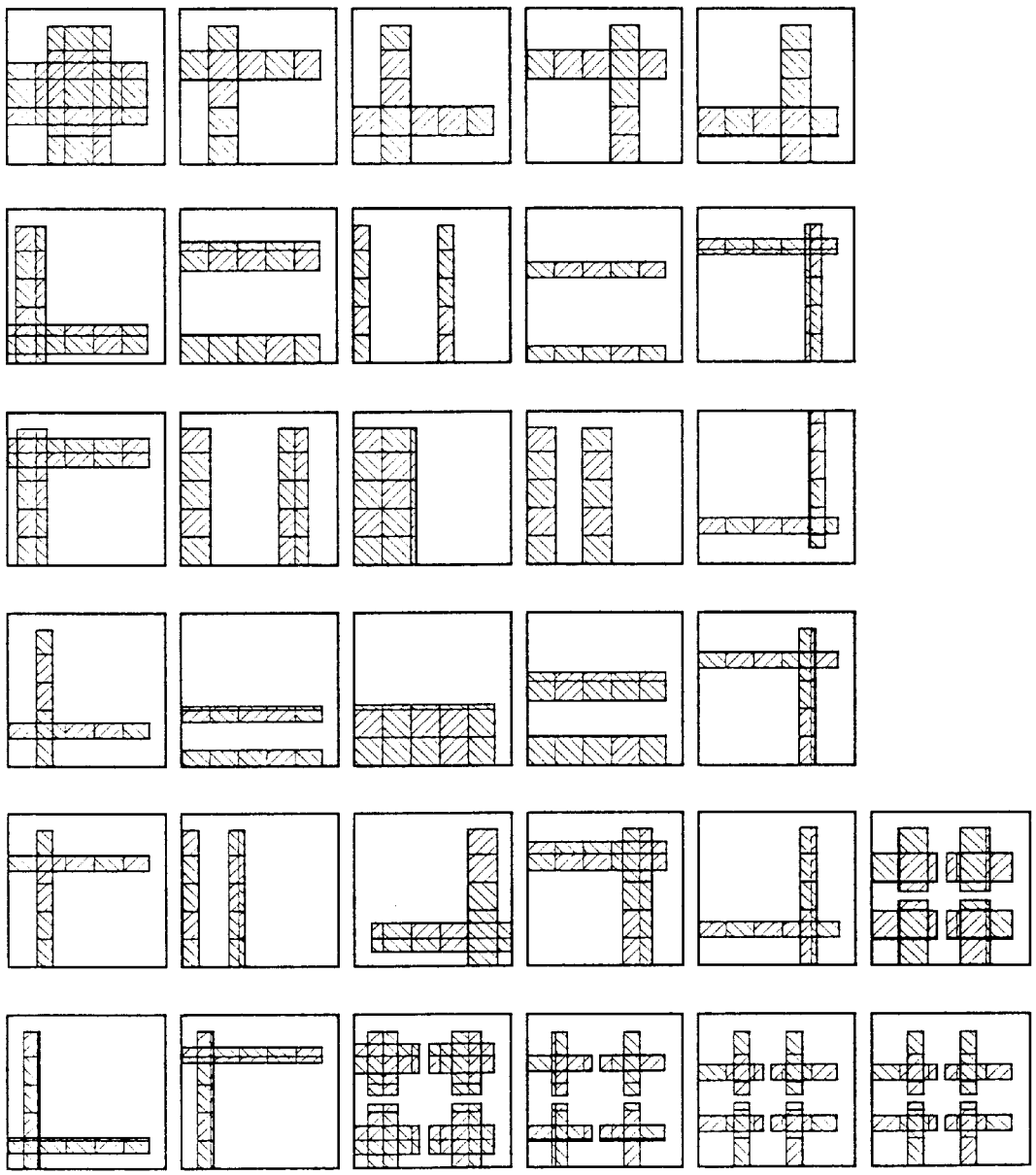
FIG. 41 is a diagram showing an example of representation of the block patterns achieved in the eighth embodiment.
Figure 42:
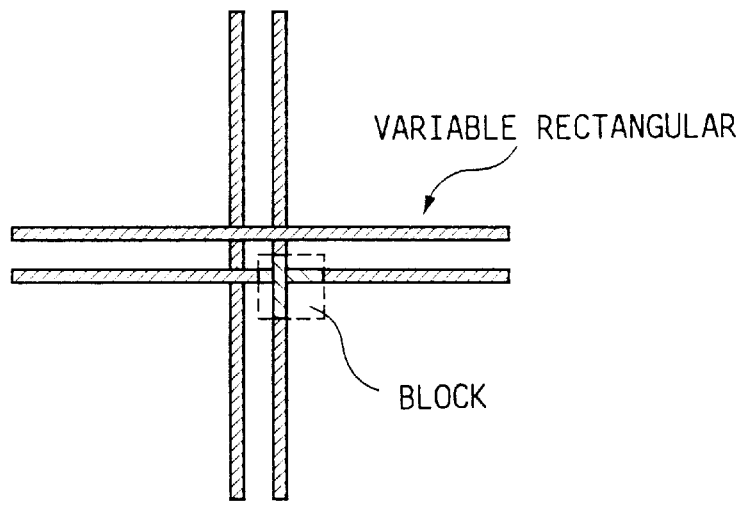
FIG. 42 is a diagram showing a further example of representation of the block pattern in the eighth embodiment.
Figure 43:
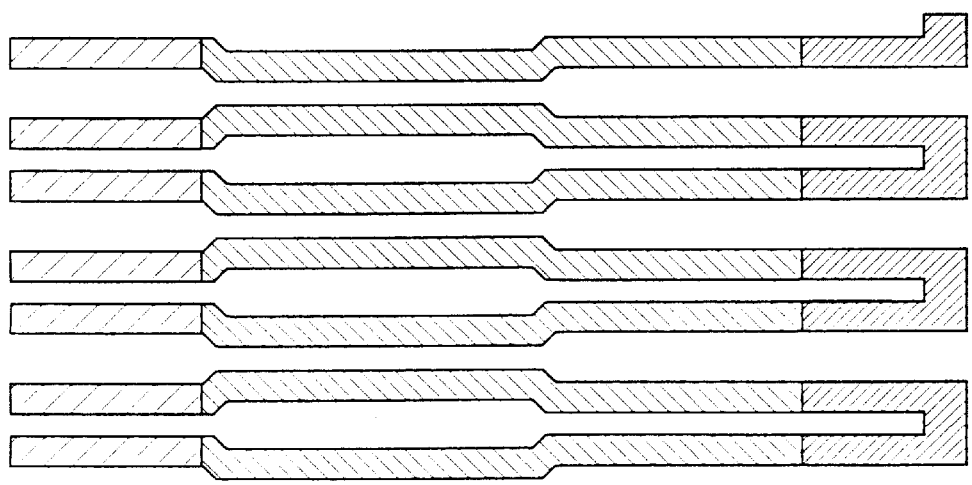
FIG. 43 is a diagram showing a further example of representation of the block pattern in the eighth embodiment.
Figure 44:
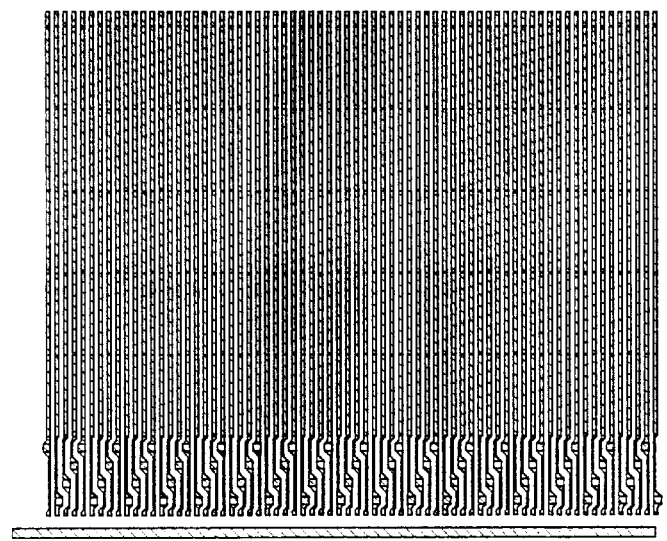
FIG. 44 is a diagram showing a further example of representation of the block pattern in the eighth embodiment.

FIG. 41 shows an example of the representation of the block pattern of the present embodiment.

Referring to FIG. 41, the block patterns are represented with respective colors and tones such that the distinction thereof is possible. Thereby, the blocks included in the patterns are recognized easily.

FIGS. 42–45 show other examples of the block pattern of the present embodiment.

Figure 45:
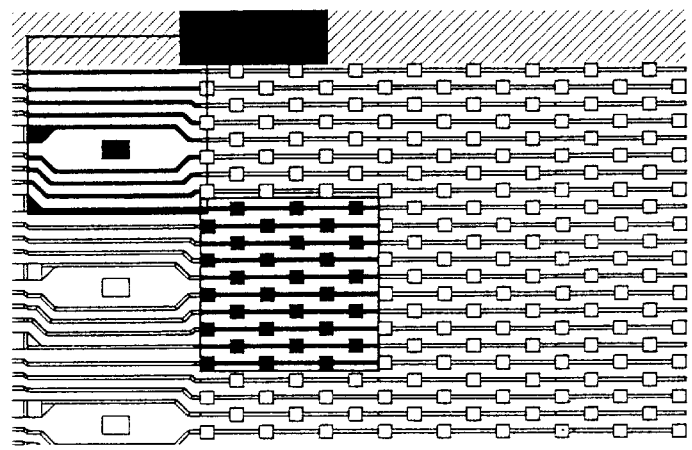
FIG. 45 is a diagram showing a further example of representation of the block pattern in the eighth embodiment.

As the representation color is changed in the present embodiment between the block exposure patterns and variable-beam exposure patterns, it is possible to distinguish the block exposure patterns and the variable-beam exposure patterns easily. As the representation color is changed in each block, it is possible to recognize a desired block selectively, by representing a single block frame in correspondence to a single block shot region as indicated in FIG. 45. Further, it is possible to represent a plurality of blocks in combination.

[NINTH EMBODIMENT]

In the exposure data creation unit 1 of the present invention, it is possible to conduct a simulation exposure based on the exposure data and represent the result of the exposure graphically.

Figure 46:
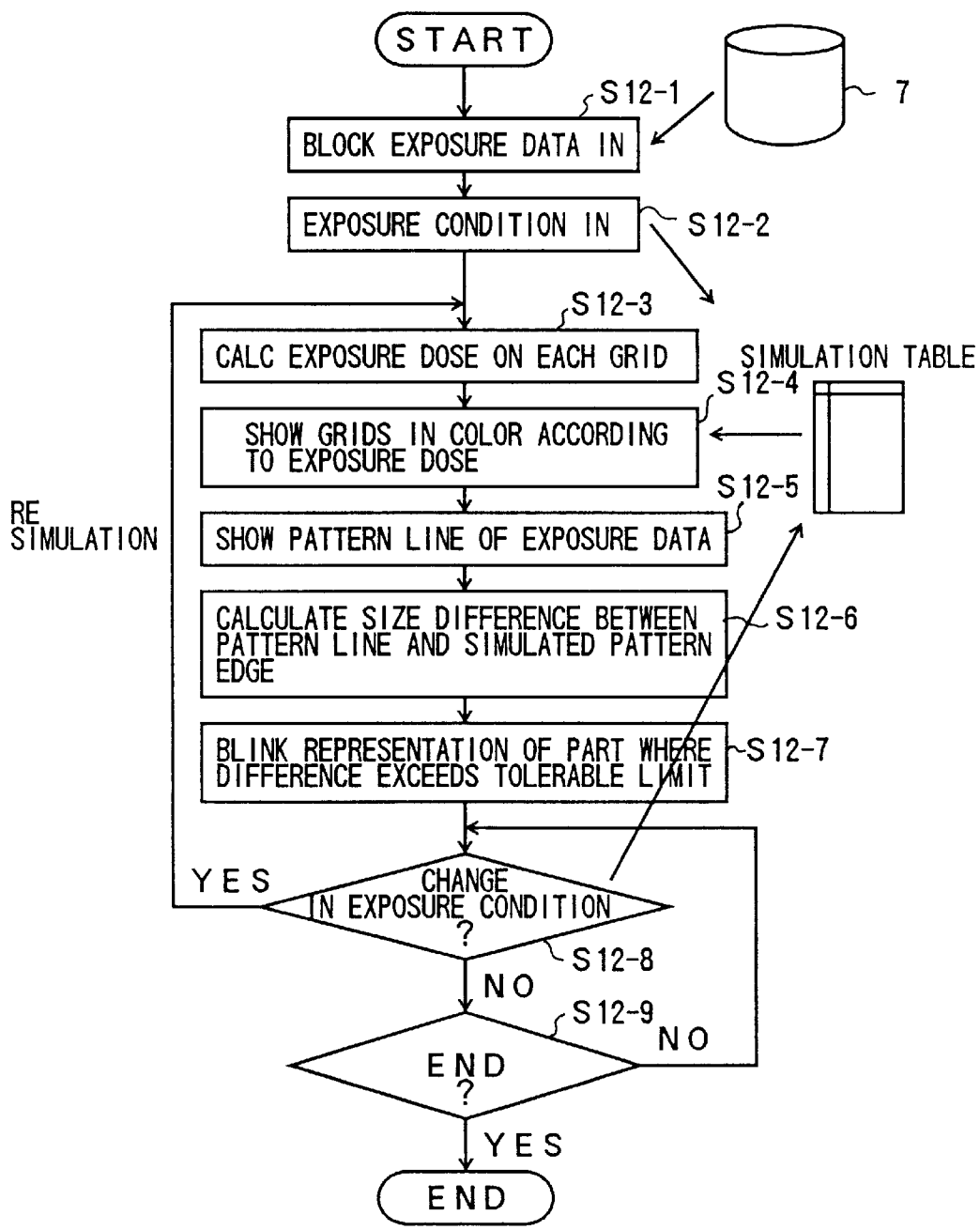
FIG. 46 is a flowchart showing a simulation process according to a ninth embodiment of the present invention.

FIG. 46 shows the flowchart of the simulation conducted by the exposure data creation unit 1.

Referring to FIG. 46, the simulation starts with a step S12-1 in which the block exposure data in the exposure data file 7 is acquired, and the simulation condition is set in the step S12-2 in correspondence to the exposure process conducted by an electron-beam exposure apparatus such as the unit 100 of FIG. 4. The block exposure data is then stored in a simulation table.

Once the exposure condition is set in the step S12-2, a simulation is started in the step S12-3 on the block exposure data acquired in the step S12-1 according to the exposure condition set in the simulation table.

Figure 47A:
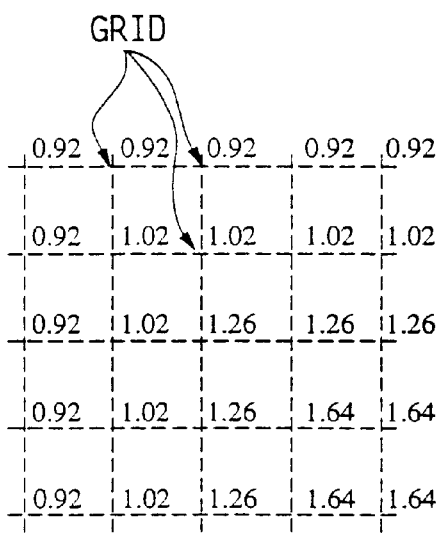
FIG. 47A–47C are diagrams showing an example of representation of the exposure pattern obtained by the simulation of the ninth embodiment.
Figure 47B:
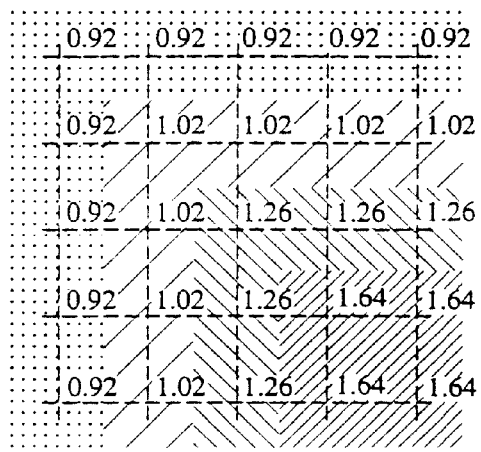

Such a simulation of the step S12-3 includes a calculation of the exposure dose on each grid point, and the result of the calculation is represented as indicated in FIG. 47A. Further, a color representation of the calculation result is represented in the step S12-4 as indicated in FIG. 47B, in which the regions of the same exposure dose are represented by the same color.

Figure 47C:
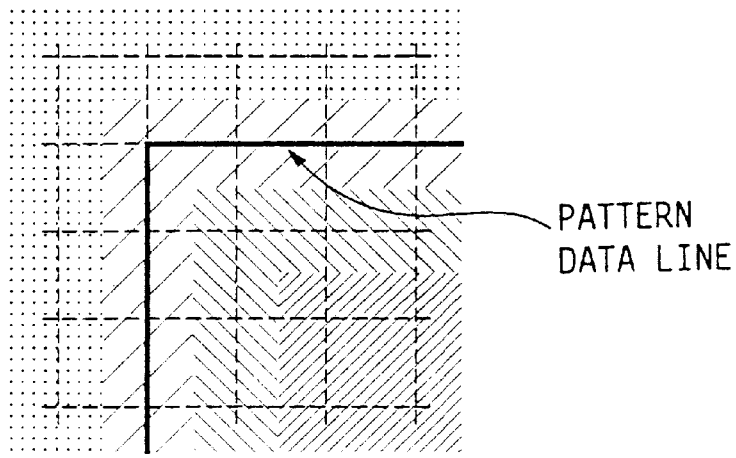

Next, in the step S12-5, the pattern line L of the exposure data is represented in an overlapping relationship with the exposure dose as indicated in FIG. 47C.

Next, in the step S12-6, a size difference is obtained between the pattern represented by the line L in the step S12-5 and the pattern represented by the exposure dose in the step S12-6, by comparing the line L and a resolution edge of the exposure dose defining the pattern.

Next, in the step S12-7, the foregoing size difference is evaluated and those patterns in which the size difference exceeds a predetermined tolerance are represented by a blinking representation indicating a failed representation.

In the step S12-7, it is also possible to choose the representation form of FIG. 35. By using the representation form of FIG. 35, in the step 12-8, it is possible to modify the setting in the Change Clock Code and in the Change Dose Value. By carrying out the simulation again based on the modified setting, the steps S12-3–S12-7 are conducted again, and an exposure pattern corresponding to the modified setting is represented. The representation of the exposure pattern is continued until a log-off is instructed in the step S12-9.

In the present invention, the failed part is represented by a blinking representation and the part where error has occurred is recognized easily. As noted already, such an error is corrected by modifying the setting of Change Clock Code and Change Dose Value in the step S12-8, based on the representation form of FIG. 35.

Figure 48:
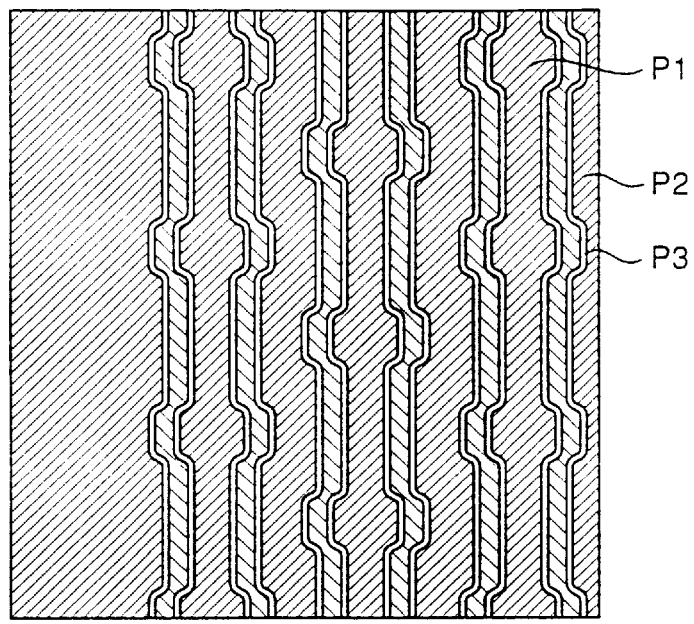
FIG. 48 is a diagram showing an example of representation of the exposure pattern obtained by the simulation of the ninth embodiment.
Figure 49:
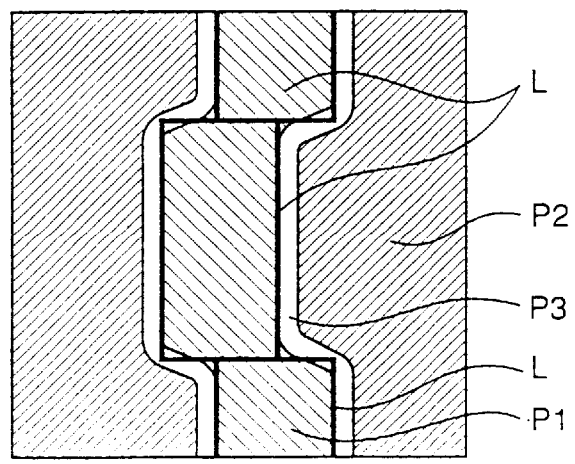
FIG. 49 is a diagram showing a further example of representation of the exposure pattern obtained by the simulation of the ninth embodiment.

FIGS. 48 and 49 show the actual examples of the exposed pattern obtained by the simulation.

Referring to FIG. 48, it can be seen a clear change of exposure dose in the region p3 connecting the region p1 to the region p2 as a result: of the graphical representation.

In the representation of FIG. 49, it can be seen that the exposure pattern and the block boundary L are represented together. Thereby, it is possible to recognize the result of the simulation in relation to the block set in the exposure data.

According to the present invention, it is possible to create a highly compressed exposure data at a high-speed, by using the art of hierarchical processing, parallel processing and automatic block extraction. By combining a plurality of block extraction modes, the number of shots in the exposure is reduced sharply, and the throughput of exposure is improved substantially. By using various correction and compensation processes, the present invention enables a creation of high-precision exposure pattern. In the situation in which an existing block mask is available, the present invention uses such an existing block mask. Thereby, the cost and the time of creation of the exposure data is reduced. As the created exposure data is fed back for optimization, the present invention enables a creation of highquality and highly reliable exposure data suitable for production of ultra-fine LSIs.

[TENTH EMBODIMENT]

In order to realize the parallel and distributed processing of FIG. 5, it is necessary to construct the computer in the parallel and distributed construction.

Figure 50:
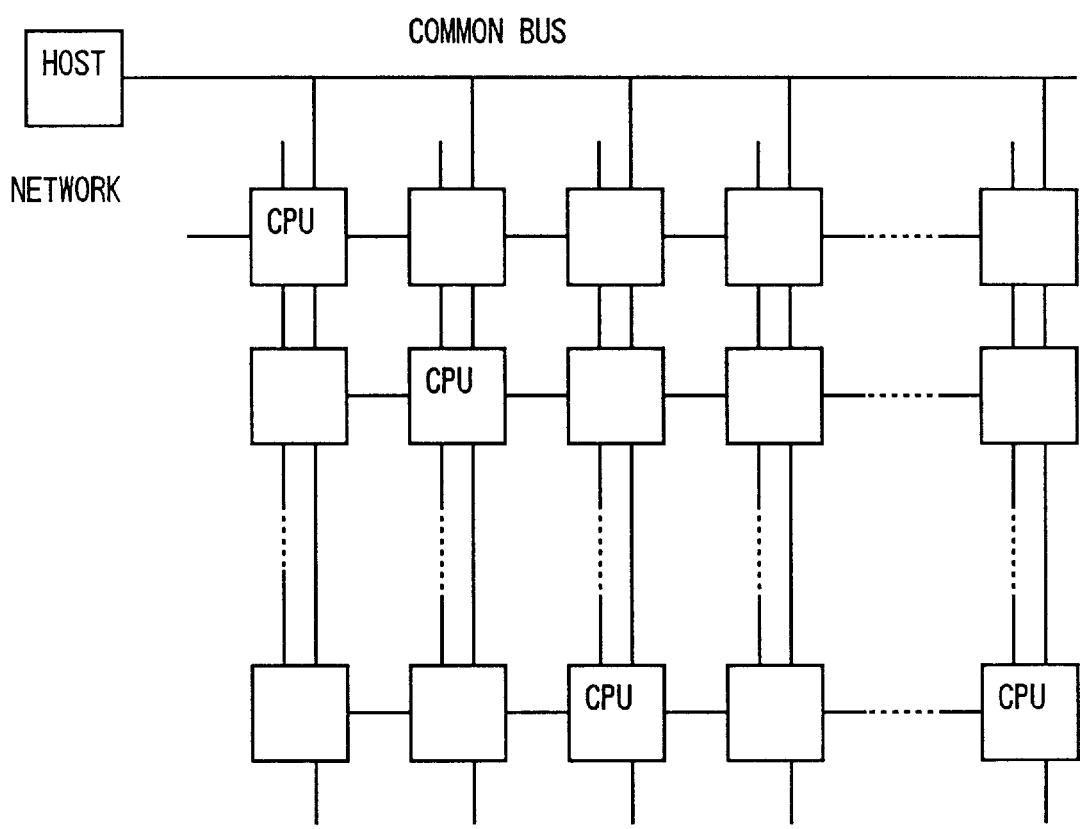
FIG. 50 is a block diagram showing the construction of a computer system used for parallel processing according to a tenth embodiment of the present invention.

FIG. 50 shows an example of such a parallel processing computer system in the form of block diagram.

Referring to FIG. 50, a plurality of processors are connected to a host computer and the host computer delivers the processing to the plurality of processors according to the process unit and according to the hierarchy. Thereby, the processors carry out the processing in parallel.

Figure 51:
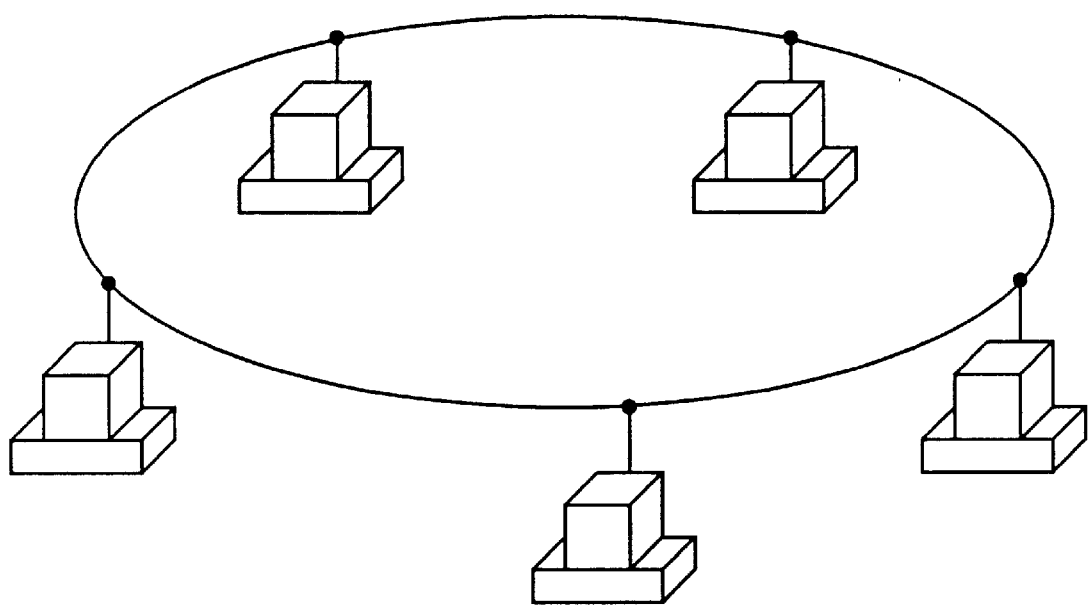
FIG. 51 is a diagram showing the network construction of the parallel processing computer system of the tenth embodiment.

FIG. 51 shows a system construction of the distributed processing used in the present embodiment.

Referring to FIG. 51, it can be seen that a plurality of parallel processing computers or ordinary sequential computers are connected with each other via a network. Thereby, the system of FIG. 51 carries out a distributed processing for each hierarchical level and each processing unit via the network.

Further, the present invention is not limited to the embodiments described heretofore, but various variations and modifications may be made without departing from the scope of the invention.

What is claimed is:

1. A method of fabricating a semiconductor device using an electron-beam exposure process, said electron-beam exposure process comprising the steps of:

creating exposure data including the steps of:

creating a library of exposure data for a plurality of exposure data elements constituting said exposure data, by specifying variables defining said exposure process, said library representing an hierarchical structure of said exposure data elements;

creating exposure patterns employing a graphic user interface, according to said hierarchical structure of said exposure data elements;

creating said exposure data based on said exposure patterns; and forming an electron beam by a beam source;

shaping said electron beam according to said exposure data by a block mask; and focusing said shaped electron beam on an object according to said exposure data.

2. A method of fabricating a semiconductor device, comprising the steps of:

creating exposure data from design data, said step of creating said exposure data comprising the steps of:

conducting an hierarchical structural analysis of said design data, said hierarchical structural analysis including the step of extracting blocks from said design data, each of said blocks representing a pattern group;

extracting a plurality of exposure patterns from said extracted blocks;

creating said exposure data for each of said extracted exposure patterns;

forming an electron beam by a beam source;

shaping said electron beam according to said exposure data by a block mask; and focusing said shaped electron beam on an object according to said exposure data.

3. A method as claimed in claim 2, wherein said step of extracting blocks begins with a pattern group in which a number of repetitions of the same pattern is a maximum.

4. A method as claimed in claim 2, wherein said step of extracting blocks begins with a pattern group in which a number of the patterns therein is a maximum.

5. A method as claimed in claim 2, wherein said step of extracting blocks is conducted for a pattern group having a size corresponding to an integer multiple of a deflection range of an electron beam at a time of exposure.

6. A method as claimed in claim 2, wherein said step of extracting blocks is conducted for a pattern group having a size corresponding to a beam size of an electron beam used at a time of exposure.

7. A method as claimed in claim 2, wherein said step of extracting blocks further comprises a step of extracting a block representing a pattern group that is identical with other pattern groups.

8. A method as claimed in claim 2, wherein said step of extracting blocks further comprises a step of deleting a block representing a pattern group that is identical with other pattern groups.

9. A method as claimed in claim 2, wherein said step of extracting blocks extracts a block representing a pattern group in which the number of different types of patterns included in the pattern group is a minimum.

10. A method as claimed in claim 2, wherein said step of extracting a plurality of exposure patterns further comprises the steps of dividing a pattern group into a plurality of regions, and said plurality of exposure patterns being extracted for each of said plurality or regions.

11. A method as claimed in claim 10, wherein said step of dividing a pattern group into a plurality of regions is conducted such that each of said regions avoids a blank region where there is no pattern.

12. A method as claimed in claim 2, wherein said step of extracting a plurality of exposure patterns further comprises the step of extracting an exposure pattern identical to a previously extracted exposure pattern.

13. A method as claimed in claim 2, wherein said step of extracting a plurality of exposure patterns further comprises a step of extracting an exposure pattern that satisfies a predetermined condition.

14. A method as claimed in claim 2, wherein said step of extracting a plurality of exposure patterns further comprises the steps of:

selecting a pattern extraction procedure from a plurality of pattern extraction procedures; and extracting said exposure pattern according to said selected pattern extraction procedure.

15. A method as claimed in claim 14, wherein said pattern extraction procedure is selected in response to a layer level of exposure.

16. A method as claimed in claim 14, wherein said pattern extraction procedure is selected in response to a shape of patterns in said pattern group.

17. A method as claimed in claim 14, wherein said pattern extraction procedure is selected in response to a location of patterns in said pattern group.

18. A method as claimed in claim 14, wherein said pattern extraction procedure is selected in response to a density of patterns in said pattern group.

19. A method as claimed in claim 2, wherein said step of extracting a plurality of exposure patterns is conducted such that said extracted exposure patterns generally have a predetermined pattern occupancy.

20. A method as claimed in claim 2, wherein said step of extracting a plurality of exposure patterns extracts said exposure patterns in correspondence to a number of regions set in said extracted blocks.

21. A method as claimed in claim 2, wherein said step of extracting a plurality of exposure patterns extracts said exposure patterns according to a type of said exposure patterns.

22. A method as claimed in claim 2, wherein said step of extracting a plurality of exposure patterns extracts said exposure patterns according to a beam irradiation area at a time of exposure.

23. A method as claimed in claim 2, wherein said steps of extracting blocks from said design data, extracting a plurality of exposure patterns and creating said exposure data are conducted for each of said blocks according to a parallel processing.

24. A method as claimed in claim 2, wherein said step of creating said exposure data includes the step of forming an aperture pattern in each of said exposure patterns in the form of an assembly of minute aperture elements such that each of said minute aperture elements is defined by a boundary part that is connected with each other minute aperture element and further to a body of said block mask.

25. A method as claimed in claim 2 wherein said step of creating said exposure data comprises the further steps of:

evaluating an effect of distortion of said exposure pattern, caused by an electron beam exposing an adjacent exposure pattern; and modifying said exposure data so as to compensate for said distortion.

26. A method as claim in claim 25, wherein said step of evaluating an effect of distortion is conducted twice with an overlapping of exposure, such that said shaped electron beam is displaced between a first exposure and a second exposure.

27. A method as claimed in claim 2, further comprising the step of:

modifying a representation of said exposure pattern on a display device according to an exposure process used.

28. A method as claimed in claim 2, further comprising the step of:

modifying a representation of said exposure pattern on a display device according to each exposure unit.

29. A method as claimed in claim 2, further comprising the steps of:

calculating an exposure throughput from said exposure data; and displaying said throughput on a display device.

30. A method as claimed in claim 2, further comprising the steps of:

simulating an exposure pattern corresponding to said exposure data under a given exposure condition; and displaying said exposure pattern simulated from said exposure data on a display device.

31. A method as claimed in claim 30, further including the step of displaying said exposure condition in said display device in such a manner that a change of said exposure condition is possible, said method further comprising the steps of: carrying out a simulation according to said changed exposure condition; and displaying an exposure pattern obtained as a result of said simulation conducted for said changed exposure condition.

32. A method as claimed in claim 31, further comprising the step of representing an exposure pattern corresponding to said exposure data in overlapping with said exposure pattern obtained by simulating said exposure data according to said exposure condition.

33. A method as claimed in claim 32, further comprising the steps of:

detecting a difference between said exposure data obtained by simulating said exposure data according to said exposure condition and said exposure pattern corresponding to said exposure data; and changing said representation in a part where said difference exceeds a tolerable limit.

34. A method as claimed in claim 1, wherein said exposure data elements include exposure patterns formed on said object for each combination of deflection conditions of a first deflector and deflection conditions of a second deflector, said first and second deflectors being used for scanning said shaped electron beam over said object.

35. A method as claimed in claim 1, wherein said exposure data elements include beam shaping patterns formed on said block mask.

36. An electron-beam block exposure process for fabricating a semiconductor device, comprising the steps of:

creating a library of block exposure data for a plurality of exposure data elements by specifying variables defining said exposure process, said library representing an hierarchical structure of said exposure data elements, said step of creating a library of block exposure data further comprising;

creating, through a graphic user interface, exposure patterns according to said hierarchical structure of said exposure data elements; and creating said block exposure data based on said exposure patterns;

forming an electron beam by a beam source;

shaping said electron beam according to said block exposure data by a block mask; and focusing said shaped electron beam on an object according to said block exposure data.

37. A block exposure process of fabricating a semiconductor device, comprising:

conducting an hierarchical structural analysis of design data, said hierarchical structural analysis comprising the further steps of:

extracting blocks from said design data, each block representing a pattern group, extracting a plurality of exposure patterns from said extracted blocks;

creating block exposure data for each of said extracted exposure patterns;

forming an electron beam by a beam source;

shaping said electron beam according to said block exposure data by a block mask; and focusing said shaped electron beam on an object according to said exposure data.

* * * * *